US010780679B2

(12) United States Patent
Iwai et al.

(10) Patent No.: US 10,780,679 B2
(45) Date of Patent: Sep. 22, 2020

(54) LAMINATE, METHOD FOR MANUFACTURING LAMINATE, SEMICONDUCTOR DEVICE, AND METHOD FOR MANUFACTURING THE SEMICONDUCTOR DEVICE

(71) Applicant: FUJIFILM Corporation, Tokyo (JP)

(72) Inventors: Yu Iwai, Haibara-gun (JP); Takeshi Kawabata, Haibara-gun (JP); Akinori Shibuya, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/940,321

(22) Filed: Mar. 29, 2018

(65) Prior Publication Data

US 2018/0222164 A1   Aug. 9, 2018

Related U.S. Application Data

(63) Continuation of application No. PCT/JP2017/006845, filed on Feb. 23, 2017.

(30) Foreign Application Priority Data

Feb. 26, 2016  (JP) ................. 2016-035250
Mar. 24, 2016  (JP) ................. 2016-060852

(51) Int. Cl.
   *B32B 27/28*  (2006.01)
   *H01L 23/14*  (2006.01)
   (Continued)

(52) U.S. Cl.
   CPC ............. *B32B 27/281* (2013.01); *B32B 3/30* (2013.01); *B32B 15/08* (2013.01); *B32B 15/20* (2013.01);
   (Continued)

(58) Field of Classification Search
   CPC .......... B32B 3/30; B32B 27/16; B32B 15/08; B32B 15/20; B32B 27/281;
   (Continued)

(56) References Cited

U.S. PATENT DOCUMENTS 5,618,636 A    4/1997  Watanabe et al.
5,708,128 A *  1/1998  Oikawa ................ C08G 73/101
                                              428/411.1

(Continued)

FOREIGN PATENT DOCUMENTS

CN    1724251 A    1/2006
CN    1949952 A    4/2007
   (Continued)

OTHER PUBLICATIONS

Taiwanese Office Action for TW 106105668 dated Dec. 15, 2017.
(Continued)

*Primary Examiner* — John D Freeman
(74) *Attorney, Agent, or Firm* — Sughrue Mion, PLLC

(57) ABSTRACT

Provided is a laminate that excels in adhesion among a plurality of resin layers formed as insulating layers containing polyimide and so forth, a method for manufacturing the laminate, a semiconductor device, and, a method for manufacturing the semiconductor device. The laminate comprises a substrate, and at least two resin layers, each of the resin layers is independently brought into contact, in at least a part of the surface thereof, with other resin layer, and the layers independently has a Young's modulus exceeding 2.8 GPa and not exceeding 5.0 GPa, and, an elongation after fracture exceeding 50% and not exceeding 200%, and further has a three-dimensional radical crosslinked structure, and at least one of the resin layers contains at least either polyimide or polybenzoxazole.

9 Claims, 1 Drawing Sheet

(51) Int. Cl.

| | |
|---|---|
| *G03F 7/027* | (2006.01) |
| *G03F 7/40* | (2006.01) |
| *B32B 15/08* | (2006.01) |
| *B32B 15/20* | (2006.01) |
| *B32B 27/16* | (2006.01) |
| *H01L 23/12* | (2006.01) |
| *B32B 3/30* | (2006.01) |
| *G03F 7/038* | (2006.01) |
| *G03F 7/32* | (2006.01) |
| *H01L 23/498* | (2006.01) |
| *H01L 25/065* | (2006.01) |
| *H01L 25/00* | (2006.01) |

(52) U.S. Cl.
CPC .............. *B32B 27/16* (2013.01); *G03F 7/027* (2013.01); *G03F 7/0387* (2013.01); *G03F 7/40* (2013.01); *H01L 23/12* (2013.01); *H01L 23/14* (2013.01); *B32B 2250/44* (2013.01); *B32B 2307/206* (2013.01); *B32B 2307/54* (2013.01); *B32B 2379/08* (2013.01); *B32B 2457/08* (2013.01); *B32B 2457/14* (2013.01); *G03F 7/32* (2013.01); *H01L 23/49822* (2013.01); *H01L 25/0657* (2013.01); *H01L 25/50* (2013.01); *H01L 2225/0652* (2013.01); *H01L 2225/06513* (2013.01); *H01L 2225/06517* (2013.01); *H01L 2225/06541* (2013.01)

(58) Field of Classification Search
CPC .......... B32B 2307/54; B32B 2307/206; B32B 2457/08; B32B 2250/44; B32B 2379/08; B32B 2457/14; B32B 27/08; B32B 7/05; B32B 3/263; B32B 7/02; G03F 7/027; G03F 7/40; G03F 7/0387; G03F 7/32; G03F 7/20; H01L 23/12; H01L 23/14; H01L 23/49822; H01L 25/0657; H01L 25/50; H01L 2225/06513; H01L 2225/06517; H01L 2225/0652; H01L 2225/06541; H01L 2224/16227
See application file for complete search history.

(56) References Cited

U.S. PATENT DOCUMENTS

| | | | |
|---|---|---|---|
| 8,039,756 B2 | 10/2011 | Kikuchi et al. | |
| 2007/0248910 A1 | 10/2007 | Kimura et al. | |
| 2010/0239977 A1 | 9/2010 | Banba | |
| 2010/0295191 A1* | 11/2010 | Kikuchi | H01L 21/486 257/784 |
| 2014/0343223 A1* | 11/2014 | Reinerth | C08K 5/0025 524/600 |
| 2015/0337116 A1* | 11/2015 | Ono | C08K 5/5455 430/325 |
| 2016/0013148 A1 | 1/2016 | Lin et al. | |
| 2017/0101521 A1 | 4/2017 | Koyama | |
| 2018/0079864 A1* | 3/2018 | Kawabata | G03F 7/021 |

FOREIGN PATENT DOCUMENTS

| | | |
|---|---|---|
| CN | 102162996 A | 8/2011 |
| CN | 104285184 A | 1/2015 |
| EP | 0 662 637 A1 | 7/1995 |
| JP | 07-263864 A | 10/1995 |
| JP | 2004-077552 A | 3/2004 |
| JP | 2004-077553 A | 3/2004 |
| JP | 2007-058017 A | 3/2007 |
| JP | 2009-120796 A | 6/2009 |
| JP | 2014-201695 A | 10/2014 |
| KR | 10-2015-0097458 A | 8/2015 |
| WO | 2006/008991 A1 | 1/2006 |
| WO | 2009/022732 A1 | 2/2009 |
| WO | 2014/024951 A1 | 2/2014 |
| WO | 2015/199219 A1 | 12/2015 |

OTHER PUBLICATIONS

Japanese Office Action for JP 2017-550955 dated Oct. 11, 2017.
Decision to Grant for JP 2017-550955 dated Oct. 30, 2017.
International Search Report for PCT/JP2017/006845 dated May 23, 2017.
Extended European Search Report dated Jul. 10, 2018 from the European Patent Office in counterpart European Application No. 17756590.0.
International Preliminary Report on Patentability dated Aug. 28, 2018 with English Translation of the Written Opinion of PCT/JP2017/006845.
Written Opinion of PCT/JP2017/006845 dated May 23, 2017.
Office Action dated Nov. 26, 2018 issued by the Korean Intellectual Property Office in counterpart Korean application No. 10-2018-7006606.
Communication dated Jan. 29, 2019 issued by the Chinese Patent Office in counterpart Chinese Application No. 201780003330.8.

* cited by examiner

LAMINATE, METHOD FOR
MANUFACTURING LAMINATE,
SEMICONDUCTOR DEVICE, AND METHOD
FOR MANUFACTURING THE
SEMICONDUCTOR DEVICE

CROSS-REFERENCE TO RELATED
APPLICATIONS

This application is a Continuation of PCT International Application. No. PCT/JP2017/006845 filed on Feb. 23, 2017, which claims priority under 35 U.S.C § 119(a) to Japanese Patent Application Nos. 2016-035250 filed on Feb. 26, 2016 and 2016-060852 filed on Mar. 24, 2016. Each of the above application(s) is hereby expressly incorporated by reference, in its entirety, into the present application

TECHNICAL FIELD

This invention relates to a laminate, a method for manufucturing a laminate, semiconductor device, and a method for manufacturing a semiconductor device, and in particular relates to a laminate for insulating interlayers for redistribution in semiconductor devices.

BACKGROUND ART

Polyimide and polybenzoxazole, featured by their excellent heat resistance and insulating performance, have been used for insulating layers in semiconductor devices.

Another practice is to use a pre-cyclized precursor (polyimide pecursor or polybenzoxazole precursor) that is more soluble into solvent, to apply it onto a substrate or the like, and cyclize the precursor under heating to thereby form a cured film.

Patent Literature 1 discloses a positive photosensitive resin composition that contains a specific polyamide resin (A) and a photosensitive compound (B). The polyamide resin (A) has a weight-average molecular weight Mw of 5,000 to 80,000. The positive photosensitive resin composition, when cured at 250° C. and made into a cured film, has a tensile modulus of 2.0 to 4.0 GPa, and a tensile elongation of 10 to 100%.

Patent Literature 2 discloses a photosensitive resin composition with a specific structure, which includes a polyimide precursor, a compound that releases a radical upon irradiation by actinic light, a specific compound, and a solvent.

CITATION LIST

Patent Literature

[Patent Literature 1] WO2009/022732
[Patent Literature 2] JP-A-2014-201695

SUMMARY OF THE INVENTION

Technical Problem

It was, however, found that adhesion between the films was insufficient, when the films were laminated according to a method described in Patent Literature 1, for the purpose of using the films as insulating interlayers (insulating layers) for redistribution in semiconductor devices. Adhesion between the films was again found to be insufficient, when the films made of the resin composition described in Patent Literature 2 were laminated.

This invention is aimed at solving the above-described problems, and is to provide a laminate that excels in adhesion among a plurality of resin layers formed as insulating layers containing polyimide and so forth, a method for manufacturing the laminate, a semiconductor device, and, a method for manufacturing the semiconductor device.

Solution To Problem

Under such situations, the present inventors found from our investigations that the above-described problems can be solved by making the laminate, so as to satisfy specific levels of Young's modulus and elongation after fracture, and, so as to have the resin layers with a three-dimensional radical crosslinked structure. More specifically, the above-described problems were solved by the means <1> below, and preferably by means <2> to <17> below.
<1> A laminate comprising a substrate, and at least two resin layers, each of the resin layers being independently brought into contact, in at least a part of the surface thereof, with other resin layer, and independently having a Young's modulus exceeding 2.8 GPa and not exceeding 5.0 GPa, and, an elongation after fracture exceeding 50% and not exceeding 200%, and further having a three-dimensional radical crosslinked structure, and at least one of the resin layers containing at least either polyimide or polybenzoxazole.
<2> The laminate of <1>, wherein each of the resin layers independently contains at least either polyimide or polybenzoxazole.
<3> The laminate of <1> or <2>, wherein each of the resin layers independently has a tensile strength exceeding 160 MPa and not exceeding 300 MPa.
<4> The laminate of any one of <1> to <3>, having 3 to 7 resin layers in total.
<5> The laminate of any one of <1> to <4>, having a metal layer between the resin layers.
<6> The laminate of <5>, wherein the metal layer contains copper.
<7> The laminate of any one of <1> to <6>, wherein the polyimide and polybenzoxazole contains a partial structure represented by —Ar-L-Ar—;
where each Ar independently represents an arylene group, L represents an aliphatic hydrocarbon group having 1 to 10 carbon atoms and optionally substituted by fluorine atom, —O—, —CO—, —S—, —SO$_2$— or —NHCO—, as well as a group composed of two or more of them.
<8> A method for manufacturing the laminate described in any one of <1> to <7>, the method comprising sequentially carrying out;
applying a photosensitive resin composition to a substrate to thereby form a layer;
exposing the photosensitive resin composition layer to light; and
developing the exposed photosensitive resin composition layer by negative development, and
again sequentially carrying out the photosensitive resin composition layer-forming, the exposing, and the developing,
the photosensitive resin composition containing a resin selected from polyimide precursor, polyimide, polybenzoxazole precursor and polybenzoxazole, and further satisfying at least either that the resin contains a polymerizable group, or that the photosensitive resin composition contains a polymerizable compound.

<9> The method for manufacturing the laminate of <8>, sequentially carrying out the photosensitive resin composition layer-forming, the exposing, and the developing, repeated 3 to 7 times.

<10> The method for manufacturing the laminate of <8> or <9>, further comprising, after the developing, providing a metal layer.

<11> The method for manufacturing the laminate of <10>, wherein the metal layer contains copper.

<12> The method for manufacturing the laminate of <10> or <11>, further carrying out, succeeding to provision of the metal layer, the photosensitive resin composition layer-forming, the exposing, and the developing sequentially, so as to cover the metal layer.

<13> The method for manufacturing the laminate of any one of <8> to <12>, wherein the resin is polyimide precursor or polybenzoxazole precursor.

<14> The method for manufacturing the laminate of <10> or <11>, wherein the resin contains a partial structure represented by —Ar-L-Ar—;

where each Ar independently represents an arylene group, L represents an aliphatic hydrocarbon group having 1 to 10 carbon atoms and is optionally substituted by fluorine atom (s), —O—, —CO—, —S—, —SO$_2$— or —NHCO—, as well as a group composed of two or more of them.

<15> The method for manufacturing the laminate of any one of <8> to <14>, wherein the photosensitive resin composition contains a photo-polymerization initiator.

<16> A semiconductor device comprising the laminate described in any one of <1> to <7>.

<17> A method for manufacturing a semiconductor device comprising the method for manufacturing a laminate described in any one of <8> to <15>.

Advantageous Effects of Invention

According to this invention, it now became possible to provide a laminate that excels in adhesion among a plurality of resin layers, and, a method for manufacturing the laminate, a semiconductor device, and, a method for manufacturing the semiconductor device.

DESCRIPTION OF EMBODIMENTS

Figure 1:
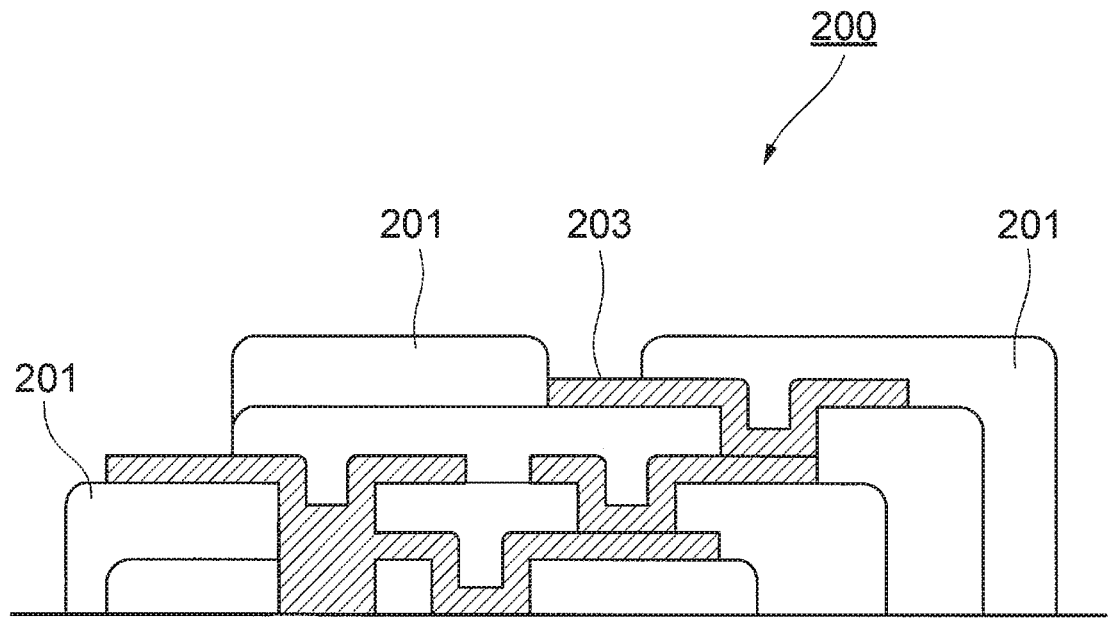
[FIG. 1] A schematic drawing illustrating an embodiment of the laminate of this invention.

Description on constituents in this invention will occasionally be made based on the representative embodiments of this invention, without intention to restrict this invention to these embodiment.

All notations of group (atomic group) in this specification, given without "substituted" and "non-substituted", are understood to include both of those having substituent and those having no substituent. For example, "alkyl group" means not only represents an alkyl group having no substituent (non-substituted alkyl group), but also an alkyl group having a substituent (substituted alkyl group).

"Light exposure" in the context of this specification not only includes exposure using light, but also includes drawing with a particle beam such as electron beam, ion beam and so forth, unless otherwise specifically noted. Furthermore, light for exposing means, for example, bright line spectrum of mercury lamp, deep ultraviolet radiation represented by excimer laser light, extreme ultraviolet radiation (EMT light), X-ray, and electron beam. "Light" in the context of this invention means actinic light or radioactive ray.

All numerical ranges given in this specification using "to" mean numerical ranges that contain the preceded and succeeded numerals as the lower limit and the upper limit, respectively.

"(Meth)acrylate" in the context of this specification means "acrylate" and/or "methacrylate" "(meth)allyl" means "allyl" and/or "methallyl", "(meth)acryl" means "acryl" and/or "methacryl", and "(meth)acryloyl" means "acryloyl" and/or "methacryloyl".

"Process" in the context of this specification not only means an independent process, but also encompasses any process capable of accomplishing a desired operation, even if it is not clearly discriminable from other processes.

Solid component concentration in the context of this specification means mass percentage of component of the composition, excluding solvent, relative to the total mass of the composition. The solid component concentration is defined at 25° C., unless otherwise specifically noted.

Weight-average molecular weight (Mw) and number-average molecular weight (Mn) in the context of this specification are defined by polystyrene-equivalent values measured by gel permeation chromatography (GPC measurement), unless otherwise specifically noted. In this specification, weight-average molecular weight (Mw) and number-average molecular weight (Mn) may be determined typically by using HLC-8220 (from Tosoh Corporation), equipped with Guard column HZ-L, TSKgel Super HZM-M, TSKgel Super HZ4000, TSKgel Super HZ3000, or TSKgel Super HZ2000 (from Tosoh Corporation) as a column. Eluent is THF (tetrahydrofuran) unless otherwise specifically noted. For detection, employed is a detector sensing UV light at 254 nm.

The laminate of this invention has a substrate and at least two resin layers. Each of the resin layers is brought into contact, in at least a part of the surface thereof, with other resin layer, and independently has a Young's modulus exceeding 2.8 GPa and not exceeding 5.0 GPa, and, an elongation after fracture exceeding 50% and not exceeding 200%, and a three-dimensional radical crosslinked structure. At least one of the resin layers contains at least either polyimide or polybenzoxazole.

With such configuration, adhesion among a plurality of layers may be improved.

Although the mechanism still remains unclear, the laminate of this invention, having an elevated Young's modulus of the resin layers, can form hard resin layers (resin films) which remains highly durable against repetitive impact load. Moreover, with a high level of elongation after fracture of the resin layers, the resin layers will be formed to have a reasonable level of elongation, making the film more likely to recover the original shape even after warped or shrunk, and less likely to cause cracks therein.

Each of the resin layers in the laminate of this invention has a three-dimensional radical crosslinked structure. Such resin layers may be obtained typically by negative development. The three-dimensional radical crosslinked structure can interact, through a polymerizable group in the structure thereof, with the adjoining resin layer. By virtue of such means, the interlayer separation is effectively suppressed.

Meanwhile, the prior art document (WO2009/022732) describes positive development which is featured by an increased solubility of the exposed area, making it impossible to achieve the interlayer adhesion achievable by the negative development. In fact, this prior art document has not shown any specific examples regarding the laminate.

Moreover, the redistribution layer is often formed by firstly providing a metal layer over the resin layer, and then providing thereon another resin layer as illustrated in FIG. 1. In the thus built laminate, the resin layer will tend to warp or shrink, posing a risk of separation among the resin layers. In contrast, the resin layer employed in this invention, which satisfies the above-described Young's modulus and elongation after fracture, will be well durable against stress induced by heat or so, and will be less deformable. Even if elongation should occur, the resin layer is less breakable by nature, so that high adhesion will be retained between the resin layer and the metal layer where stress tends to concentrate.

The layer structure in this invention will be explained below, referring to FIG. 1. This invention is, of source, not limited to the embodiment illustrated in FIG. 1.

FIG. 1 illustrates an example of the laminate (redistribution layer) of this invention, wherein reference numeral 200 stands for the laminate of this invention, 201 for photosensitive resin composition layers (resin layers), and 203 for a metal layer. In FIG. 1, the metal layer 203 is a hatched layer. The photosensitive resin composition layers 201 have specific patterns formed by negative development. In one preferred embodiment of this invention, the metal layer 203 is provided on the surfaces of the resin layers 201. The metal layer 203 is formed so as to cover a part of the surfaces of the patterns. Again on the surface of the metal layer 203, another resin layer 201 is provided. In this design, each resin layer is independently brought into contact in at least a part of the surface thereof with other resin layer 201. Moreover, the laminate partially has a structure in which the metal layer 203 is interposed between the resin layer 201 and the resin layer 201. The photosensitive resin composition layers (resin layers) that serve as an insulating film, and the metal layer that serves as an interconnect layer compose a redistribution layer, and are incorporated into a semiconductor device. In particular as described later, the laminate when manufactured by the method for manufacturing the laminate of this invention is processed by negative development, which is inmost cases superior to the positive development in terms of removability, since the exposed area is insolubilized, and the unexposed area is removed. For this reason, it becomes easier to form a deep hole structure or a deep trench structure by removing a plurality of resin layers after photo-exposure. That is, the laminate of this invention is effectively used particularly for the redistribution layer composed of a large number of layers laminated therein.

The laminate of this invention has at least two resin layers, preferably 3 to 7 resin layers in total, and more preferably 3 to 5 resin layers in total.

<Resin Layer>

The resin layer in the laminate of this invention satisfies specific levels of Young's modulus and elongation after fracture, and has a three-dimensional radical crosslinked structure. It is further preferable to satisfy a specific level of tensile strength.

Of the resin layers in this invention, at least one layer contains at least either polyimide or polybenzoxazole, and preferably each resin layer independently contains at least either polyimide or polybenzoxazole. In particular, all resin layers composing the laminate are preferably composed of the same resin. The same resin in this context means that all resin layers contain polyimide, or all resin layers contain polybenzoxazole.

Now, polyimide and polybenzoxazole preferably contain a partial structure represented by —Ar-L-Ar—, where each Ar independently represents an arylene group, L represents an aliphatic hydrocarbon group having 1 to 10 carbon atoms and is optionally substituted by fluorine atom(s), —O—, —CO—, —S—, —SO$_2$— or —NHCO—, as well as a group composed of two of them. Details of them are same as those of a partial structure represented by —Ar-L-Ar—, described later in relation to the photosensitive resin composition.

«Young's Modulus»

The resin layer in the laminate of this invention has a Young's modulus exceeding 2.8 GPa and not exceeding 5.0 GPa. The lower limit of Young's modulus is preferably 3.0 GPa or above, more preferably 3.3 GPa or above, even more preferably 3.6 GPa or above, and yet more preferably 3.9 GPa or above. Meanwhile, the upper limit value of Young's modulus, is preferably 4.8 GPa or below, more preferably 4.5 GPa or below, even more preferably 4.3 GPa or below, and yet more preferably 4.1 GPa or below. Young's modulus is measured according to a method described later in EXAMPLES.

With Young's modulus controlled above 2.8 GPa, the resin layer will form a hard film, will be highly durable against repetitive impact load, and will be durable against the negative development and formation of the metal layer. Meanwhile, with Yong's modulus controlled to 5.0 GPa or below, the resin layer, when placed under impact load, can reduce damage possibly exerted to the metal layer. In particular, with Young's modulus controlled to 3.5 GPa or above, interlayer separation among multi-layered resin layers and metal layers will be avoidable more effectively.

«Elongation After Fracture»

The resin layer in the laminate of this invention has an elongation after fracture exceeding 50% and not exceeding 200%. The lower limit value of the elongation after fracture is preferably 51% or above The upper limit value of the elongation after fracture is preferably 120% or below, more preferably 110% or below, even more preferably 90% or below, yet more preferably 75% or below, and furthermore preferably 72% or below. The elongation after fracture is measured according to a method described later in EXMPLES.

With the elongation after fracture controlled above 50%, the resin layers will be formed to have a reasonable level of elongation, making itself more likely to recover the original shape even after warped or shrunk. Meanwhile, with the value controlled to 200% or below, the resin layer will have deformation kept in constant.

«Tensile Strength»

The resin layer in the laminate of this invention preferably has a tensile strength exceeding 160 MPa and not exceeding 300 MPa. The lower limit of the tensile strength is more preferably 165 MPa or above, and even more preferably 168 MPa or above. The upper limit value of the tensile strength is more preferably 250 MPa or below, more preferably 2:30 MPa or below, and even more preferably 210 MPa or below. The tensile strength is measured according to a method described later in EXAMPLES.

With the tensile strength of the resin layer controlled above 160 MPa, the film made of the resin layer will be less likely to break, and will more effectively be suppressed from causing cracks. Meanwhile, with the tensile strength controlled to 300 MPa or below, the resin layer, even if excessively stressed, can more effectively suppress the metal layer from breaking.

<Metal Layer>

The laminate of this invention preferably has a metal layer interposed among the plurality of resin layers. Typically, a metal layer is provided on a part of the surface of a first resin layer, and a second resin layer is provided so as to cover the metal layer. The metal layer may be composed of a single species of metal, or may be composed of two or more species of metals. Metals composing the metal layer are exemplified by copper, nickel, vanadium, titanium, chromium, cobalt, gold and tungsten. Copper is preferable.

The metal layer is preferably 0.1 to 50 μm thick at the thickest part thereof, which is more preferably 1 to 10 μm.

As for a method for forming the metal layer, description of a metal layer forming step, described later in relation to the method for manufacturing the laminate of this invention, may be referred to.

<Photosensitive Resin Composition>

The resin layer in the laminate of this invention may be produced, for example, using the photosensitive resin composition. The resin layer in this invention is a cured film made of the photosensitive resin composition, which will be detailed later.

The photosensitive resin composition used in this invention (may occasionally be referred to as "the composition used in this invention", hereinafter) contains a resin selected from polyimide precursor, polyimide, polybenzoxazole precursor and polybenzoxazole (may occasionally be referred to as "polyimide precursor, etc.", hereinafter), preferably contains polyimide precursor or polybenzoxazole precursor, and even more preferably contains polyimide precursor.

It is further preferable that the resin contains a polymerizable group, and the photosensitive resin composition contains a polymerizable compound. With such design, the exposed area will have a three-dimensional network formed therein to form a strong crosslinked film. Such surface activation treatment will prevent the photosensitive resin composition layer (resin layer) from being damaged, and will improve the adhesion.

Polyimide and polybenzoxazole contained in the resin layer in the laminate of this invention preferably has a partial structure represented by —Ar-L-Ar—, where each Ar independently represents arylene group, L represents an aliphatic hydrocarbon group having 1 to 10 carbon atoms and is optionally substituted by fluorine atoms), —O—, —CO—, —S—, —SO$_2$— or —NHCO—, as well as a group composed of two of them. With such design, the resin layer will have a flexible structure, and can more effectively suppress the separation. Ar preferably represents a phenylene group, and L preferably represents an aliphatic hydrocarbon group having 1 or 2 carbon atoms and may optionally be substituted by fluorine atom (s) —O—, —CO—, —S— or —SO$_2$—. The aliphatic hydrocarbon group is preferably alkylene group.

The photosensitive resin composition used in this invention will be detailed below.

«Polyimide Precursor»

The polyimide precursor used in this invention is not specifically limited in terms of structure thereof, wherein it preferably contains a repeating unit represented by Formula (2) below.

Formula (2)

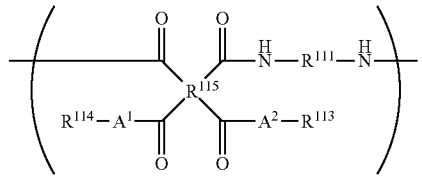

In Formula (2), each of $A^1$ and $A^2$ independently represents an oxygen atom or NH, $R^{111}$ represents a divalent organic group, $R^{115}$ represents a tetravalent organic group, each of $R^{113}$ and $R^{114}$ independently represents a hydrogen atom or monovalent organic group, at least one of $R^{113}$ or $R^{114}$ represents a polymerizable group-containing group, wherein the polymerizable group is preferable.

In Formula (2), each of $A^1$ and $A^2$ independently represents an oxygen atom or NH. Oxygen atom is preferable.

In Formula (2), $R^{111}$ represents a divalent organic group. The divalent organic group is exemplified by groups that include straight-chain or branched aliphatic group, cyclic aliphatic group and aromatic group. Preferable examples of the group include straight-chain or branched aliphatic group having 2 to 20 carbon atoms, cyclic aliphatic group having 6 to 20 carbon atoms, aromatic group having 6 to 20 carbon atoms, or combinations of these groups, wherein aromatic group having 6 to 20 carbon atoms is more preferable. In a particularly preferred embodiment of this invention, the group is represented by —Ar-L-Ar—, where each Ar independently represents an aromatic group, and L represents an aliphatic hydrocarbon group having 1 to 10 carbon atoms and is optionally substituted by fluorine atom(s), —O—, —CO—, —S—, —SO$_2$— or —NHCO—, as well as a group composed of two or more of them. Preferable ranges of them are as described above.

$R^{111}$ is preferably derived from a diamine. The diamine used for producing the polyimide precursor is exemplified by straight-chain or branched aliphatic, cyclic aliphatic or aromatic diamine. Only a single species, or two or more species of the diamines may be used.

More specifically, the diamines preferably contains straight-chain or branched aliphatic group having 2 to 20 carbon atoms, cyclic aliphatic group having 6 to 20 carbon atoms, aromatic group having 6 to 20 carbon atoms, or groups based on combinations of them; and more preferably contains a group composed of an aromatic group having 6 to 60 carbon atoms. The aromatic group is exemplified by those below.

Formula (2)

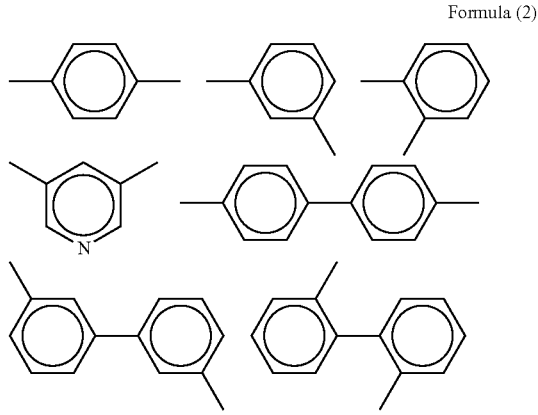

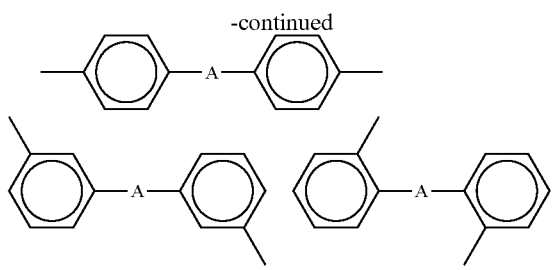

In the formulae, "A" preferably represents a single bond, or, a group selected from hydrocarbon group having 1 to 10 carbon atoms optionally substituted by fluorine atom(s), —O—, —C(=O)—, —S—, —S(=O)$_2$—, —NHCO—, and combinations of them. More preferred examples include singe bond, and group selected from alkylene group having 1 to 3 carbon atoms optionally substituted by fluorine atom(s), —O—, —C(=O)—, —S— and —SO$_2$—. Divalent group selected form the group consisting of —CH$_2$—, —O—, —S—, —SO$_2$—, —C(CF$_3$)$_2$— and —C(CH$_3$)$_2$— is more preferable.

Specific examples of diamine include 1,2-diaminoethane, 1,2-diaminopropane, 1,3-diaminopropane, 1,4-diaminobutane and 1,6-diaminohexane; 1,2- and 1,3-diaminocyclopentanes, 1,2-, 1,3- and 1,4-diaminocyclohexanes, 1,2-, 1,3- and 1,4-bis(aminomethyl)cyclohexanes, bis(4-aminocyclohexyl)methane, bis(3-aminocyclohexyl)methane, 4,4'-diamino-3,3'-dimethylcyclohexyl methane and isophorone diamine; m- and p-phenylenediamines, diaminotoluene, 4,4'- and 3,3'-diaminobiphenyls, 4,4'-diamino diphenyl ether, 3,3-diamino diphenyl ether, 4,4'- and 3,3'-diaminodiphenylmethanes, 4,4'- and 3,3'-diaminodiphenylsulfones, 4,4'- and 3,3'-diaminodiphenylsulfides, 4,4'- and 3,3'-diaminobenzophenones, 3,3'-dimethyl-4,4'-diaminobiphenyl, 2,2'-dimethyl-4,4'-diaminobiphenyl, 3,3'-dimethoxy-4,4'-diaminobiphenyl, 2,2-bis(4-aminophenyl)propane, 2,2-bis(4-aminophenyl)hexafluoropropane, 2,2-bis(3-hydroxy-4-aminophenyl)propane, 2,2-bis(3-hydroxy-4-aminophehyl) hexafluoropropane, 2,2-bis(3-amino-4-hydroxyphenyl) propane, 2,2-bis(3-amino-4-hydroxyphenyl) hexafluoropropane, bis(3-amino-4-hydroxyphenyl)sulfone, bis(4-amino-3-hydroxyphenyl)sulfone, 4,4'-diaminoparaterphenyl, 4,4'-bis(4-aminophenoxy)biphenyl, bis[4-(4-aminophenoxy)phenyl]sulfone, bis[4-(3-aminophenoxy)phenyl]sulfone, bis[4-(2-aminophenoxy)phenyl]sulfone, 1,4-bis(4-aminophenoxy)benzene, 9,10-bis(4-aminophenyl) anthracene, 3,3'-dimethyl-4,4'-diaminodiphenylsulfone, 1,3-bis(4-aminophenoxy)benzene, 1,3-bis(3-aminophenoxy) benzene, 1,3-bis(4-aminophenyl)benzene, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy)phenyl]propane, 2,2-bis[4-(4-aminophenoxy)phenyl]hexafluoropropane, 9,9-bis(4-aminophenyl)-10-hydroanthracene, 3,3',4,4'-tetraaminobiphenya, 3,3',4,4'-tetraaminodiphenyl ether, 1,4-diaminoanthraquinone, 1,5-diaminoanthraquinone, 3,3-dihydroxy-4,4'-diaminohiphenyl, 9,9'-bis(4-aminophenyl) fluorene, 4,4'-dimethyl-3,3'-diaminodiphenylsulfone, 3,3',5,5'-tetramethyl-4,4'-diaminodiphenylmethane, 2,4- and 2,5-diaminocumenes, 2,5-dimethyl-p-phenylenediamine, acetoguanamine, 2,3,5,6-tetramethyl-p-phenylenediamine, 2,4,6-trimethyl-m-phenylenediamine, bis(3-aminopropyl) tetramethyldisiloxane, 2,7-diaminofluorene, 2,5-diaminopyridine, 1,2-bis(4-aminophenyl)ethane, diaminobenzanilide, diaminobenzoate ester, 1,5-diaminonaphthalene, diaminobenzotrifluoride, 1,3-bis(4-aminophenyl)hexafluoropropane, 1,4-bis(4-aminophenyl)octafluorobutane, 1,5-bis (4-aminophenyl)decafluoropentane, 1,7-bis(4-aminophenyl) tetradecafluoroheptane, 2,2-bis[4-(3-aminophenoxy)phenyl] hexafluoropropane, 2,2-bis[4-(2-aminophenoxy)phenyl] hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)phenyl] hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(3-amino-5-trifluoromethylphenoxy)diphenylsulfone, 2,2-bis[4-(4-amino-3-trifluoromethylphenoxy)phenyl] hexafluoropropane, 3,3',5,5'-tetramethyl-4,4'-diaminobiphenyl, 4,4'-diamino-2,2'-bis(trifluoromethyl) biphenyl, 2,2',5,5',6,6'-hexafluorotolidine, and 4,4'-diaminoquaterphenyl.

Also diamines (DA-1) to (DA-18) enumerated below are preferable.

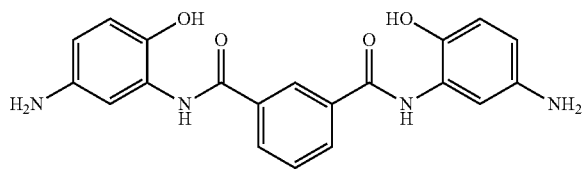

(DA-1)

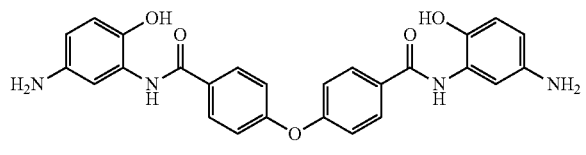

(DA-2)

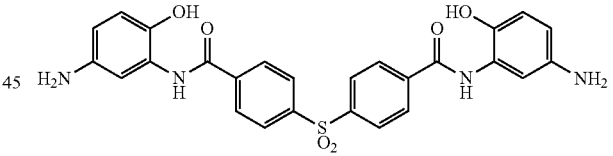

(DA-3)

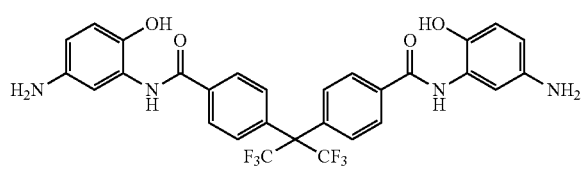

(DA-4)

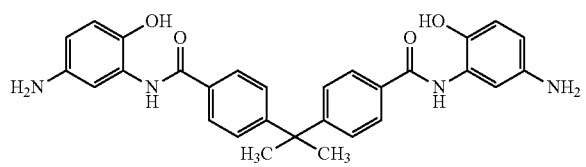

(DA-5)

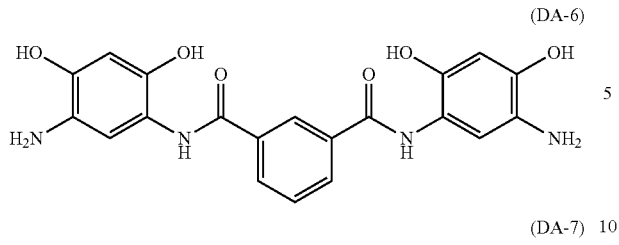
(DA-6)

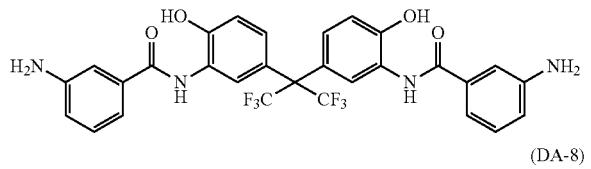
(DA-7)

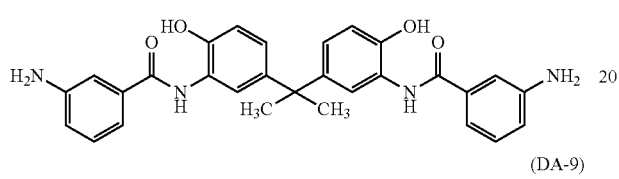
(DA-8)

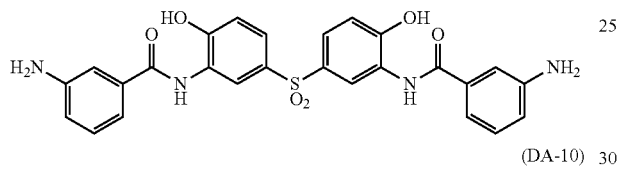
(DA-9)

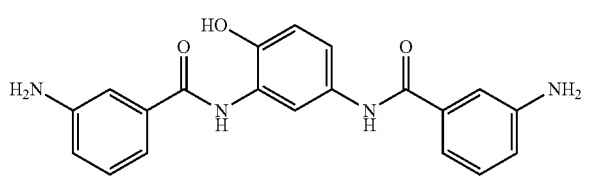
(DA-10)

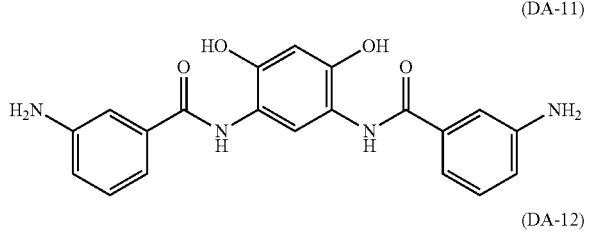
(DA-11)

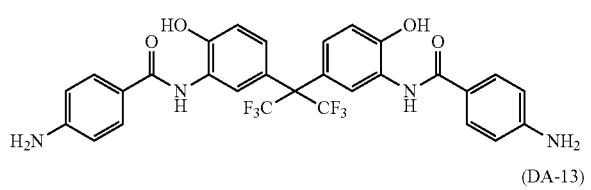
(DA-12)

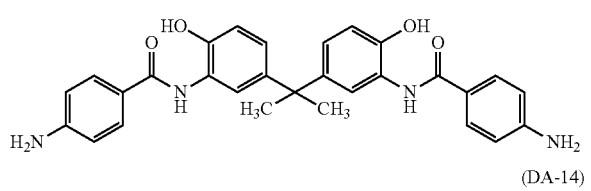
(DA-13)

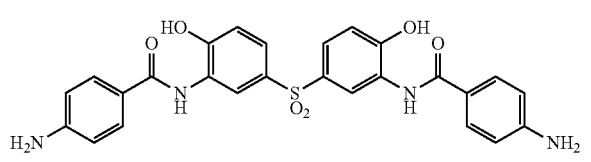
(DA-14)

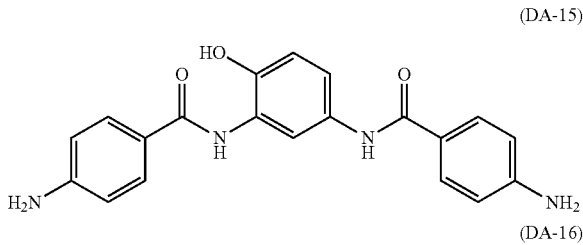
(DA-15)

(DA-16)

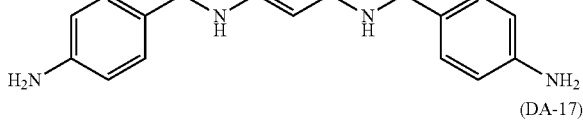
(DA-17)

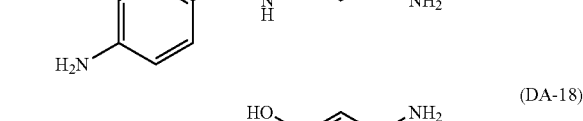
(DA-18)

Also diamine having at least two alkylene glycol units is exemplified as a preferred example. It is preferably a diamine having two or more in total of ethylene glycol chain and/or propylene glycol chain within one molecule, and more preferably a diamine having no aromatic ring.

Specific examples include, but not limited to, Jeffamine (registered trademark) KH-511, Jeffamine (registered trademark) ED-600, Jeffamine (registered trademark) ED-900, Jeffamine (registered trademark) ED-2003, Jeffamine (registered trademark) FUDR-148, Jeffamine (registered trademark) EDR-176, D-200, D-400, D-2000, D-4000 (all trade names, from HUNTSMAN Corporation), 1-(2-(2-(2-aminopropoxy)ethoxy)propoxy)propane-2-amine, and 1-(1-(1-(2-aminopropoxy)propane-2-yl)oxy)propane-2-amine.

Structural formulae of Jeffamine (registered trademark) KH-511, Jeffamine (registered trademark.) ED-600, Jeffamine (registered trademark) ED-900, Jeffamine (registered trademark) ED-2003, Jeffamine (registered trademark) EDR-148, and Jeffamine (registered trademark) EDR-176 are shown below.

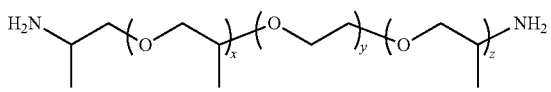

KH-511 (y = 2.0, x + z = 1.2)
ED-600 (y = 9.0, x + z = 3.6)
ED-900 (y = 12.5, x + z = 6.0)
ED-2003 (y = 39.0, x + z = 6.0)

EDR-148

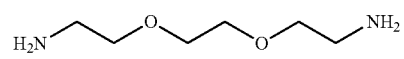

-continued

EDR-176

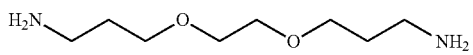

In the formulae, each of x, y and z represents an average value.

From the viewpoint of flexibility of the obtainable cured film, $R^{111}$ is preferably given by —Ar-L-Ar—, where each Ar independently represents an aromatic group, and L represents an aliphatic hydrocarbon group having 1 to 10 carbon atoms and is optionally substituted by fluorine atom(s), —O—, —CO—, —S—, —SO$_2$— or —NHCO—, as well as a group composed of two or more of them. Ar preferably represents a phenylene group, and L preferably represents an aliphatic hydrocarbon group having 1 or 2 carbon atoms and is optionally substituted by fluorine atom(s), —O—, —CO—, —S— or —SO$_2$—. The aliphatic hydrocarbon group is preferably an alkylene group.

From the viewpoint of i-line transmittance, $R^{111}$ preferably represents a divalent organic group represented by Formula (51) or Formula (61) below. In particular, from the viewpoint of i-line transmittance and availability, a divalent organic group represented by Formula (61) is more preferable.

Formula (51)

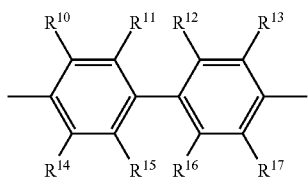

(51)

In Formula (51), each of $R^{10}$ to $R^{17}$ independently represents a hydrogen atom, fluorine atom or monovalent organic group, and at least either $R^{10}$ or $R^{17}$ represents a fluorine atom, methyl group or trifluoromethyl group.

The monovalent organic group represented by $R^{10}$ to $R^{17}$ is exemplified by unsubstituted alkyl group having 1 to 10 (preferably 1 to 6) carbon atoms, and fluorinated alkyl group having 1 to 10 (preferably 1 to 6) carbon atoms.

Formula (61)

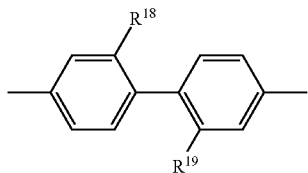

(61)

In Formula (61), each of $R^{18}$ and $R^{19}$ independently represents a fluorine atom or trifluoromethyl group.

The diamine compound represented by Formula (51) or (61) is exemplified by 2,2'-dimethylbenzidine, 2,2'-bis(trifluoromethyl)-4,4'-diaminobiphenyl, 2,2'-bis(fluoro)-4,4'-diaminobiphenyl, and 4,4'-diaminooctafluorobiphenyl. Only one species of these compounds may be used, or two or more species may be used in combination.

In Formula (2), $R^{115}$ represents a tetravalent organic group. The tetravalent organic group is preferably aromatic ring-containing tetravalent organic group, and more preferably a group represented by Formula (5) or Formula (6) below.

Formula (5)

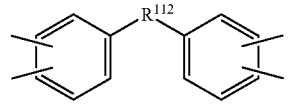

In Formula (5), $R^{112}$ represents a single bond, or, a group selected from hydrocarbon group having 1 to 10 carbon atoms optionally substituted by fluorine atom(s), —O—, —CO—, —S—, —SO$_2$—, —NHCO—, and combinations of them. More preferred examples include single bond, or a group selected from alkylene group having 1 to 3 carbon atoms optionally substituted by fluorine atom(s), —O—, —CO—, —S— and —SO$_2$—. Even more preferred examples include divalent groups selected from the group consisting of —CH$_2$—, —C(CF$_3$)$_2$—, —C(CH$_3$)$_2$—, —O—, —CO—, —S— and —SO$_2$—.

Formla (6)

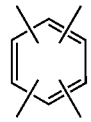

$R^{115}$ is specifically exemplified by a tetracarboxylic acid residue that remains after eliminating an anhydride group from tetracarboxylic acid dianhydride. Only one species, or two or more species of ostetracarboxylic acid dianhydrides may be used.

The tetracarboxylic acid dianhydride is preferably represented by Formula (O) below.

Formula (O)

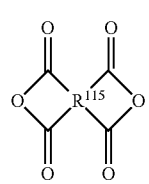

(O)

In Formula (O), $R^{115}$ represents a tetravalent organic group. $R^{115}$ is synonymous to $R^{115}$ in Formula (2), defined by same preferable ranges.

Specific examples of the tetracarboxylic acid dianhydride include pyromellitic dianhydride (PMDA), 3,3',4,4'-biphenyltetracarboxylic acid dianhydride, 3,3',4,4'-diphenylsulfidetetracarboxylic acid dianhydride, 3,3',4,4'-diphenylsulfonetetracarboxylic acid dianhydride, 3,3',4,4'-benzophenone tetracarboxylic acid dianhydride, 3,3',4,4'-diphenylmethanetetracarboxylic acid dianhydride, 2,2',3,3'-diphenylmethanetetracarboxylic acid dianhydride, 2,3,3',4'-biphenyltetracarboxylic acid dianhydride, 2,3,3',4'-benzophenone tetracarboxylic acid dianhydride, 4,4- oxydiphthalic dianhydride, 2,3,6,7-naphthalenetetracarboxylic acid dianhydride, 1,4,5,7-naphthalenetetracarboxylic acid dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)hexafluoropropane dianhydride, 1,3-diphenylhexafluoropropane-3,3,4,4-tetracarboxylic acid dianhydride, 1,4,5,6-naphthalenetetracarboxylic acid dianhydride, 2,2',3,3'-diphenyltetracarboxylic acid dianhydride, 3,4,9,10-perylenetetracarboxylic acid dianhydride, 1,2,4,5-naphthalenetetracarboxylic acid dianhydride, 1,4,5,8-naphthalenetetracarboxylic acid dianhydride, 1,8,9,10-phenanthrenetetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzenetetracarboxylic acid dianhydride, and, alkyl derivatives of these compounds having alkyl group with 1 to 6 carbon atoms or alkoxy group with 1 to 6 carbon atoms.

Also tetracarboxylic acid dianhydrides (DAA-1) to (DAA-5) enumerated below are preferable.

(DAA-1)
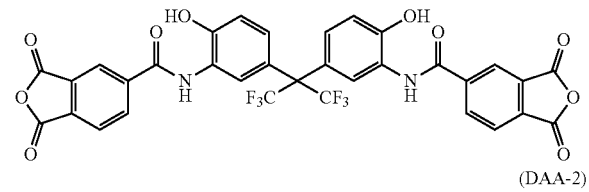

(DAA-2)
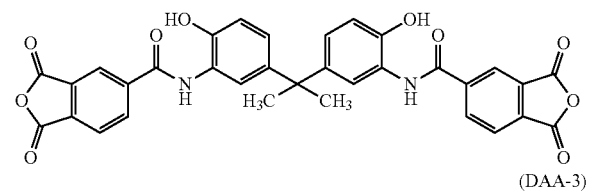

(DAA-3)
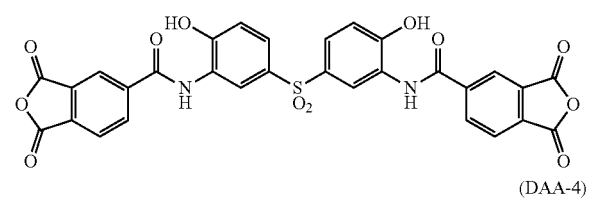

(DAA-4)
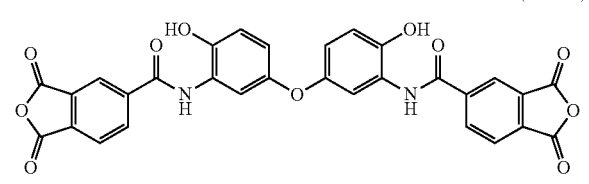

(DAA-5)
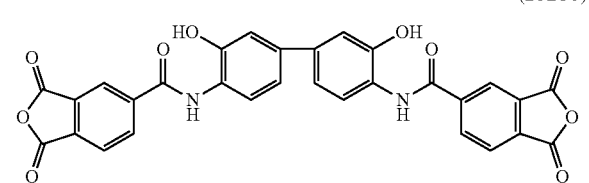

It is also preferable that at least one of $R^{111}$ or $R^{115}$ represents a OH group. More specifically, $R^{111}$ is exemplified by a residue of bisaminophenol derivative.

Each of $R^{113}$ and $R^{114}$ independently represents a hydrogen atom or monovalent organic group, and at least either $R^{113}$ or $R^{114}$ preferably contains a polymerizable group. It is more preferable that both of them contain the polymerizable group. The polymerizable group is a group capable of causing a crosslinking reaction, under interaction with heat, radical or the like, and is preferably a photo-radical polymerizable group. Specific examples of the polymerizable group include ethylenic unsaturated bond-containing group, alkoxymethyl group, hydroxymethyl group, acyloxymethyl group, epoxy group, oxetanyl group, benzoxyazolyl group, block isocyante group, methylol group, and amino group. The radical polymerizable group owned by the polyimide precursor, etc. is preferably the ethylenic unsaturated bond-containing group.

The ethylenic unsaturated bond-containing group is exemplified by vinyl group, (meth)allyl group, and group represented by Formula (III) below.

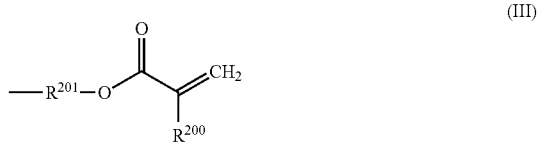

(III)

In Formula (III), $R^{200}$ represents a hydrogen atom or methyl group, wherein methyl group is preferable.

In Formula (III), $R^{201}$ represents an alkylene group having 2 to 12 carbon atoms, —CH$_2$CH(OH)CH$_2$— or polyoxyalkylene group having 4 to 30 carbon atoms.

$R^{201}$ is preferably exemplified by ethylene group, propylene group, trimethylene group, tetramethylene group, 1,2-butanediyl group, 1,3-butanediyl group, pentamethylene group, hexamethylene group, octamethylene group, dodecamethylene group, and —CH$_2$CH(OH)CH$_2$—, wherein ethylene group, propylene group, trimethylene group, and —CH$_2$CH(OH)CH$_2$— are more preferable.

In a particularly preferred example, $R^{200}$ represents a methyl group, and $R^{201}$ represents an ethylene group.

Each of $R^{113}$ and $R^{114}$ independently represents a hydrogen atom or monovalent organic group. The monovalent organic group is exemplified by aromatic group and aralkyl group, having acidic group(s) bound to one, two or three carbon atoms that composes the aryl group, and preferably bound to one carbon atom. Specific examples include acidic group-containing aromatic group having 6 to 20 carbon atoms, and acidic group-containing aralkyl group having 7 to 25 carbon atoms. More specifically exemplified are acidic group-containing phenyl group, and acidic group-containing benzyl group. The acidic group is preferably OH group.

It is more preferable that $R^{113}$ or $R^{114}$ represents a hydrogen atom, 2-hydroxybenzyl group, 3-hydroxybenzyl group or 4 hydroxybenzyl group.

From the viewpoint of solubility in organic solvent, $R^{113}$ or $R^{114}$ preferably represents a monovalent organic group. The monovalent organic group preferably contains a straight-chain or branched alkyl group, cyclic alkyl group, or aromatic group, and more preferably contains an aromatic group-substituted alkyl group.

The alkyl group preferably has 1 to 30 carbon atoms. The alkyl group may be any of straight-chain, branched and cyclic ones. The straight-chain or branched alkyl group is exemplified by methyl group, ethyl group, propyl group, butyl group, pentyl group, hexyl group, heptyl group, octyl group, nonyl group, decyl group, dodecyl group, tetradecyl group, octadecyl group, isopropyl group, isobutyl group, sec-butyl group, t-butyl group, 1-ethylpentyl group, 2-ethylhexyl group, 2-(2-(2-methoxyethoxy)ethoxy)ethoxy group, 2-(2-(2-ethoxyethoxy)ethoxy)ethoxy group, 2-(2-(2-(2-methoxyethoxy)ethoxy)ethoxy)ethoxy group, and 2-(2-(2-(2-ethoxyethoxy)ethoxy)ethoxy)ethoxy group. The cyclic alkyl group may be a monocyclic alkyl group, or may be a polycyclic alkyl group. The monocyclic alkyl group is exemplified by cyclopropyl group, cyclobutyl group, cyclopentyl group, cyclohexyl group, cycloheptyl group and cyclooctyl group. The polycyclic alkyl group is exemplified by adamantyl group, norbornyl group, bornyl, group, camphenyl group, decahydronaphthyl group, tricyclodecanyl group, tetracyclodecanyl group, camphoroyl group, dicyclohexyl group and pinenyl group. Among them, cyclohexyl group is most preferable from the viewpoint of balancing with high sensitivity. The aromatic group-substituted alkyl group is preferably an aromatic group-substituted, straight-chain alkyl group as described later.

The aromatic group is specifically exemplified by substituted or non-substituted benzene ring, naphthalene ring, pentalene ring, indene ring, azulene ring, heptalene ring, indacene ring, perylene ring, pentacene ring, acenaphthene, phenanthrene ring, anthracene ring, naphthacene ring, chrysene ring, triphenylene ring, fluorene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, quinolizine ring, quinoline ring, phthalazine ring, naphthyridine ring, quinoxaline ring, quinazoline ring, isoquinoline ring, carbazole ring, phenanthridine ring, acridine ring, phenanthroline ring, thianthrene ring, chromene ring, xanthene ring, phenoxathiin ring, phenothiazine ring and phenazine ring. Benzene ring is most preferable.

When $R^{113}$ in Formula (2) represents a hydrogen atom, or, $R^{114}$ represents a hydrogen atom, the polyimide precursor may form a counter salt with a tertiary amine compound having an ethylenic unsaturated bond. Such tertiary amine compound having an ethylenic unsaturated bond is exemplified by N,N-dimethylaminopropyl methacrylate.

The polyimide precursor preferably contains fluorine atom(s) in its structural unit. The polyimide precursor preferably has a fluorine atom content of 10% by mass or more, and more preferably 20% by mass or less.

For the purpose of improving adhesiveness with the substrate, the polyimide precursor may be co-polymerized with an aliphatic group having a siloxane structure. More specifically, the diamine component is exemplified by bis(3-aminopropyl)tetramethyldisiloxane, and bis(p-aminophenyl)octamethylpentasiloxane.

The repeating unit represented by Formula (2) is preferably a repeating unit represented by Formula (2-A). In other words, at least one species of the polyimide precursor, etc. used in this invention is preferably a precursor having a repeating unit represented by Formula (2-A). With such structure, the exposure latitude may be widened.

Formula (2-A)

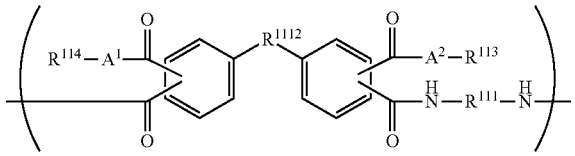

In Formula (2-A), each of $A^1$ and $A^2$ represents an oxygen atom, each of $R^{111}$ and $R^{112}$ independently represents a divalent organic group, each of $R^{113}$ and $R^{114}$ independently represents a hydrogen atom or monovalent organic group, at least one of $R^{113}$ or $R^{114}$ represents a polymerizable group-containing group, and is preferably a polymerizable group.

$A^1$, $A^2$, $R^{111}$, $R^{113}$ and $R^{114}$ are respectively synonymous to $A^1$, $A_2$, $R^{111}$, $R^{113}$ and $R^{114}$ in Formula (2), defined by the same preferable ranges.

$R^{112}$ is synonymous to $R^{112}$ in Formula (5), defined by the same preferable ranges.

The polyimide precursor may contain one species of, and even may be two or more species of, the repeating unit represented by Formula (2). It may also contain a structural isomer of the repeating unit represented by Formula (2). Of course, the polyimide precursor may contain other repeating unit, besides the repeating unit represented by Formula (2).

One embodiment of the polyimide precursor in this invention is exemplified by a polyimide precursor, in which the repeating unit represented by Formula (2) accounts for 50 mol % or more, or 70 mol % or more, and particularly 90 mol % or more of the total repeating units.

The polyimide precursor preferably has a weight-average molecular weight (Mw) of 18,000 to 30,000, more preferably 20,000 to 27,000, and even more preferably 22,000 to 25,000. The number-average molecular weight (Mn) is preferably 7,200 to 14,000, more preferably 8,000 to 12,000, and even more preferably 9,200 to 11,200.

The polyimide precursor preferably has a dispersity of 2.5 or larger, more preferably 2.7 or larger, and even more preferably 2.8 or larger. The upper limit value of the dispersity of polyimide precursor is not specifically limited, but is preferably 4.5 or smaller, more preferably 4.0 or smaller, even more preferably 3.8 or smaller, yet more preferably 3.2 or smaller, furthermore preferably 3.1 or smaller, still more preferably 3.0 or smaller, and particularly 2.95 or smaller.

«Polyimide»

The polyimide used in this invention is not specifically limited so long as it has an imide ring, and is a high molecular compound having a polymerizable group, but is preferably a compound represented by Formula (4) below having a polymerizable group.

Formula (4)

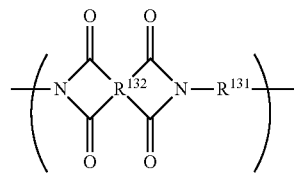

(4)

In Formula (4), $R^{131}$ represents a divalent organic group, and $R^{132}$ represents a tetravalent organic group.

The polymerizable group may reside at least one of $R^{131}$ or $R^{132}$, or may reside at the terminal of the polyimide as represented by Formula (4-1) or Formula (4-2) below.

(Formula 4-1)

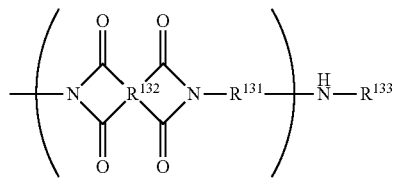

In Formula (4-1), $R^{132}$ represents a polymerizable group. The other groups are synonymous to those in Formula (4).

Formula (4-2)

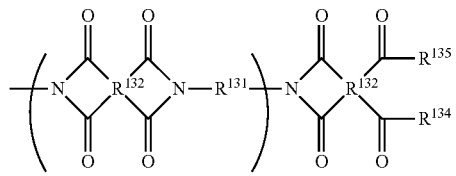

At least one of $R^{134}$ or $R^{135}$ represents a polymerizable group, or represents an organic group when they do not represent a polymerizable group. The other groups are synonymous to those in Formula (4).

The polymerizable group is synonymous to the polymerizable group having been described in relation to the polymerizable group owned by the above-described polyimide precursor, etc.

$R^{131}$ represents a divalent organic group. The divalent organic group is exemplified by those represented by $R^{111}$ in Formula (2), defined by the same preferable ranges.

$R^{131}$ is exemplified by a diamine residue that remains after elimination of an amino group from the diamine. The diamine is exemplified by aliphatic, alicyclic or aromatic diamine. Specific examples include those represented by $R^{111}$ in polyimide precursor represented by Formula (2).

$R^{131}$ is preferably a diamine residue having at least two alkylene glycol units in the principal chain, from the viewpoint of more effectively suppressing warp during firing. More preferably, $R^{131}$ represents a diamine residue having two or more in total of ethylene glycol chain and/or propylene glycol chain; within one molecule, and even more preferably a diamine residue having no aromatic ring.

The diamine having two or more in total of the ethylene glycol chain and/or propylene glycol chain within one molecule is exemplified by, but not limited to, Jeffamine (registered trademark) KH-511, ED-600, ED-900, ED-2003, EDR-148, EDR-176, D-200, D-400, D-2000, D-4000 (all trade names, from HUNTSMAN Corporation), 1-(2-(2-(2-aminopropoxy)ethoxy)propoxy)propane-2-amine, 1-(1-(1-(2-aminopropoxy)propane-2-yl)oxy)propane-2-amine.

$R^{132}$ represents a tetravalent organic group. The tetravalent organic group is exemplified by those represented by $R^{115}$ in Formula (2), defined by the same preferable ranges.

For example, four binding moieties of the tetravalent organic group represented by $R^{115}$ combine to four —C(=O)— moieties in Formula (4) to form condensed ring(s).

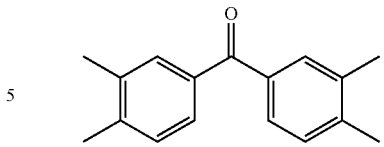

Furthermore, $R^{132}$ is exemplified by tetracarboxylic acid residue that remains after an anhydride group was eliminated from the tetracarboxylic acid dianhydride. Specific examples include those represented by $R^{115}$ in polyimide precursor represented by Formula (2). From the viewpoint of strength of the cured film, $R^{132}$ preferably represents an aromatic diamine residue having 1 to 4 aromatic rings.

The polyimide also preferably has OH group for both of $R^{131}$ and $R^{132}$. More specifically, $R^{131}$ is preferably exemplified by 2,2-bis(3-hydroxy-4-aminophenyl)propane, 2,2-bis(3-hydroxy-4-aminophenyl)hexafluoropropane, 2,2-bis(3-amino-4-hydroxyphenyl)propane, 2,2-bis(3-amino-4-hydroxyphenyl)hexafluoropropane, and aforementioned (DA-1) to (DA-18), meanwhile $R^{132}$ is preferably exemplified by aforementioned (DAA-1) to (DAA-5).

The polyimide also preferably has fluorine atom(s) in the structural unit thereof. The content of fluorine atom in the polyimide is preferably 10% by mass or above, and 20% by mass or below.

For the purpose of improving adhesion with the substrate, the polyimide may be copolymerized with an aliphatic group having a siloxane structure. The diamine component is specifically exemplified by bis(3-aminopropyl)tetramethyl disiloxane, and bis(p-aminophenyl)octamethyl pentasiloxane.

In order to improve the shelf stability of the composition, the polyimide is preferably blocked at the terminals of the principal chain, using a terminal blocking agent such as monoamine, acid anhydride, monocarboxylic acid, monoacid chloride compound, and activated monoester. Among them, monoamine is preferably used. The monoamine is preferably exemplified by a aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrmidine, 2-aminophenol, 3-aminophenol, 4-aminophenol, 2-aminothdophenol, 3-aminothiophenol, and 4-aminothiophenol. Two or more species of them may be used, that is, a plurality of terminal blocking agents may be allowed to react to introduce a plurality of different terminal groups.

The polyimide preferably has an imidation ratio of 85% or larger, and more preferably 90% or larger. With the imidation ratio of 85% or larger, the film will have only a small degree of shrinkage due to ring-closing imidation under heating, and will be suppressed from warping.

The polyimide may contain a repeating unit represented by Formula (4) having two or more different groups for $R^{131}$ or $R^{132}$, besides a repeating unit represented by Formula (4) having all the same groups for $R^{131}$ or R. The polyimide may contain a repeating unit represented by Formula (4) having two or more different groups for $R^{131}$ or $R^{132}$, besides a repeating unit represented by Formula (4) having all the same groups for $R^{131}$ or $R^{132}$. Alternatively, the polyimide may contain any other kind of repeating unit, besides the repeating unit represented by Formula (4) above. Alternatively, the polyimide may contain any other kind of repeating unit, besides the repeating unit represented by Formula (4) above.

The polyimide may be synthesized, for example, by firstly obtaining the polyimide precursor by any of methods, including a method for allowing a tetracarboxylic acid dianhydride to react with a diamine compound (partially substituted by a monoamine as the terminal blocking agent) at low temperatures; a method for allowing a tetracarboxylic acid dianhydride (partially substituted by an acid anhydride or monoacid chloride compound or activated monoester compound as the terminal blocking agent) to react with a diamine compound at low temperatures; a method for obtaining a diester by allowing a tetracarboxylic acid dianhydride to react with an alcohol, and then allowing it to react with a diamine (partially substituted by a monoamine as the terminal blocking agent) in the presence of a condensing agent; and a method for obtaining a diester from a tetracarboxylic acid dianhydride and an alcohol, converting the remaining dicarboxylic acid to an acid chloride, and then allowing the product to react with a diamine (partially substituted by a monoamine as the terminal blocking agent), and then processing the thus-obtained polyimide precursor by a method for complete imidation based on known imidation reaction; or a method for partially introducing the imide structure by interrupting the imidation reaction in midway; or a method for partially introducing the imide structure by blending the completely imidated polymer and the polyimide precursor of such polymer.

Commercially available polyimide is exemplified by Durimide (registered trademark Commercially available polyimide is exemplified by Durimide (registered trademark) 284, from Fujifilm Corporation, and Matrimide5218, from HUNTSMAN Corporation.

The polyimide preferably has a weight-average molecular weight (Mw) of 5,000 to 70,000, more preferably 8,000 to 50,000, and even more preferably 10,000 to 30,000. With the weight-average molecular weight controlled to 5,000 or larger, the cured film will have an improved breakage resistance. In expectation of obtaining the cured film that excels in mechanical properties, a weight-average molecular weight of 20,000 or larger is particularly preferable. When two or more species of polyimides are contained, at least one species of polyimide preferably falls within the above-described range of weight-average molecular weight.

«Polybenzoxazole Precursor»

Although the polybenzoxazole precursor used in this invention is not particularly specified in terms of its structure, it is preferably a compound containing a repeating unit represented by Formula (3) below.

Formula (3)

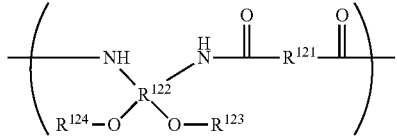

In Formula (3), $R^{121}$ represents a divalent organic group, $R^{122}$ represents a tetravalent organic group, each of $R^{123}$ and $R^{124}$ independently represents a hydrogen atom or monovalent organic group.

In Formula (3), $R^{123}$ and $R^{124}$ are synonymous to $R^{113}$ in Formula (2), defined by the same preferable ranges. In other words, at least one of them preferably represents a polymerizable group.

In Formula (3), $R^{121}$ represents a divalent organic group. The divalent organic group is preferably a group that contains at least either aliphatic group or aromatic group. The aliphatic group is preferably a straight-chain aliphatic group. $R^{121}$ preferably represents a dicarboxylic acid residue. Only one species, or two or more species of the dicarboxylic acid residues may be used.

The dicarboxylic acid residue is preferably an aliphatic group-containing dicarboxylic acid residue and an aromatic group-containing dicarboxylic acid residue, wherein the aromatic group-containing dicarboxylic acid residue is more preferable.

The aliphatic group-containing dicarboxylic acid preferably contains a straight-chain or branched (preferably straight-chain) aliphatic group, and more preferably contains a straight-chain or branched (preferably straight-chain) aliphatic group and two —COOH groups. The straight-chain or branched (preferably straight-chain) aliphatic group preferably has 2 to 30 carbon atoms, the number of which is more preferably 2 to 25, even more preferably 3 to 20, yet more preferably 4 to 15, and particularly 5 to 10. The straight-chain aliphatic group is preferably an alkylene group.

The dicarboxylic acid that contains a straight-chain aliphatic group is exemplified by maionic acid, dimethylmaionic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, gluratic acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, and dicarboxylic acids given by the formulae below.

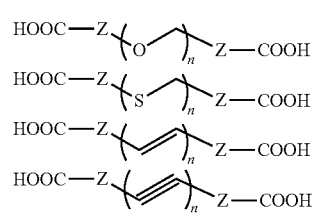

(In the formulae, Z represents a hydrocarbon group having 1 to 6 carbon atoms, and n represents an integer of 1 to 6.)

The aromatic group-containing dicarboxylic acid is preferably any one of the aromatic group-containing dicarboxylic acids enumerated below, and is more preferably any one of dicarboxylic acids composed of the aromatic groups enumerated below and two —COOH groups only.

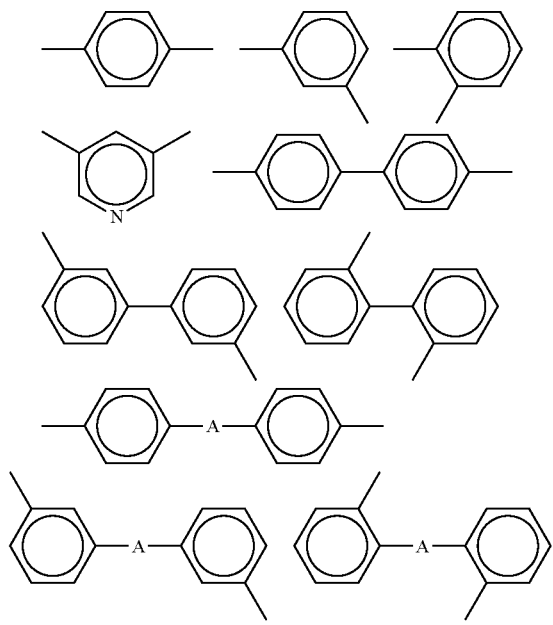

In the formulae, A represents a divalent group selected from the group consisting of —CH$_2$—, —O—, —S—, —SO$_2$—, —CO—, —NHCO—, —C(CF$_3$)$_2$—, and —C(CH$_3$)$_2$—.

Specific examples of the aromatic group-containing dicarboxylic acid include 4,4'-carbonyldibenzoic acid and 4,4'-dicarboxy diphenyl ether, and terephthalic acid.

In Formula (3), R$^{122}$ represents a tetravalent organic group. The tetravalent organic group is synonymous to those represented by R$^{115}$ in Formula (2), defined by the same preferable ranges.

R$^{122}$ is also preferably a group derived from bisaminophenol derivative. The group derived from bisaminophenol derivative is exemplified by 3,3'-diamino-4,4'-dihydroxybiphenyl, 4,4'-diamino-3,3'-dihydroxybiphenyl, 3,3'-diamino-4,4'-dihydroxydiphenylsulfone, 4,4'-diamino-3,3'-dihydroxydiphenylsulfone, bis(3-amino-4-hydroxyphenyl)methane, 2,2-bis(3-amino-4-hydroxyphenyl)propane, 2,2-bis(3-amino-4-hydroxyphenyl)hexafluoropropane, 2,2-bis(4-amino-3-hydroxyphenyl)hexafluoropropane, bis(4-amino-3-hydroxyphenyl)methane, 2,2-bis(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene, and 1,3-diamino-4,6-dihydroxybenzene. These bisaminophenols may be used independently, or in a mixed manner.

Among the bisaminophenol derivatives, preferable are the aromatic group-containing bisaminophenol derivatives enumerated below.

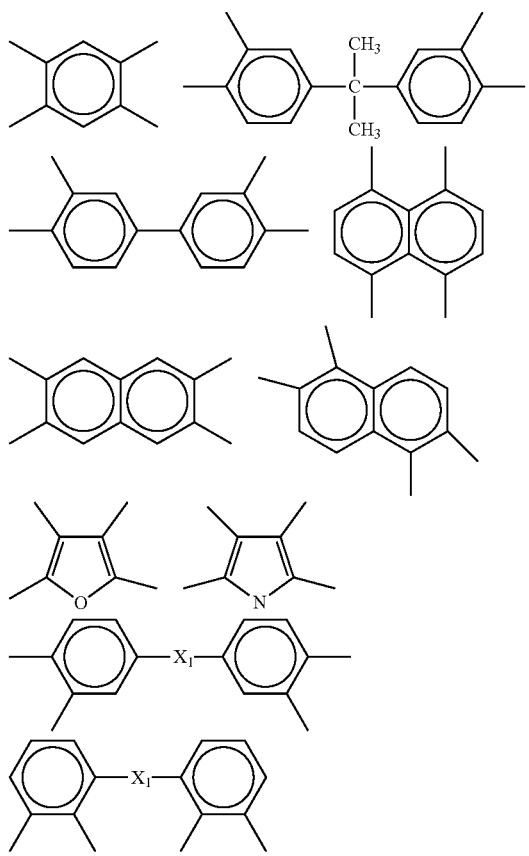

In the formulae, X$_1$ represents —O—, —S—, —C(CF$_3$)$_2$—, —SO$_2$— or —NHCO—.

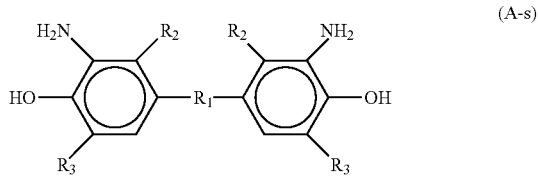

(A-s)

In Formula (A-s), R$_1$ represents a hydrogen atom, alkylene, substituted alkylene, —O—, —S—, —SO$_2$—, —CO—, —NHCO—, single bond, or organic group selected from the group represented by Formula (A-sc) below. Each R$_2$ represents any one of hydrogen atom, alkyl group, alkoxy group, acyloxy group and cyclic alkyl group, where (R$_2$)s may be same or different. Each R$_3$ represents any one of hydrogen atom, straight-chain or branched alkyl group, alkoxy group, acyloxy group and cyclic alkyl group, where (R$_3$)s may be same or different.

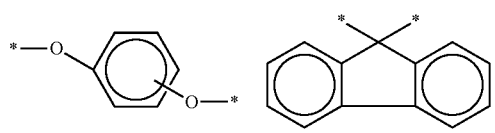

(A-Sc)

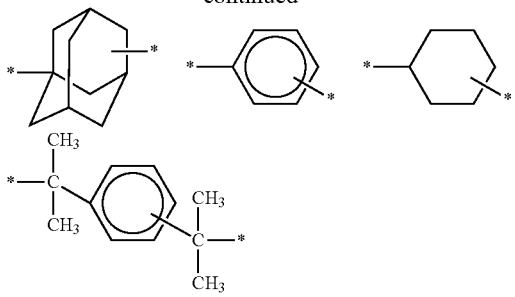

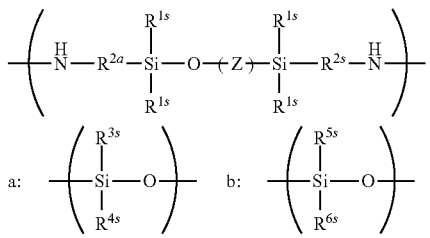

(In Formula (A-sc), *represents a point where the group is bound to the aromatic ring of the aminophenol group in the bisaminophenol derivative represented by Formula (A-s).)

In Formula (A-s), residence of a substituent also on the ortho position relative to the phenolic hydroxy group, or for $R_3$, is considered to make the distance between the carbonyl carbon in the amide bond and the hydroxy group shorter, expected to advantageously enhance the cyclization ratio during curing even at low temperatures.

In Formula (A-s), residence of an alkyl group for $R_2$, and an alkyl group for $R_3$ is particularly preferable, since it keeps kept highly translucent to i-line, being kept highly cyclizable in low temperature curing.

In Formula (A-s), $R_1$ further preferably represents an alkylene or substituted alkylene. Specific examples of the alkylene and substituted alkylene represented by $R_1$ include —$CH_2$—, —CH($CH_3$)—, —C($CH_3$)$_2$—, —CH($CH_2CH_3$)—, —C($CH_3$)($CH_2CH_3$)—, —C($CH_2CH_3$)($CH_2CH_3$)—, —CH($CH_2CH_2CH_3$)—, —C($CH_3$)($CH_2CH_2CH_3$)—, —CH(CH($CH_3$)$_2$)—, —C($CH_3$)(CH($CH_3$)$_2$)—, —CH($CH_2CH_2CH_2CH_3$)—, —C($CH_3$)($CH_2CH_2CH_2CH_3$)—, —CH($CH_2CH(CH_3)_2$)—, —C($CH_3$)($CH_2CH(CH_3)_2$)—, —CH($CH_2CH_2CH_2CH_2CH_3$)—, —C($CH_3$)($CH_2CH_2CH_2CH_2CH_3$)—, —CH($CH_2CH_2CH_2CH_2CH_2CH_3$)—, and —C($CH_3$)($CH_2CH_2CH_2CH_2CH_2CH_3$)—. Among them, —$CH_2$—, —CH($CH_3$)— and —C($CH_3$)$_2$— are more preferable, since the obtainable polybenzoxazole precursor will be well balanced among being kept highly translucent to i-line, being kept highly cyclizable in low temperature curing, and being sufficiently soluble not only to aqueous alkaline solution but also to solvent.

The bisaminophenol derivative represented by Formula (A-s) may be produced, making reference for example to the description in paragraphs [0085] to [0094] and Example 1 (paragraphs [0189] to [0190]) of JP-A-2013-256506, the contents of which are incorporated into this specification.

Structures of the bisaminophenol derivative represented by Formula (A-s) are specifically exemplified by those described in paragraphs [0070] to [0080] of JP-A-2013-256506, the contents of which are incorporated into this specification. Of course this invention is not limited thereto.

The polybenzoxazole precursor may contain other species of repeating unit, besides the repeating unit represented by Formula (3).

From the viewpoint of successfully suppressing the warp due to ring closure, a diamine residue represented by Formula (SL) below is preferably contained.

In Formula (SL), Z contains a-structure and b-structure, $R^{1s}$ represents a hydrogen atom or a hydrocarbon group having 1 to 10 carbon atoms, $R^{2s}$ represents a hydrocarbon group having 1 to 10 carbon atoms, at least one of $R^{3s}$, $R^{4s}$, $R^{5s}$ or $R^{6s}$ represents an aromatic group, and each of the residual ones represents a hydrogen atom or an organic group having 1 to 30 carbon atoms, which may be same or different. Mode of polymerization of the a-structure and the b-structure may be block polymerization or random polymerization. As for molar percentage of the Z moiety, the a-structure accounts for 5 to 95 mol %, the b-structure accounts for 95 to 5 mol %, where a+b=100 mol %.

In Formula (SL), Z preferably has the b-structure whose $R^{5s}$ and $R^{6s}$ represent a phenyl group. The structure represented by Formula (SL) preferably has a molecular weight of 400 to 4,000, and more preferably 500 to 3,000. With the molecular weight controlled within these ranges, the polybenzoxazole precursor after the dehydration ring closure will have a reduced elasticity, balancing an effect of suppressing the warp and an effect of improving the solubility in solvent.

When the diamine residue represented by Formula (SL) is contained as the other repeating unit, the polybenzoxazole precursor further preferably contain, as the repeating unit, a tetracarboxylic acid residue that remains after eliminating an anhydride group from tetracarboxylic acid dianhydride. Such tetracarboxylic acid residue is exemplified by those represented by $R^{115}$ in Formula (2).

The polybenzoxazole precursor, when used for example for the composition described later, preferably has a weight-average molecular weight (Mw) of 18,000 to 30,000, which is more preferably 20,000 o 29,000, and even more preferably 22,000 to 28,000. The number-average molecular weight (Mn) is preferably 7,200 to 14,000, more preferably 8,000 to 12,000, and even more preferably 9,200 to 11,200.

The polybenzoxazole precursor preferably has a dispersity 1.4 or larger, which is more preferably 1.5 or larger, and even more preferably 1.6 or larger. Although not specifically limited, the upper limit value of dispersity of the polybenzoxazole precursor is preferably 2.6 or smaller, more preferably 2.5 or smaller, even more preferably 2.4 or smaller, yet more preferably 2.3 or smaller, and furthermore preferably 2.2 or smaller.

«Polybenzoxazole»

Polybenzoxazole is not specifically limited so long as it is a polymer having a benzoxazole ring, but is preferably a compound represented by Formula (X) below, and more preferably a compound represented by Formula (X) below and having an polymerizable group.

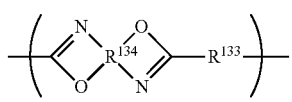

In Formula (X), $R^{133}$ represents a divalent organic group, and $R^{134}$ represents a tetravalent organic group.

The polymerizable group, when contained, may reside in at least either $R^{133}$ or $R^{134}$, or may reside at the terminal of polybenzoxazole, as represented by Formula (X-1) or (X-2) below.

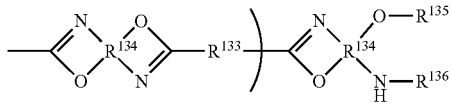

Formula (X-1)

In Formula (X-1), at least one of $R^{135}$ or $R^{136}$ represents a polymerizable group, or an organic group rather than polymerizable group. The other groups are synonymous to those in Formula (X).

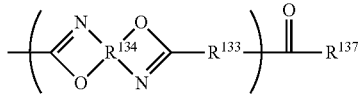

Formula (X-2)

In Formula (X-2), $R^{135}$ represents a polymerizable group, and the others are substituents. The other groups are synonymous to those in Formula (X).

The polymerizable group is synonymous to the polymerizable group having been described in relation to the polymerizable group owned by the above-described polyimide precursor, etc.

$R^{133}$ represents a divalent organic group. The divalent organic group is exemplified by aliphatic or aromatic group. Specific examples may be those represented by $R^{121}$ in polybenzoxazole precursor represented by Formula (3). Preffered examples thereof are same as those represented by $R^{121}$.

$R^{134}$ represents a tetravalent organic group. The tetravalent organic group is exemplified by those represented by $R^{122}$ in polybenzoxazole precursor represented by Formula (3). Preferred examples thereof are same as those represented by $R^{122}$.

For example, four binding moieties of the tetravalent organic group represented by $R^{134}$ combine to nitrogen atoms and oxygen atoms in Formula (X) to form condensed ring(s). For example, when $R^{134}$ represents the organic group below, the structure below will be formed.

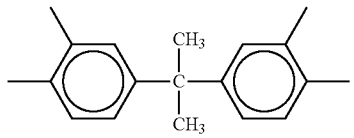

The polybenzoxazole preferably has a ratio of oxazole conversion of 85% or larger, which is more preferably 90% or larger. With the ratio of oxazole conversion controlled to 85% or larger, the film will have only a small degree of shrinkage due to ring-closing oxazole conversion under heating, and will be suppressed from warping.

Polybenzoxazole may contain the repeating units represented by Formula (X) with the same group for all ($R^{131}$)s and ($R^{132}$)s, or may contain the repeating units represented by Formula (X) with two or more different kinds of groups for ($R^{131}$)s and ($R^{132}$)s. Alternatively, polybenzoxazole may contain any other kind of repeating unit, besides the repeating unit represented by Formula (X) above.

The polybenzoxazole may be obtained typically by allowing a bisaminophenol derivative, to react with a compound selected from a dicarboxylic acid having $R^{133}$, and dichloride and derivatives of such dicarboxylic acid, to thereby obtain the polybenzoxazole precursor first; and then by converting the thus obtained product into an oxazole based on any known method for oxazole formation.

When dicarboxylic acid is used, it is also preferable to use a dicarboxylic acid derivative of the activated ester-type, which is preliminarily reacted with 1-hydroxy-1,2,3-benzotriazole or the like, in order to elevate the reaction yield.

The polybenzoxazole preferably has a weight-average molecular weight (Mw) of 5,000 to 70,000, which is more preferably 8,000 to 50,000 and more preferably 10,000 to 30,000. With the weight-average molecular weight controlled to 5,000 or larger, the cured film will have an improved breakage resistance.

In expectation of obtaining the cured film that excels in mechanical properties, a weight-average molecular weight of 20,000 or larger is particularly preferable. When two or more species of polybenzoxazoles are contained, at least one species of polybenzoxazole preferably falls within the above-described ranges of weight-average molecular weight.

«Method for Producing Polyimide Precursor, etc.»

The polyimide precursor, etc. may be obtained by allowing a dicarboxylic acid or a dicarboxylic acid derivative to react with a diamine. Preferably, the dicarboxylic acid or the dicarboxylic acid derivative is halogenated using a halogenation agent, and then allowing the product to react with the diamine.

In the method for producing the polyimide precursor, etc., it is preferable to use an organic solvent for the reaction. Only one species, or two or more species of organic solvents may be used.

The organic solvent is exemplified by pyridine, diethylene glycol dimethyl ether (diglyme), N-methylpyrrolidone and N-ethylpyrrolidone, which are selectable depending on the starting materials to be employed.

When polyimide is used as the polyimide precursor, etc., each of the polyimide precursor may separately synthesized and then may be cyclized under heating, or, polyimide may directly be synthesized.

<«Terminal Blocking Agent»>

When the polyimide precursor, etc. is produced, the terminals of the polyimide precursor, etc. is preferably blocked with a terminal blocking agent such as acid anhydride, monocarboxylic acid, monoacid chloride compound, and activated monoester compound, in expectation of further improving the shelf stability. For the terminal blocking agent, monoamine is preferably used. Preferred examples of monoamine include aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene,2-aminobenzoicacid, 3-aminobenzoic acid, 4-aminobenzoic acid, 4-aminosalycylic acid, 5-aminosalycylic acid, 6-aminosalycylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more species of these compounds may be used. By allowing a plurality of terminal blocking agents to react a plurality of different terminal groups may be introduced.

<«Solid Deposition»>

Method for producing the polyimide precursor, etc. may include a process of allowing a solid to deposit. More specifically, the polyimide precursor, etc. contained in the reaction liquid is thrown into water, and the produced precipitate is then dissolved in tetrahydrofuran or any other solvent capable of dissolving therein the polyimide precursor, etc., for solid deposition.

The polyimide precursor, etc. is then dried to obtain a powdery polyimide precursor, etc.

The composition used in this invention may contain only one species selected from polyimide precursor, polyimide, polybenzoxazole precursor and polybenzoxazole, or may contain two or more species of them. Alternatively, two or more kinds of resins that belong to the same category but have different structures may be contained.

The content of the polyimide precursor, etc. in the composition used in this invention is preferably 10 to 99% by mass of the solid content, which is more preferably 50 to 98% by mass, and even more preferably 70 to 96% by mass.

The paragraphs below will describe components that may be contained in the composition used in this invention. This invention may contain any components other than those described below, and of course, these components are not essential.

«Polymerizable compound»

As described previously, it is preferable in this invention that the resin of the polyimide precursor, etc. has a polymerizable group, or the photosensitive resin composition contains a polymerizable compound. With such design, it is now possible to form the cured film with an improved heat resistance.

The polymerizable compound is a compound having a polymerizable group, for which any known compounds crosslinkable by a radical, acid or base may be used. The polymerizable group is exemplified by the polymerizable group having been described in relation to the polyimide precursor, etc. Only one species, or two or more species of the polymerizable compounds may be contained.

The polymerizable compound may have any chemical forms including monomer, prepolymer, oligomer, mixtures of them, and multimers of them.

In this invention, the monomer type polymerizable compound (also referred to as "polymerizable monomer", hereinafter) is a compound different from high molecular compound. The polymerizable monomer is typically a low molecular compound, preferably with a molecular weight of 2,000 or smaller, more preferably 1,500 or smaller, and even more preferably 900 or smaller. The molecular weight of the polymerizable monomer is typically 100 or larger.

The oligomer type polymerizable compound is typically a polymerized product with a relatively small molecular weight, and is preferably a polymerized product in which 10 to 100 polymerizable monomers are bound. The oligomer type polymerizable compound preferably has a weight-average molecular weight of 2,000 to 20,000, more preferably 2,000 to 15,000, and most preferably 2,000 to 10,000.

The number of functional groups of the polymerizable compound in this invention means the number of polymerizable groups per molecule.

From the viewpoint of deveopability, the polymerizable compound preferably contains at least one species of bi- or higher functional polymerizable compound having two or more polymerizable groups, and more preferably contains at least ore species of tri- or higher functional polymerizable compound.

From the viewpoint of improving the heat resistance through formation of a three-dimensional crosslinked structure, the polymerizable compound in this invention also preferably contains at least one species of tri- or higher functional polymerizable compound. It may alternatively be a mixture of a bi- or lower functional polymerizable compound and a tri- or higher functional polymerizable compound.

<«Compound Having Ethylenic Unsaturated Bond»>

The group having an ethylenic unsaturated bond is preferably stylyl group, vinyl group, (meth)acryloyl group or (meth)allyl group. (Meth)acryloyl group is more preferable.

The compound having an ethylenic unsaturated bond is exemplified by unsaturated carboxylic acid (e.g. acrylic acid, methacrylic acid, itaconic acid, crotonic acid, isocrotonic acid, maleic acid), esters and amides of these compounds, and multimers of these compounds. More preferred examples include esters formed between unsaturated carboxylic acid and polyhydric alcohol compound; amides formed between unsaturated carboxylic acid and multivalent amine compound; and multimers of these compounds. Other preferred examples include adducts formed unsaturated. carboxylic acid esters or amides having nucleophilic substituent such as hydroxy group, amino group, and mercapto group, and monofunctional or polyfunctional isocyanates or epoxy, or dehydration condensation product formed the carboxylic acid esters or amides having nucleophilic substituent with monofunctional or polyfunctional carboxylic acids. Other preferred example relates to adducts formed between unsaturated carboxylic acid esters or amides having electrophilic substituent such as isocyanate group or epoxy group, with monohydric or polyhydric alcohols, amines or thiols. Still other preferred example relates to substituted product formed between unsaturated carboxylic acid esters or amides having eliminable substituent such as halogen group and tosyloxy group, with monohydric or polyhydric alcohols, amines or thiols. Other preferred example relates to adducts formed between unsaturated carboxylic acid esters or amides having electrophilic substituent such as isocyanate group or epoxy group, with monohydric or polyhydric alcohols, amines or thiols. Still other preferred example relates to substituted product formed between unsaturated carboxylic acid esters or amides having eliminable group such as halogen group and tosyloxy group, with monohydric or polyhydric alcohols, amines or thiols. As still other examples, also employable are a series of compounds in which the above-described unsaturated carboxylic acid is replaced by unsaturated phosphoric acid, vinylbenzene derivative such as styrene, vinyl ether, or allyl ether.

Specific examples of monomers of the ester formed between polyhydric alcohol compound and unsaturated carboxylic acid include acrylate esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, dipentaerythritol diacrylate, dipentaerythritol hexaacrylate, pentaerythritol tetraacrylate, sorbitol triacrylate, sorbitol tetraacrylate, sorbitol pentaacrylate, sorbitol hexaacrylate, tris (acryloyloxyethyl)isocyanurate,tris (ethylene oxide-modified acryl) isocyanurate, and polyester acrylate oligomer.

The methacrylate ester is exemplified by tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl]dimethylmethane, and bis [p-(methacryl oxyethoxy) phenyl]dimethylmethane.

The itaconate ester is exemplified by ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

The crotonate ester is exemplified by ethylene glycol dicrotonate, tetramethylene glycol dicrotonate, pentaerythritol dicrotonate, and sorbitol tetradicrotonate.

The isocrotonate ester is exemplified by ethylene glycol diisocrotonate, pentaerythritol diisocrotonate, and sorbitol tetraisocrotonate.

The maleate ester is exemplified by ethylene glycol dimaleate, triethylene glycol dimaleate, pentaerythritol dimaleate, and sorbitol tetramaleate.

Compounds preferably used for the other esters also include aliphatic alcohol-based esters described in JP-B2-S46-27926, JP-82-851-47334 and JP-A-857-196231; those having an aromatic skeleton described in JP-A-S59-5240, JP-A-859-5241 and JP-A-H02-226149; and those containing an amino group described in JP-A-H01-165613.

Specific examples of the amide-based monomer formed between multivalent amine compound and unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Other preferable amide-based monomers are exemplified by those having a cyclohexylene structure, described in JP-B2-554-21726.

Also urethane-based addition-polymerizable monomers, obtainable by addition reaction between isocyanate and hydroxy group, are preferable. Specific examples include vinyl urethane compound having two or more polymerizable vinyl groups per molecule, which is obtained by subjecting a polyisocyanate compound having two or more isocyanate groups per molecule, described in JP-B2-S48-41708, to an addition reaction with a hydroxy group-containing vinyl monomer given by the formula below:

CH$_2$=C (R$^4$)COOCH$_2$CH (R$^5$)OH (where, each of R$^4$ and R$^5$ represents H or CH$_3$.)

Other preferred examples include urethane acrylates described in JP-A-S51-37193, JP-B2-H02-32293 and JP-52-H02-16765; and urethane compounds having an ethylene oxide-based skeleton described in JP-B2-S58-49860, JP-B2-S56-17654, JP-52-S62-39417 and JP-B2-S62-39418.

For the compound having ethylenic unsaturated bond, compounds described in paragraphs [0095] to [0108] of JP-A-2009-288705 are suitably used also in this invention.

For the compound having ethylenic unsaturated bond, also those having a boiling point of 100° C. or above under normal pressure are preferable. Examples of them include monofunctional acrylates and methacrylates such as polyethylene glycol mono(meth)acrylate, polypropylene glycol mono(meth)acrylate and phenoxy ethyl(meth)acrylate; compounds obtained by adding ethylene oxide or propylene oxide to polyhydric alcohol such as glycerin and trimethylolethane, and then by converting the products into (meth) acrylate, such as polyethylene glycol di(meth)acrylate, trimethylolethane tri(meth)acrylate, neopentyl glycol di(meth) acrylate, pentaerythritol tri(meth)acrylate, pentaerythritol tetra(meth)acrylate, dipentaerythritol penta(meth)acrylate, dipentaerythritol hexa(meth)acrylate, hexanediol(meth) acrylate, trimethylolpropanetri(acryloyloxypropyl) ether and tri (acryloyloxyethyl) isocyanurate; urethane (meth) acrylates described in JP-52-S48-41708, JP-B2-S50-6034 and JP-A-S51-37193; polyester acrylates described in JP-A-S48-64183, JP-B2-S49-43191 and JP-B2-S52-30490; polyfunctional acrylates and methacrylates, such as epoxy acrylates produced by reaction between epoxy resin and (meth) acrylic acid; and mixtures of these compounds. Also compounds described in paragraphs [0254] to [0257] of JP-A-2008-292970 are preferable. Also exemplified are polyfunctional (meth)acrylates obtained by allowing polyfunctional carboxylic acid to react with a compound having a cyclic ether group and an ethylenic unsaturated group, such as glycidyl (meth)acrylate.

Other preferable compound having ethylenic unsaturated bond are exemplified by compound having a fluorene ring, and two or more ethylenic unsaturated bond-containing groups, and cardo resin, described in JP-A-2010-160418, JP-A-2010-129825 and JB-B2-4364216.

Still other examples include specific unsaturated compounds described in JP-B2-S46-43946, JP-B2-H01-40337 and 3⁻P-52-H01-40336; and vinylphosphonic acid-based compounds described in JP-A-H02-25493. In some cases, a structure containing pert luoroalkyl group described in JP-A-S61-22048 is suitably used. Also those introduced as photo-polymerizable monomers and oligomers in Journal of the Adhesion Society of Japan, Vol. 20, No. 7, pp. 300 to 308 (1984) are usable.

Besides those described above, also compounds having ethylenic unsaturated bond, represented by Formulae (MO-1) to (MO-5) below, are suitably used. Note that, when T in Formulae represents an oxyalkylene group, the carbon terminal combines to R.

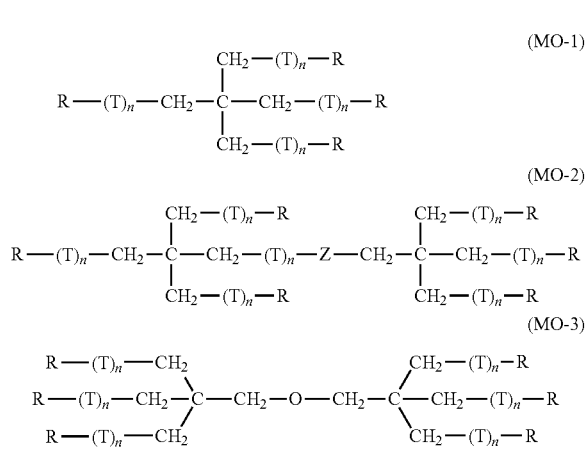

-continued

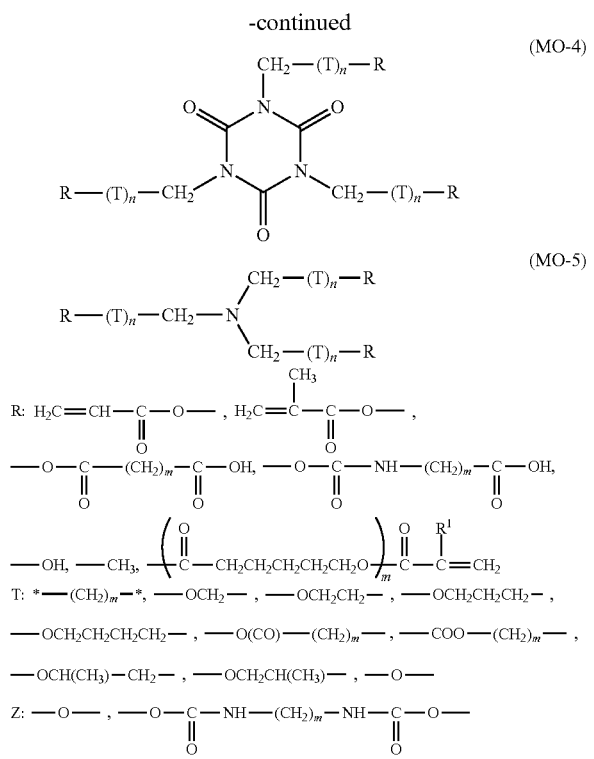

In the formulae, n represents an integer of 0 to 14, and m represents an integer of 0 to 8. A plurality of (R)s and (T)s contained within a molecule may be same or different.

In each of the polymerizable compounds represented by Formulae (MO-1) to (MO-5) above, at least one of a plurality of (R)s represents a group given by —OC(=O)CH=CH$_2$ or —OC(=O)C(CH$_3$)=CH$_2$.

For the compounds having ethylenic unsaturated bond, represented by Formulae (MO-1) to (MO-5) above, those described in paragraphs [0248] to [0251] of JP-A-2007-269779 are suitably used also in this invention.

Also compounds obtained by adding ethylene oxide or propylene oxide to polyhydric alcohol and then esterified into (meth)acrylate, which have been described in JP-A-H10-52986 under Formulae (1) and (2), together with specific examples thereof are employable as the polymerizable compound.

Also compounds described in paragraphs [0104] to [0131] of JP-A-2015-187211 are employable, the content of which is incorporated into this specification. In particular, the compounds described in paragraphs [0128] to [0130] of the same publication are exemplified as the preferable embodiments.

The compound having ethylenic unsaturated bond is preferably dipentaerythritol triacrylate (commercially available as Kayarad D-330; from Nippon Kayaku Co., Ltd.), dipentaerythritol tetraacrylate (commercially available as Kayarad D-320; from Nippon Kayaku Co., Ltd.), dipentaerythritol penta(meth)acrylate (commercially available as Kayarad D-310; from Nippon Kayaku Co., Ltd.), dipentaerythritol hexa(meth)acrylate (commercially available as Kayarad DPHA; from Nippon Kayaku Co., Ltd.), and those having structures composed of their (meth)acryloyl groups bound while placing an ethylene glycol or propylene glycol residue in between. Also oligomers of these compounds may be used.

Also pentaerythritol derivative and/or dipentaerythritol derivative of the compounds represented by Formula (MO-1) and Formula (MO-2) are exemplified as preferred examples.

Commercially available polymerizable compounds are exemplified by tetrafunctional acrylate SR-494, having 4 ethylenoxy groups, from Sartomer Inc.; hexafunctional acrylate DPCA-60 having 6 pentylenoxy chains, and trifunctional acrylate TPA-330 having 3 isobutylenoxy chains, both from Nippon Kayaku Co., Ltd.; urethane oligomer DAS-10, UAB -140 (from Sanyo-Kokusaku Pulp Co., Ltd.); NK Ester M-40G, NK Ester 4G, NE Ester M-9300, NE Ester A-9300, DA-7200 (from Shin-Nakamura Chemical Co., Ltd.); DPHA-40H (from Nippon Kayaku Co., Ltd,); UA-306H, UA-306T, UA-306I, AH-600, T-600, AI -600 (from Kyoeisha Chemical Co., Ltd.); and Blemmer PME400 (from NOF Corporation).

For the compound having ethylenic unsaturated bond, also preferable are urethane acrylates described in JP-B2-S48-41708, JP-A-S51-37193, JP-B2-H02-32293 and JP-B2-H02-16765; and urethane compounds having ethylene oxide based skeleton, described in JP-B2-S58-49860, JP-B2-S56-17654, JP-B2-S62-39417 and JP-B2-S62-39418. Also addition-polymerizable monomers having amino structure or sulfido structure within the molecule, described in JP-A-S63-277653, JP-A-S63-260909 and JP-A-H01-105238, may be used as the polymerizable compound.

The compound having ethylenic unsaturated bond may be a polyfunctional monomer having acidic group such as carboxy group, sulfonic acid group or phosphoric acid group. The polyfunctional monomer having acidic group is preferably ester formed between aliphatic polyhydroxy compound and unsaturated carboxylic acid; more preferably polyfunctional monomer whose acidic group is produced by allowing unreacted hydroxy group of aliphatic polyhydroxy compound to react with non-aromatic carboxylic anhydride; and particularly such ester obtained by using pentaerythritol and/or dipentaerythritol as the aliphatic polyhydroxy compound. Commercially available products are exemplified by polybasic acid-modified acryloligomers M-510, M-520, from Toagosei Co., Ltd.

Only one species of the polyfunctional monomer having acidic group may be used independently, or two or more species thereof may be used as a mixture. If necessary, acidic group-free polyfunctional monomer and acidic group-containing polyfunctional monomer may be used in combination.

The polyfunctional monomer having acidic group preferably has an acid value of 0.1 to 40 mgKOH/g, which is more preferably 5 to 30 mgKOH/g. With the acid value of the polyfunctional monomer controlled within these ranges, the resin will have good productivity and handleability, and will excel in development Also the polymerizability will be good.

Such polymerizable compounds having caprolactone structure have been marketed by Nippon Kayaku Co., Ltd. under the trade name of Kayarad DPCA Series, which are exemplified by DPCA-20 (m=1 in Formulae (C) to (E), number of groups represented by Formula (D)=2, all (R$^1$)s represent hydrogen atom); DPCA-30 (m=1 in the same Formulae, number of groups represented by Formula (D)=3, all (R$^1$)s represent hydrogen atom); DPCA-60 (m=1 in the same Formulae, number of groups represented by Formula (D)=6, all (R$^1$)s represent hydrogen atom); and DPCA-120 (m=2 in the same Formulae, number of groups represented by Formula (D)=6, all (R$^1$)s represent hydrogen atom).

In this invention, the compound having a caprolactone structure and an ethylenic unsaturated bond may be used independently, or two or more species thereof may be used as a mixture.

The content of the compound having ethylenic unsaturated bond in the composition is preferably 1 to 50% by mass relative to the total solid content of the composition, in view of achieving good polymerizability and high heat resistance. The lower limit is more preferably 5% by mass or above, The upper limit is more preferably 30% by mass or below. Only one species of the compound having ethylenic unsaturated bond may be used independently, or two or more species may be used in a mixed manner.

Ratio by mass of the polyimide precursor, etc. and the compound having ethylenic unsaturated bond (polyimide precursor, etc./polymerizable compound) is preferably 98/2 to 10/90, more preferably 95/5 to 30/70, and most preferably 90/10 to 50/50. With the ratio by mass of the polyimide precursor, etc. and the compound having ethylenic unsaturated bond controlled within these ranges, the cured film that further excels in polymerizability and heat resistance will be formed.

<<«Compound Having Hydroxymethyl Group, Alkoxy Methyl Group or Acyloxymethyl Group»>

The compound having a hydroxymethyl group, alkoxy methyl group or acyloxymethyl group is preferably represented by Formula (AM1) below.

(AM1)

(In Formula, t represents an integer of 1 to 20, $R^4$ represents a t-valent organic group having 1 to 200 carbon atoms, and $R^5$ represents a group represented by Formula (AM2) or Formula (AM3) below.)

Formula (AM2)

Formula (AM3)

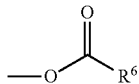

(In Formulae, $R^6$ represents a hydroxy group or an organic group having 1 to 10 carbon atoms.)

The content of the compound represented by Formula (AM1), per 100 parts by mass of the polyimide precursor, etc., is preferably 5 parts by mass or more, and 40 parts by mass or less. It is more preferably 10 parts by mass or more, and 35 parts by mass or less. It is also preferable that the content of the compound represented by Formula (AM4) below is 10% by mass or more and 90% by mass or less of the total polymerizable compound, and that the content of the compound represented by Formula (ANS) below is 10% by mass or more and 90% by mass or less of the total thermal crosslinking agent.

(AM4)

(In Formula, $R^4$ represents a divalent organic group having 1 to 200 carbon atoms, and $R^5$ represents a group represented by Formula (AM2) or Formula (M3) below.)

(AM5)

(In Formula, u represents an integer of 3 to 8, $R^4$ represents a u-valent organic group having 1 to 200 carbon atoms, and $R^5$ represents a group represented by Formula (AM2) or Formula (AM3) below.)

Formula (AM2)

Formula (AM3)

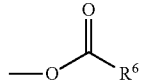

(In Formula, $R^6$ represents a hydroxy group or organic group having 1 to 10 carbon atoms.)

Within these ranges, the composition will be less likely to crack when cured on a substrate with irregular surface, will show good patternability, and will show high heat resistance featured by a 5% mass reduction. temperature of 350° C. or above, and more preferably 380° C. or above. Specific examples of the compounds represented by Formula (AM4) include 46DMOC, 46DMOEP (trade names, both from Asahi Yukizai Corporation); DML-MBPC, DML-MBOC, DML-OCHP, DML-PCHP, DML-PC, DML-PTBP, DML-34X, DML-EP, DML-POP, dimethylol BisOC-P, DML-PFP, DML-PSEP, DML-MTrisPC (trade names, all from Honshu Chemical industry Co., Ltd.); Nikalac MX-290 (trade name, from Sanwa Chemical Co., Ltd.); and 2,6-dimethoxymethyl-4-t-butylphenol, 2,6-dimethoxymethyl-p-cresol, and 2,6-di-acetoxymethyl-p-cresol.

Specific examples of the compounds represented by Formula (AM5) include TriML-P, TriML-35XL, TML-HQ, TML-BP, TML-pp-BPF, TML-BPA, TMOM-BP, HNL-TP-PHBA, HML-TPHAP, HMOM-TPPHBA, HMOM-TPHAP (trade names, all from Honshu Chemical Industry Co., Ltd.); TM-BIP-A (trade name, from Asahi Yukizai Corporation); and Nikalac MX-280, Nikalac MX-270, Nikalac MW-100LM (trade names, all from Sanwa Chemical Co., Ltd.).

<<«Epoxy Compound (Compound Having Epoxy Group)»>

The epoxy compound preferably has two or more epoxy groups per molecule. The epoxy group can crosslink at 200° C. or below without accompanied by dehydration, so that the film thereof is less likely to shrink. Hence, by containing the epoxy compound, the composition will now be able to cure at lower temperatures and will effectively be suppressed from warping.

The epoxy compound preferably contains a polyethylene oxide group. This advantageously lowers the elastic modulus, and reduces the warp. The high flexibility also contributes to yield the cured film with good elongation. The polyethylene oxide group means a group having two or more ethylene oxide repeating units, where the number of repeating unit is preferably 2 to 15.

The epoxy compound is exemplified by, but not limited to, bisphenol A epoxy resin; bisphenol F epoxy resin; alkylene glycol epoxy resin such as propylene glycol diglycidyl ether; podyalkyleneglycol epoxy resin such as polypropylene glycol diglycidyl ether; and epoxy group-containing silicone such as polymethyl (glycidyloxypropyl) siloxane. Specific examples include Epiclon (registered trademark) 850-S, Epiclon (registered trademark) HP-4032, Epiclon (registered trademark) HP-7200, Epiclon (registered trademark) HP-820, Epiclon (registered trademark) EIP-4700, Epiclon (registered trademark) EXA-4710, Epiclon (registered trademark) HP-4770, Epiclon (registered trademark) EXA-859CRP, Epiclon (registered trademark) EXA-1514, Epiclon (registered trademark) EXA-4880, Epiclon (registered trademark) EXA-4850-150, Epiclon EXA-4850-1000, Epiclon (registered trademark) EXA-4816, Epiclon (registered trademark) EXA-4822 (trade names, all from DIC Corporation); Rikaresin (registered trademark) BEO-60E (trade name, from New Japan Chemical Co., Ltd.); and EP-4003S, EP-4000S (trade names, both from ADEKA Corporation). Among them, epoxy resin containing polyethylene oxide group is preferable, in view of achieving good polymerizability and high heat resistance. Epiclon (registered trademark) EXA-4880, Epicion (registered trademark) EXA-4822, and Rikaresin (registered trademark) BEO-60E, containing the polyethylene oxide group, are preferable.

The amount of blending of the epoxy compound, per 100 parts by mass of the polyimide precursor, etc., is preferably 5 to 50 parts by mass, more preferably 10 to 50 parts by mass, and even more preferably 10 to 40 parts by mass. With the amount of blending controlled to 5 parts by mass or more, the cured film will be prevented from warping, meanwhile with the amount controlled to 50 parts by mass or less, the resin when cured is prevented from burying the pattern caused by reflowing.

<<«Oxetane Compound (Compound Having Oxetanyl Group)»>>

The oxetane compound is exemplified by compound having two or more oxetane rings per molecule, 3-ethyl-3-hydroxymethyloxetane, 1,4-bis{[(3-ethyl-3-oxetanyl)methoxy]methyl}benzene, 3-ethyl-3-(2-ethylhexyl methyl)oxetane, and bis[(3-ethyl-3-oxetanyl)methyl] 1,4-benzenedicarboxylate. As a specific example, Aron Oxetane Series (e.g. OXT-121, OXT-221, OXT-191, OXT-223) from Toagosei Co., Ltd. is suitably used. Only a single species of them may be used independently, or two or more species may be used in combination.

The amount of blending of the oxetane compound is preferably 5 to 50 parts by mass, per 100 parts by mass of the polyimide precursor, etc., which is more preferably 10 to 50 parts by mass, and even more preferably 10 to 40 parts by mass.

<<«Benzoxazine Compound (Compound Having Benzooxazolyl Group)»>>

The benzoxazine compound is preferred since it can crosslink based on ring-opening addition reaction without causing degassing when cured, and since it is suppressed from warping by virtue of its small thermal shrinkage.

Preferred examples of the benzoxazine compound include B-a-type benzoxazine, B-m-type benzoxazine (trade names, all from Shikoku Chemicals Corporation), benzoxazine adduct of polyhydroxystyrene resin, and phenol novolac-type dihydrobenzoxazine compound. Only a single species of them may be used independently, or two or more species may be used in combination.

The amount of blending of the benzoxazine compound is preferably 5 to 50 parts by mass per 100 parts by mass of the polyimide precursor, etc., more preferably 10 to 50 parts by mass, and even more preferably 10 to 40 parts by mass.

«Photo-Polymerization Initiator»

The composition of this invention may contain a photo-polymerization initiator. In particular, with the photo radical polymerization initiator contained therein, the composition after applied on a semiconductor wafer and formed into a layer, and irradiated by light, can cure with the aid of radical, and can reduce the solubility in the photo-irradiated area. Hence, for example by irradiating such composition layer with light through a photomask having a pattern for masking an electrode portion only, there will be an advantage of easily producing areas with different solubilities according to the electrode pattern.

The photo-polymerization initiator is not specifically limited, so long as it has an ability to initiate polymerization (crosslinking) of the polymerizable compound upon irradiation by light, and is suitably selectable from known photo-polymerization initiators. For example, those showing photosensitivity to light over the ultraviolet to visible light regions are preferable. Alternatively, also employable is an activator that causes some interaction with a photo-excited sensitizer to produce an active radical.

The photo-polymerization initiator preferably contains at least one species of compound having a molar absorption coefficient of approximately 50, within the range from approximately 300 to 800 nm (preferably from 330 to 500 nm). The molar absorption coefficient of the compound may be determined by using any known method. More specifically, it is preferably measured using, for example, a UV-visible spectrophotometer (Cary-5 spectrophotometer, from Varian Associates), in ethyl acetate as a solvent, at a concentration of 0.01 g/L.

The photo-polymerization initiator may be any of known ones without special limitation. Examples include halogenated hydrocarbon derivative (e.g. those having a triazine skeleton, those having an oxadiazole skeleton, and those having a trihalomethyl group), acylphosphine compound such as acylphosphine oxide, hexaaryibiimidazole, oxime compound such as oxime derivatives, organic peroxide, thio compound, ketone compound, aromatic onium salt, ketoxime ether, aminoacetophenone compound, hydroxyacetophenone, azo-based compound, azide compound, metallocene compound, organoboron compound, and iron-arene complex. And, oxime compound and metallocene compound are preferable.

The halogenated hydrocarbon derivative having a triazine skeleton is exemplified by compounds described by Wakabayashi et al., *Bull. Chem. Soc.* Japan, 42, 2924 (1969); compounds described in British Patent No. 1388492; compounds described in JP-A-S53-133428; compounds described in German Patent No. 3337024; compounds described by F. C. Schaefer et al., *J. Org. Chem.* 29, 1527 (1964); compounds described in JP-A-562-58241; compounds described in JP-A-H05-281728; compound described in JP-A-H05-34920, and compounds described in U.S. Pat. No. 4,212,976.

The compounds described in U.S. Pat. No. 4,212,976 are exemplified by those having an oxadiazole skeleton (e.g. 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl -5-phenyl -1,3,4 oxadiazole, 2-tribromomethyl-5-(2-naphthyl)-1,3,4-oxadiazole, 2-trichloromethyl-5-styly1-1,3,4-oxadiazole, 2-trichloromethyl-5-(4-chlorostylyl)-1,3,4-oxadiazole, 2-trichloromethyl-5-(4-methoxystylyl)-1,3,4-oxadiazole, 2-trichloromethyl-5-(4-n-butoxystylyl)-1,3,4-oxadiazole, and 2-tribromomethyl-5-styly1-1,3,4-oxadiazole).

Photo-polymerization initiators other than those described above include compounds described in paragraph [0086] of JP-A-2015-087611, and compounds described in JP-A-S53-133428, JP-B2-S57-1819, ditto 57-6096, and U.S. Pat. No. 3,615,455, the contents of which are incorporated into this specification.

Photo-polymerization initiators other than those described above include compounds described in paragraph [0086] of JP-A-2015-087611, and compounds described in JP-A-S53-133428, JP-B2-S57-1819, ditto 57-6096, and U.S. Pat. No. 3,615,455, the contents of which are incorporated into thio specification.

Among commercially available products, also Kayacure DETX (from Nippon Kayaku Co., Ltd.) is preferably used.

For the photo-polymerization initiator, employable are hydroxyacetophenone compound, aminoacetophenone compound, and acylphosphine compound. More specifically, also aminoacetophenone-based initiator described in JP-A-H10-291969, and acylphosphine oxide-based initiator described in JP-B2-4225898 may be used.

For the hydroxyacetophenone-based initiator, employable are Irgacure-184 (Irgacure is a registered trademark), Darocur-1173, irgacure-500, lrgacure-2959 and Irgacure-127 (trade names: all from BASF SE).

For the aminoacetophenone-based initiator, employable are commercially available Irgacure-907, Irgacure-369, and Irgacure-379 (trade names: all from BASF SE).

For the aminoacetophenone-based initiator, also employable are compounds described in JP-A-2009-191179, whose maximum absorption wavelengths are matched to 365 nm or 405 nm.

The acylphosphine-based initiator is exemplified by 2,4,6-trimethylbenzoyl-diphenyl-phosphine oxide. Commercially available Irgacure-819 and Irgacure-TPO (trade name: both from BASF SE) are usable.

The photo-polymerization initiator is more preferably exemplified by oxime compound. By using the oxime compound, it now possible to effectively improve the exposure latitude. Specific examples of the oxime compound employed here include compounds described in JP-A-2001-233842, compounds described in JP-A-2000-80068, and compounds described in JP-A-2006-342166.

Preferred oxime compound is exemplified by compounds listed below, 3-benzooxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluenesulfonyloxy)iminobutane-2-one, 2-ethoxycarbonyloxyimino-1-phenylpropane-1-one, 1-phenyl-1,2-butanedione-2-(O-methoxycarbonyl)oxime, 1-phenyl-1,2-butanedione-2-(O-ethoxycarbonyl)oxime, 1-phenyl-1,2-propanedione-2-(O-methoxycarbonyl)oxime, 1-phenyl-1,2-propanedione-2-(O-ethoxycarbonyl)oxime, 1-phenyl-1,2-propanedione-2-(O-benzoyl)oxime, 1,3-diphenylpropanetrione-2-(O-ethoxycarbonyl)oxime, and 1-phenyl-3-ethoxyprocanetrione-2-(O-benzoyl)oxime.

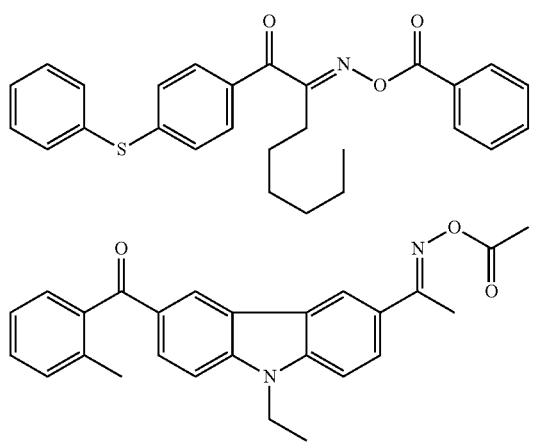

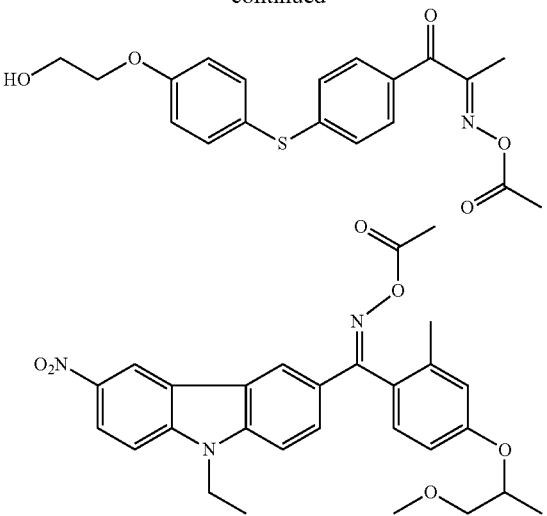

The oxime compound is exemplified by compounds described in literatures including J. Chem. Soc., Perkin trans. II (1979) pp. 1653-1660, J. Chem. Soc., Perkin trans. II (1979) pp. 156-162, and Journal of Photopolymer Science and Technology (1995) pp. 202-232; and, compounds described in patent publications including JP-A-2000-66385, JP-A-2000-80068, JP-A-2004-534797, JP-A-2006-342166, and WO2015/036910A1.

Among commercially available products, also Irgacure OXE-01 (from BASF SE) irgacure OXE-02 (from BASF SE), and N-1919 (from ADEKA Corporation) are suitably used. Also TR-PI-3G-304 (from Changzhou Tronly New Electronic Materials Co., Ltd.), Adeka Arkls NCI-831 and Adeka Ards NCI-930 (from ADEKA Corporation) are employable. Also TR-PBG-304 (from Changzhou Tronly New Electronic Materials Co., Ltd.) Adeka Arkls NCI-831 and Adeka Arkls NCI-930 (from ADEKA Corporation) are employable. Also DFI-091 (from Daito Chemix Co., Ltd.) is employable.

Other employable compounds includes those having oxime bound to the N-position of carbazole as described in JP-A-2009-519904; compounds having a hetero substituent introduced to the benzophenone moiety as described in U.S. Pat. No. 7,626,957; compounds having a nitro group introduced into the dye moiety, described in JP-A-2010-15025 and United States Unexamined Patent Application Publication No. 2009-292039; ketoxime compounds described in WO2009/131189; compounds having a triazine skeleton and an oxime skeleton in the same molecule, described in U.S. Pat. No. 7,556,910; and compounds highly sensitive to g-line sources with the maximum absorption at 405 nm, described in JP-A-2009-221114.

Also cyclic oxime compounds described in JP-A-2007-231000 and JP-A-2007-322744 are suitably used.

Among the cyclic oxime compounds condensed with a carbazole dye, those described in JP-A-2010-32985 and JP-A-2010-185072 are particularly preferable in view of their high absorbance and potential for sensitization.

Also compounds having an unsaturated bond at a specific moiety of oxime compound, described in JP-A-2009-242469, are suitably used.

Also fluorine-containing oxime compounds may be used. Examples of such oxime compounds include those described in JP-A-2010-262028; compounds 24, 36 to 40 described in paragraph [0345] of JP-A-2014-500852; and compound (C-3) described in paragraph [0101] of JP-A-2013-164471. Some specific examples are shown below.

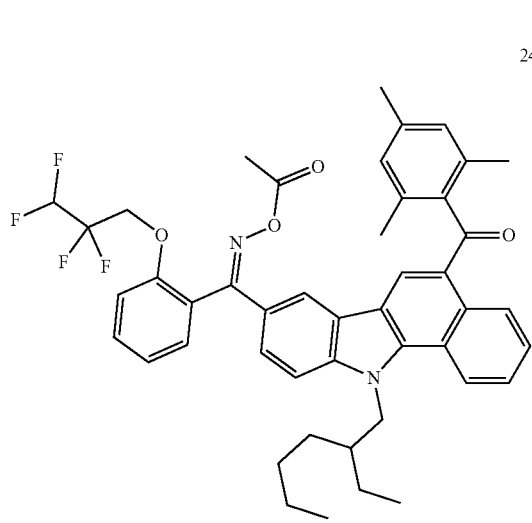

24

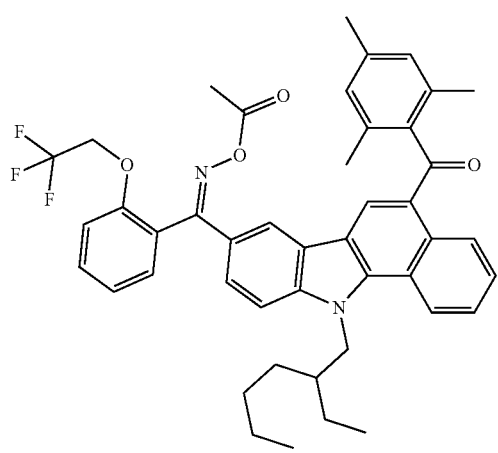

36

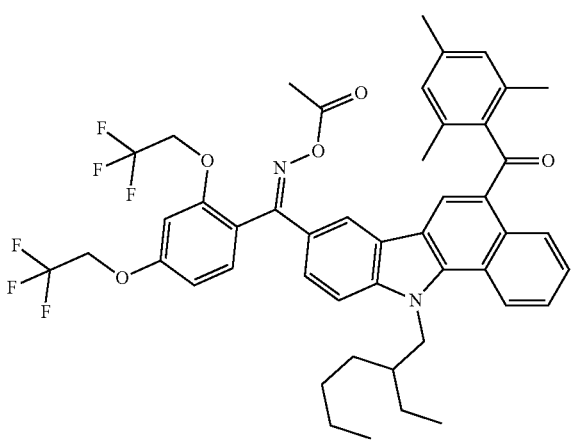

37

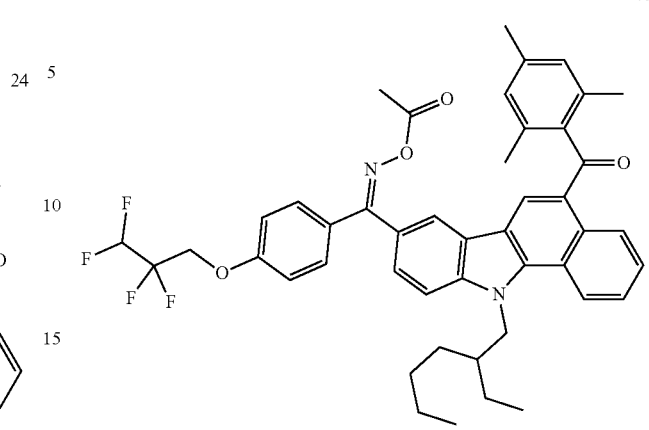

40

Most preferable oxime compounds are exemplified by those having specific substituents, described in JP-A-2007-26977; and oxime compounds having a thioaryl group, described in JP-A-2009-191061.

From the viewpoint of exposure sensitivity, the photo-polymerization initiator is preferably selected from the group consisting of trihalomethyltriazine compound, benzyl dimethyl ketal compound, α-hydroxyketone compound, α-aminoketone compound, acylphosphine compound, phosphine oxide compound, metallocene compound, oxime compound, triaryl imidazole dimer, onium salt compound, benzothiazole compound, benzophenone compound, acetophenone compound and derivative thereof, cyclopentadiene-benzene-iron complex and salt thereof, halomethyloxadiazole compound, and 3-aryl-substituted coumarin compound.

The photo-polymerization initiator is more preferably selected from the group consisting of trihalomethyltriazine compound, α-amninoketone compound, acylphosphine compound, phosphine oxide compound, metallocene compound, oxime compound, triarylimidazole dimer, onium salt compound, benzophenone compound and acetophenone compound; even more preferably at least one compound selected from the group consisting of trihalomethyltriazine compound, α-aminoketone compound, metallocene compound, oxime compound, triarylimidazole dimer and benzophenone compound; and yet more preferably metallocene compound or oxime compound. Oxime compound is particularly preferable.

The photo-polymerization initiators again employable herein include benzophenone; N,N'-tetraalkyl-4,4'-diaminobenzophenones such as N,N'-tetramethyl-4,4-diaminobenzophenone (Michler's ketone); aromatic ketones such as 2-benzyl-2-dimethylamino-1-(4-morpholinophenyl)-butanone-1,2-methyl-1-[4-(methylthio)phenyl]-2-morpholpropanone-1; quinones condensed with an aromatic ring such as alkylanthraquinone; benzoin ether compounds such as benzoin alkyl ether; benzoin compounds such as benzoin and alkylbenzoin; and benzyl derivatives such as benzyl dimethyl ketal. Also a compound represented by Formula (I) below is employable.

Formula (I)

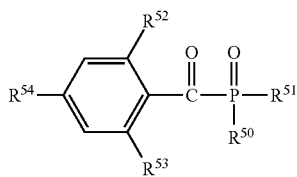

In Formula (I), $R^{50}$ represents an alkyl group having 1 to 20 carbon atoms; an alkyl group having 2 to 20 carbon atoms, discontinued by one or more oxygen atoms; alkoxy group having 1 to 12 carbon atoms; phenyl group; phenyl group substituted by at least one of alkyl group having 1 to 20 carbon atoms, alkoxy group having 1 to 12 carbon atoms, halogen atom, cyclopentyl group, cyclohexyl group, alkenyl group having 2 to 12 carbon atoms, alkyl group having 2 to 18 carbon atoms discontinued by one or more oxygen atoms, or alkyl group having 1 to 4 carbon atoms; or biphenylyl, $R^{51}$ represents a group represented by Formula (II) or a group same as $R^{50}$, and each of $R^{52}$ to $R^{54}$ independently represents an alkyl group having 1 to 12 carbon atoms, an alkoxy group having 1 to 12 carbon atoms, or a halogen atom.

Formula (II)

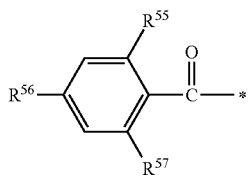

In the formula, $R^{55}$ to $R^{57}$ are the same as $R^{52}$ to $R^{54}$ in Formula (I).

For the photo-polymerization initiator, also the compounds described in paragraphs [0048] to [0055] of WO2015/125469 may be used.

The metallocene compound may be anything so long as it can release an active radical upon photo-irradiation. Examples include titanocene compounds described in JP-A-S59-152396, JP-A-S61-151197, JP-A-S63-41484, JP-A-H02-249, JP-A-H02-291 and JP-A-H02-4705; and, iron-areae complex described in JP-A-H01-304453 and, JP-A-H01-152109. The metallocene compound is preferably titanocene compound.

Specific examples of the titanocene compound include bis(cyclopentadienyl)-Ti-dichloride, bis(cyclopentadienyl)-Ti-bisphenyl, bis(cyclopentadienyl)-Ti-bis(2,3,4,5,6-pentafluorophenyl), bis(cyclopentadienyl)-Ti-bis(2,3,5,6-tetrafluorophenyl), bis(cyclopentadienyl)-Ti-bis(2,4,6-trifluorophenyl), bis(cyclopentadienyl)-Ti-bis(2,6-difluorophenyl), bis(cyclopentadienyl)-Ti-bis(2,4-difluorophenyl), bis(methylcyclopentadienyl)-Ti-bis(2,3,4,5,6-pentafluorophenyl), bis(methylcyclopentadienyl)-Ti-bis(2,3,5,6-tetrafluorophenyl), bis(methylcyclopentadienyl)-Ti-bis(2,6-difluorophenyl), bis(cyclopentadienyl)-bis(2,6-difluoro-3-(pyr-1-yl)phenyl) titanium, bis(cyclopentadienyl)-bis(2,4,6-trifluoro-3-(pyr-1-yl)phenyl) titanium, and bis(cyclopentadienyl)-bis(2,4,6-trifluoro-3-(2-5-dimethylpyr-1-yl)phenyl) titanium. Bis(cyclopentadienyl)-bis(2,6-difluoro-3-(pyr-1-yl)phenyl) titanium is preferable.

Specific examples of the metallocene compound include bis(cyclopentadienyl)bis[2,6-difluoro-3-(methylsulfonamide)phenyl] titanium, bis(cyclopentadienyl)bis[2,6-difluoro-3-(N-butyibialloylamino)phenyl] titanium, bis(cyclopentadienyl)bis[2,6-difluoro-3-(N-butyl-(4-chlorobenzoyl)amino)phenyl] titanium, bis(cyclopentadienyl)bis[2,6-difluoro-3-(N-benzyl-2,2-dimethylpentanoylamino)phenyl] titanium, bis(cyclopentadienyl)bis[2,6-difluoro-3-(N-(2-ethylhexyl)-4-tolyl-sulfonylamino)phenyl] titanium, bis(cyclopentadienyl)bis[2,6-difluoro-3-(N-(3-oxaheptyl)benzoylamino)phenyl] titanium, bis(cyclopentadienyl)bis[2,6-difluoro-3-(N-(3,6-dioxadecyl)benzoylamino)phenyl] titanium, bis(cyclopentadienyl)bis[2,6-difluoro-3-(trifluoromethylsulfonylamino)phenyl] titanium, and bis(cyclopentadienyl)bis[2,6-difluoro-3-(trifluoroacetylamino)phenyl] titanium, bis(cyclopentadienyl)bis[2,6-difluoro-3-(2-chlorobenzoyl)aminophenyl] titanium, bis(cyclopentadienyl)bis[2,6-difluoro-3-(4-chlorobenzoylamino)phenyl] titanium, bis(cyclopentadienyl)bis[2,6-difluoro-3-(N-(3,6-dioxadecyl)-2,2-dimethylpentanoylamino)phenyl] titanium, bis(cyclopentadienyl)bis[2,6-difluoro-3-(N-(3,7-dimethyl-7-methoxyoctyl)benzoylamino)phenyl] titanium, and bis(cyclopentadienyl)bis[2,6-difluoro-3-(N-cyclohexylbenzoylamino) phenyl] titanium.

Commercially available products may be used for the metallocene compound. For example, Irgacure-727 (from BASE SE) is available as bis(methylcyclopentadienyl)-Ti-bis(2,6-difluorophenyl), and Iraacure-784 (from BASF SE) is available as bis(cyclopentadianyl)-bis(2,6-difluoro-3-(pyr-1-yl)phenyl) titanium.

The content of the photo-polymerization initiator, when contained in the composition, is preferably 0.1 to 30% by mass of the total solid content of the composition, more preferably 0.1 to 20% by mass, and even more preferably 0.1 to 10% by mass.

Only a single species, or two or more species of the photo-polymerization initiator may be used. When two or more species of the photo-polymerization initiators are used, the total content preferably falls within the above-described ranges <Migration Inhibitor>

The photosensitive resin composition used in this invention further preferably contains a migration inhibitor. With the migration inhibitor contained therein, the photosensitive resin composition will now be able to effectively block intrusion of metal ions migrated from the metal layer (metal interconnect).

The migration inhibitor is exemplified by, but not specifically limited to, compounds having heterocycle (pyrrole ring, furan ring, thiophene ring, imidazole ring, oxazole ring, thiazole ring, pyrazole ring, isoxazole ring, isothiazole ring, tetrazole ring, triazole ring, pyridine ring, pyridazine ring, pyrimidine ring, pyrazine ring, piperidine ring, piperazine ring, morpholine ring, 2H-pyran ring and 6H-pyran ring, triazine ring); compounds having thioureas and mercapto group; hindered phenol-based compounds; salicylate acid derivative-based compounds; and hydrazide derivative-based compounds. In particular, triazole-based compounds such as triazole and benzotriazole; and tetrazole-based compounds such as 1H-tetrazole, benzotetrazole are preferably used.

Also ion trapping agent that traps halogen ion and other anions may be used. Any known ion trapping agents may be used without special limitation. In particular, hydrotulcite represented by a compositional formula below, or hydrous bismuth oxide represented by a compositional formula below are preferable.

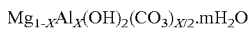

(where, 0<X≤0.5, m is a positive number) $BiO_x(OH)_y(NO_3)_z$ (where, 0.9≤x≤1.1, 0.6≤y≤0.8, 0.2≤z≤0.4).

The hydrotalcite is commercially available from Kyowa Chemical Industry Co., Ltd., under the trade name of DHT-4A. The bismuth is commercially available from Toagosei Co., Ltd. under the trade name of IXE500. Other ion trapping agent may optionally be used. Such other ion trapping agent is exemplified by hydrous oxides of element selected from magnesium, aluminum, titanium, zirconium and antimony. Only a single species of these ion trapping agent may be used independently, or two or more species may be used in combination.

Other examples of the migration inhibitor include antirust agent described in paragraph [0094] of JP-A-2013-15701, compounds described in paragraphs [0073] to [0076] of JP-A-2009-283711, compounds described in paragraph [0052] of JP-A-2011-59656, and compounds described in paragraphs [0114], [0116] and [0118] of JP-A-2012-194520.

The content of the migration inhibitor, when contained in the composition, is preferably 0.01 to 5.0% by mass relative to the total solid content of the composition, which is more preferably 0.05 to 2.0% by mass, and even more preferably 0.1 to 1.0% by mass.

Only one species, or two or more species of migration inhibitor may be used. When two or more species of migration inhibitors are used, the total content preferably falls within the above-described ranges.

«Polymerization Inhibitor»

The photosensitive resin composition used in this invention preferably contains a polymerization inhibitor.

Preferred examples of the polymerization inhibitor include hydroquinone, p-methoxyphenol, di-tert-butyl-p-cresol, pyrogallol, p-tert-butylcatechol, 1,3,5-tris(4-t-butyl-3-hydroxy-2,6-dimethylbenzyl)-1,3,5-triazine-2,4,6-(1H, 3H,5H) -trione, p-benzoquinone diphenyl-p-benzoquinone, 4,4'-thiobis(3-methyl-6 tert-butylphenol), 2,2'-methylenebis (4-methyl-6-tert-butylphenol), N-nitroso-N-phenylhydroxyamine aluminum salt, phenothiazine, N-nitrosodiphenylamine, N-phenylnaphthylamine, ethylenediamine tetraacetate, 1,2-cyclohexanediamine tetraacetate, glycol ether diamine tetraacetate, 2,6-di-tert-butyl-4-methylphenol, 5-nitroso-8-hydroxyquinoline, 1-nitroso-2-naphthol, 2-nitroso-1-naphthol, 2-nitroso-5-(N-ethyl-N-sulfoproropylamino)phenol, N-nitroso-N-(1-naphthyl)hydroxyamine ammonium salt, and bis(4-hydroxy-3,5-tert-butyl)phenylmethane. Also polymerization inhibitors described in paragraph [0060] of JP-A-2015-127817, and, compounds described in paragraphs [0031] to [0046] of WO2015/125469 may be used.

The content of the polymerization inhibitor, when contained in the composition, is preferably 0.01 to 5% by mass of the total solid content of the composition.

Only one species, or two or more species of polymerization inhibitors may be used. When two or more species are used, the total content preferably falls within the above-described ranges.

«Thermal Base Generator»

The composition of this invention may also contain a thermal base generator.

The thermal base generator employed here preferably contains at least one species selected from an acidic compound, and, an ammonium salt that contains an anion with a pKa1 of 0 to 4, and an ammonium cation, both releasing a base when heated to 40° C. or above, although the species thereof is not specifically limited. Now, pKa1 is a logarithmic expression (−Log 10 Ka) of primary proton dissociation constant (Ka) of polyvalent acid.

With such compound blended therein, the polyimide precursor will be cyclized at lower temperatures, and the composition will be made more stable. Since the thermal base generator will not release base unless it is heated, so that the polyimide precursor, when coexisted therewith, will be suppressed from cyclizing during storage, thereby improving the shelf life of the composition.

The thermal base generator in this invention includes at least one species selected from the acidic compound releasing a base when heated to 40° C. or above (A1), and, an ammonium salt (A2) that contains an anion with a pKa1 of 0 to 4, and an ammonium cation.

Since each of the acidic compound (A1) and the ammonium salt (A2) can release a base when heated, so that the cyclization reaction of the polyimide precursor may be accelerated by the bases released from these compounds, allowing cyclization of the polyimide precursor to proceed at lower temperatures. Since these compounds do not release the base unless they are heated; so that they hardly allow the cyclization of the polyamide precursor to proceed if coexisted with the polyimide precursor that can cyclize to cure, making it possible to produce the polyimide precursor composition with high stability.

Now, in this specification, the acidic compound is interpreted as a compound whose pH is found to be smaller than 7, when 1 g of the compound is placed in a vessel, to which 50 ml of a mixed solution of deionized water and tetrahydrofuran (ratio by mass of water/tetrahydrofuran=1/4) is added, the mixture is stirred at one hour at room temperature, and pH of the mixture is measured at 20° C. using a pH meter.

In this invention, each of the acidic compound (A1) and the ammonium salt (A2) preferably has a base releasing temperature of 40° C. or above, which is more preferably 120 to 200° C. The upper limit of the base releasing temperature is preferably 190° C. or below, more preferably 180° C. or below, and even more preferably 165° C. or below. The lower limit of the base releasing temperature is more preferably 130° C. or above, and even more preferably 135° C. or above.

Each of the acidic compound (A1) and the ammonium salt (A2), whose base generating temperature is 120° C. or above, will hardly release a base during storage, and will therefore yield a polyimide precursor composition that excels in stability. Meanwhile, each of the acidic compound (A1) and the ammonium salt (A2), whose base generating temperature is 200° C. or below, will lower the cyclization temperature of the polyimide precursor. The base releasing temperature may be measured, for example, by differential scanning calorimetry, according to which the compound housed in a pressure-proof capsule is heated to 250° C. at 5° C./min, and the lowest temperature at which an exothermic peak appears is read and defined as the base releasing temperature.

In this invention, the base released from the thermal base generator is preferably secondary amine or tertiary amine, wherein tertiary amine is preferable. Tertiary amine, having high basicity by nature, can lower the cyclization temperature of the polyimide precursor. The base released from the thermal base generator preferably has a boiling point of 80° C. or higher, which is more preferably 100° C. higher, and even more preferably 140° C. or higher. The thus released base preferably has a molecular weight of 80 to 2,000. The lower limit is preferably 100 or larger, and the upper limit is preferably 500 or smaller. The molecular weight herein is a theoretical value estimated from the structural formula.

In this invention, the acidic compound (A1) preferably contains at least one species selected from the ammonium salt, compounds represented by Formula (101) or (102) described later.

In this invention, the ammonium salt (A2) is preferably an acidic compound. Note that the ammonium salt (A2) may be a compound that contains an acidic compound that releases a base when heated to 40° C. or above (preferably 120 to 200° C.), or may be a compound other than the acidic compound that can release a base when heated to 40° C. or above (preferably 120 to 200° C.).

<<Ammonium Salt>>

In this invention, ammonium salt means a salt formed between either of ammonium cations represented by Formula (101) or Formula (102) below, and an anion. The anion may be bound to a part of either ammonium cation via a covalent bond, or may be an external component of the ammonium cation, wherein it is preferably an external component of the ammonium cation. The phrase stating that "anion is an external component of the ammonium cation" means that the ammonium cation and the anion are not bound via a covalent bond. The anion, which is an external component of cation, will occasionally be referred to as counter anion.

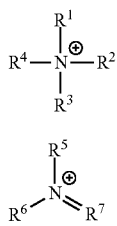

Formula (101)

Formula (102)

In Formulae, each of $R^1$ to $R^6$ independently represents a hydrogen atom or hydrocarbon group, and $R^7$ represents a hydrocarbon group. Each pair of $R^1$ and $R^2$; $R^3$ and $R^4$; $R^5$ arid $R^6$; and $R^5$ and $R^7$ may combine to form a ring.

The ammonium cation is preferably represented by any one of Formulae (Y1-1) to (Y1-5) below.

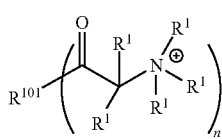

(Y1-1)

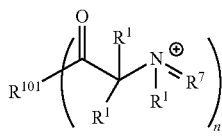

(Y1-2)

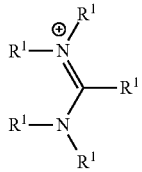

(Y1-3)

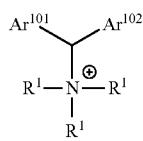

(Y1-4)

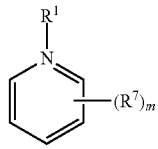

(Y1-5)

in Formulae, $R^{101}$ represents an n-valent organic group, and $R^1$ and $R^7$ are synonymous to those represented by Formula (101) or Formula (102).

Each of $Ar^{101}$ and $Ar^{102}$ independently represents an aryl group, n represents an integer of 1 or larger, and m represents an integer of 0 to 5.

In this invention, the ammonium salt preferably has an anion having a pKa1 of 0 to 4, and an ammonium cation. The upper limit of pKa1 is preferably 3.5 or below, and more preferably 3.2 or below. The lower limit is preferably 0.5 or above, and more preferably 1.0 or above. With pKa1 of anion controlled within these ranges, the polyimide precursor may be cyclized at lower temperatures, and the polyimide precursor composition may be more stabilized. If pKa1 is controlled to 4 or below, the thermal base generator will have an improved stability, will be prevented from releasing the base without heating, and will improve the stability of the polyimide precursor composition. If pKa1 is controlled to 0 or above, the released base will not easily be neutralized, letting cyclization of the polyimide precursor to proceed effectively.

The anion is preferably any one selected from carboxylate anion, phenolic anion, phosphate anion and sulfate anion. Carboxylate anion is more preferable, since it can balance stability and decomposability of the salt. That is, the ammonium salt is preferably a salt famed between an ammonium cation and a carboxylate anion.

The carboxylate anion is preferably a di- or higher valent of anion having two or more carboxy groups, and more preferably an anion of divalent carboxy acid. According to this embodiment, the thermal base generator can further improve stability, curability and developability of the polyimide precursor composition. In particular, by using the anion of divalent carboxylic acid, the polyimide precursor composition will have further improved stability, curability and developability.

In this invention, the carboxylate anion is preferably an anion of carboxylic acid having a pKa1 of 4 or smaller. pKa1 is more preferably 3.5 or smaller, and even more preferably 3.2 or smaller. According to the embodiment, the polyimide precursor composition wall further be stabilized.

Now, pKa1 represents a logarithmic value of a reciprocal of a primary dissociation constant of acid, for which values described in "*Determination of Organic Structures by Physical Methods*" (written by Brown, H. C., McDaniel, D. H., Hafliger, O., Nachod, F. C.; edited by Braude, E. A., Nachod, F. C.; Academic Press, New York, 1955), and "*Data for Biochemical Research*" (written by Dawson, R. M. C. et al; Oxford, Clarendon. Press, 1959) may be referred to. For compounds not described in these literatures, the value will be calculated using software ACD/pKa (from ACD/Labs) based on structural formulae.

In this invention, the carboxylate anion is preferably represented by Formula (X1) below.

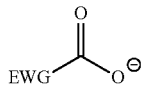
(X1)

In Formula (X1) EWG represents an electron withdrawing group.

In this invention, the electron withdrawing group means a group whose Hammett's substituent constant σm has a positive value. The constant σm is detailed in a review by Yuho Tsuno in Journal of Synthetic Organic Chemistry, Japan, Vol. 23, No. 8 (1965) pp. 631-642. The electron withdrawing group in this invention is not limited to the substituents described in the above-described literature.

Substituents having positive σm values are exemplified by $CF_3$ group (σm=0.43), $C_F3CO$ group (σm=0.63), HC≡C group (σm=0.21), $CH_2$=CH group (σm=0.06), Ac group (σm=0.38), MeOCO group (σm=0.37), MeCOCH=CH group (σm=0.21), and PhCO group (σm=0.34), $H_2NCOCH2$ group (σm=0.06). Me represents a methyl group, Ac represents an acetyl group, and Ph represents a phenyl group.

In this invention, ENG preferably represents any of groups represented by Formulae (EWG-1) to (EWG-6) below.

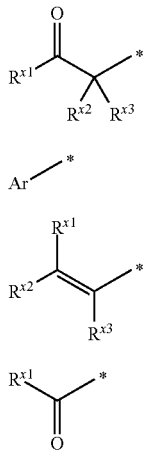
(EWG-1)

(EWG-2)

(EWG-3)

(EWG-4)

(EWG-5)

(EWG-6)

In Formulae, each of $R^{x1}$ to $R^{x3}$ independently represents a hydrogen atom, alkyl group, alkenyl group, aryl group, hydroxy group or carboxy group, and Ar represents an aromatic group.

In this invention, also a carboxylate anion represented by Formula (X) below is preferable.

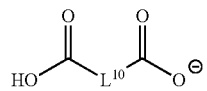
(X)

In Formula (X), $L^{10}$ represents a single bond, or, a divalent linking group selected from alkylene group, alkenylene group, arylene group, $—NR^X—$, and combinations of them, and $R^X$ represents a hydrogen atom, alkyl group, alkenyl group or aryl group.

Specific examples of the carboxylate anion include maleate anion, phthalate anion, N-phenylimino diacetate anion and succinate anion, all of them suitably used.

The base generators preferably used in this invention will be described below.

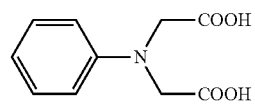
(A-1)

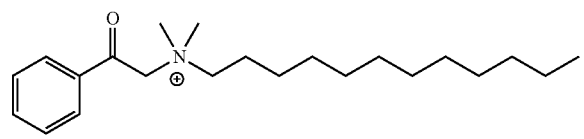
(A-2)

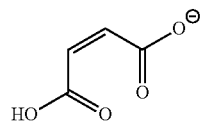

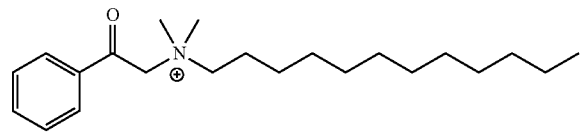
(A-3)

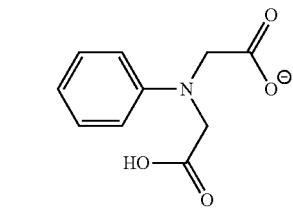

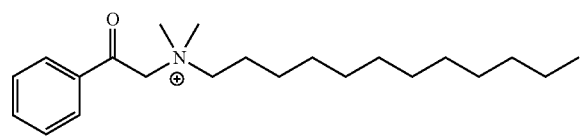
(A-4)

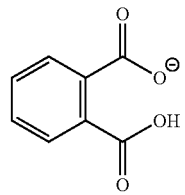

(A-5)
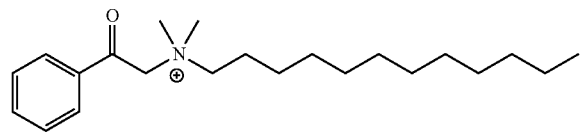
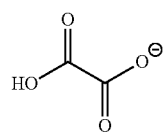
(A-6)
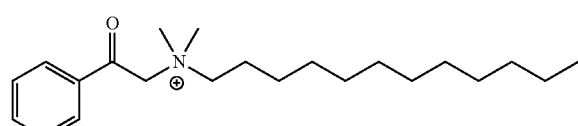
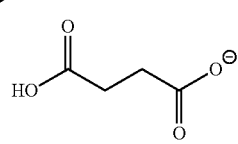
(A-7)
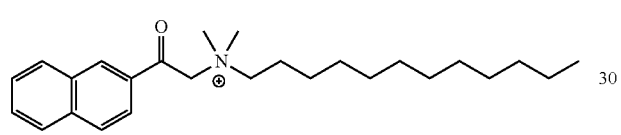
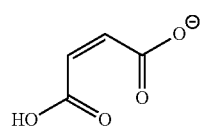
(A-8)
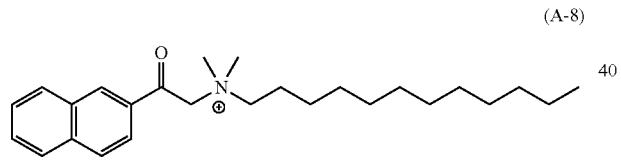
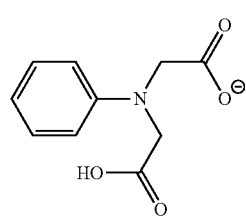
(A-9)
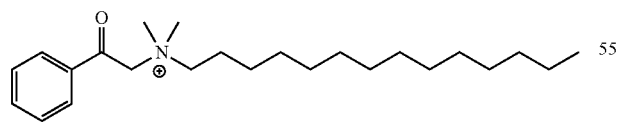
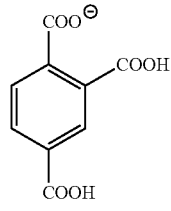
(A-10)
(A-11)
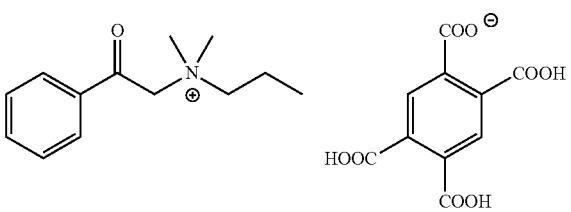
(A-12)
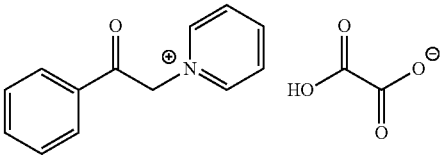
(A-13)
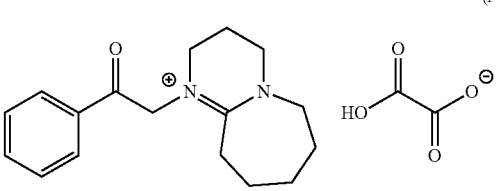
(A-14)
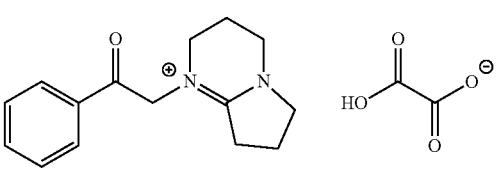
(A-15)
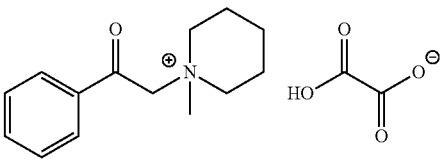
(A-16)
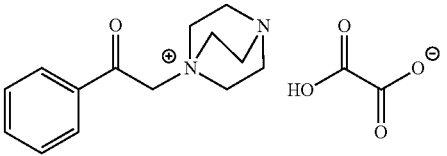
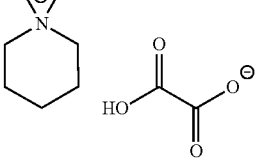
(A-17)
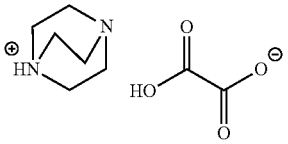

(A-18) 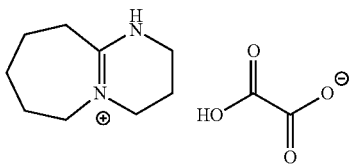

(A-19) 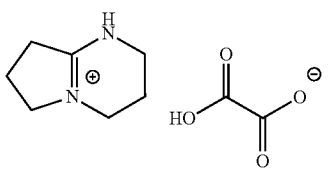

(A-20) 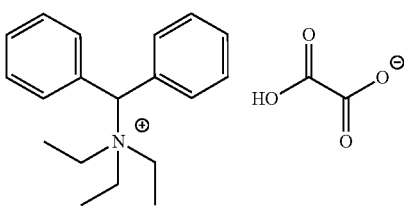

(A-21) 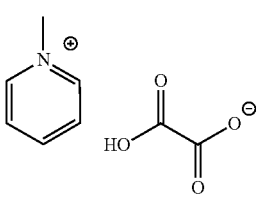

(A-22) 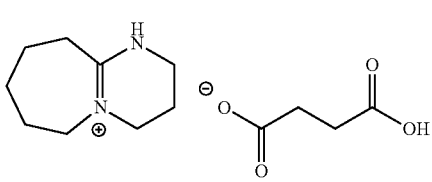

(A-23) 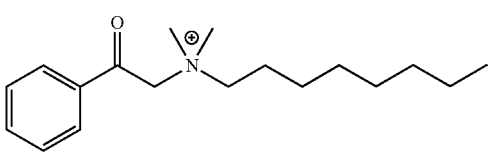

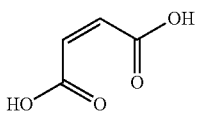

(A-24) 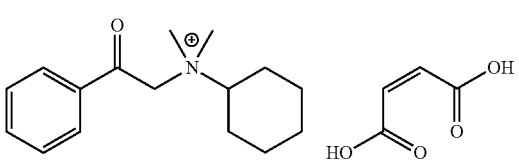

When the thermal base generator is used, the content of the thermal base generator in the composition is preferably 0.1 to 50% by mass, relative to the total solid content of the composition. The lower limit is preferably 0.5% by mass or above, and more preferably 1% by mass or above. Meanwhile, the upper limit is 30% by mass or below, and more preferably 20% by mass or below.

Only one species, or two or more species of the thermal base generators may be used. When two or more species are used, the total content preferably falls within the above-described ranges.

«Photo Base Generator»

The photosensitive resin composition of this invention may contain a photo base generator. The photo base generator is a compound that can release a base upon irradiation by light, and is not specifically limited so long as it remains inactive under normal temperature and normal pressure, but can release a base (basic substance) once externally stimulated by photo-irradiation, that is, irradiation of electromagnetic wave and heating. Since the base released upon irradiation of light can act as a catalyst for curing the polyimide precursor under heating, so that it is suitable for the negative type composition.

The content of the photo base generator may be an ordinary level without special limitation, so long as a desired pattern may be formed. The content of photo base generator preferably falls in the range from 0.01 parts by mass or above, and below 30 parts by mass per 100 parts by mass or resin, more preferably within the range from 0.05 parts by mass to 25 parts by mass, and even more preferably from 0.1 parts by mass to 20 parts by mass.

Any known photo base generators are employable in this invention. As typically described by M. Shirai and M. Tsunooka, Prog. Polym. Sci., 21, 1 (1996) ; Masahiro Tsunooka, Polymer Application, 46, 2(1997); C. Kutal, Coord. Chem. Rev., 211, 353 (2001); Y. Kaneko, A. Sarker and D. Neckers, Chem. Mater., 11, 170 (1999); H. Tachi, M. Shirai and Y. Tsunooka, J. Photopolym. Sci. Technol., 13, 153 (2000); M. Winkle and K. Graziano, J. Photopolym. Sci. Technol. 3, 419(1990); M. Tsunooka, H. Tachi and S. Yoshitaka, J. Photopolym. Sci Technol., 9, 13 (1996); K. Suyama, H. Araki and M. Shirai, J. Photopolym. Sci. Technol., 19, 81 (2006), exemplified are ionic compounds whose base components are neutralized by forming a salt, such as transition metal complex compound, those having an ammonium salt structure or other structure, and those having the amidine moiety thereof combined with carboxylic acid to form a salt to thereby make themselves as latent catalysts; and, nonionic compounds whose base components are hidden in a latent form, through urethane bond or oxime bond of carbamate derivative, oxime ester derivative, and acyl compound, amide derivative, imide derivative, α-cobalt complexes, imidazole derivative, cinnamamide derivative.

The basic substance released from the photo base generator is exemplified by amino group-containing compounds, and particularly by monoamine, diamine or other polyamine, and amidine, without special limitation.

The thus released basic substance is preferably an amino group-containing compound having higher basicity. This is because the compound exerts a strong catalytic action typically in dehydration condensation reaction as found in imidation of the polyimide precursor, and can exert its catalytic action in the dehydration condensation at lower temperatures only with a small amount of consumption. In other words, owing to such large catalytic effect of the thus released basic substance, the negative photosensitive resin composition can elevate its apparent sensitivity.

From the viewpoint of this catalytic effect, amidine and aliphatic amine are preferable.

The photo base generator preferably contains no salt in its structure, and preferably has no electric charge on a nitrogen atom in the base moiety of the photo base generator. The photo base generator preferably has the base to be released in a latent form by using a covalent bond, whose base releasing mechanism is such that the covalent bond between the nitrogen atom of the base moiety to be released, and an adjoining atom is cleaved. With the photo base generator having no salt in its structure, the photo base generator may be given as a neutral one, resulting in higher solubility in solvent and improved pot life. For these reasons, the amine released from the photo base generator used in this invention is preferably any of primary amine or secondary amine.

The photo base generator preferably contains no salt in its structure, and preferably has no electric charge on a nitrogen atom in the base moiety of the photo base generator. The photo base generator preferably has the base to be released in a latent form by using a covalent bond, whose base releasing mechanism is such that the covalent bond between the nitrogen atom of the base moiety to be released, and an adjoining atom is cleaved. With the photo base generator having no salt in its structure, the photo base generator may be given as a neutral one, resulting in higher solubility in solvent and improved pot life. For these reasons, the amine released from the photo base generator used in this invention is preferably any of primary amine or secondary amine.

The photo base generator in this invention is exemplified by photo base generators having a cinnamamide structure described in JP-A-2009-80452 and WO2009/123122, pamphlet; photobase generators having a carbamate structure described in JP-A-2006-189591 and JP-A-2008-247747; photo base generators having an oxime structure or a carbamoyl oxime structure described in. JP-A-2007-249013 and JP-A-2008-003581. The photo base generators are, however not limited thereto, and for which any of those with known structures are applicable.

Other examples of the photo base generator include compounds described in paragraphs [0185] to [0188], [0199] to [0200] and [0202] of JP-A-2012-93746; compounds described in paragraphs [0022] to of JP-A-2013-194205; compound described in paragraphs [0026] to [0074] of JP-A-2013-204019; and compounds described in paragraph of WO2010/064631.

As commercially available photo base generators, also employable are WPBG-266, WPBG-300, WPGB-345, WPGB-140, WPBG-165, WPBG-027, PBG-018, WPGB-015, WPBG-041, WPBG-172, WPGB-174, WPBG-166, WPGB-158, WPGB-025, WPBG-168, WPGB-167 and WPBG-082 (from Wako Pure Chemical Industries, Ltd.).

«Thermal Acid Generator»

The composition of this invention may contain a thermal acid generator. The thermal acid generator that releases an acid upon being heated can express an effect of accelerating cyclization of the polyimide precursor, etc. to thereby improve mechanical characteristics of the cured film; and also an effect of accelerating crosslinking reaction of at least one compound selected from compounds having hydroxymethyl group, alkoxymethyl group or acyloxymethyl group, epoxy compound, oxetane compound and benzoxazine compound.

The thermal acid generator preferably has an initial thermal decomposition temperature of 50° C. to 270° C., which is more preferably 250° C. or below. In view of suppressing sensitivity from decreasing during development, it is advantageous to choose a species that does not release an acid during drying (prebaking at around 70 to 140° C.) of the composition applied on the substrate, but releases the acid during final annealing (curing at around 100 to 400° C.) of the composition after patterned by photo-irradiation and development.

The acid released from the thermal acid generator is preferably a strong acid. Preferred examples include arylsulfonic acids such as p-toluenesulfonic acid and benzenesulfonic acid; alkylsulfonic acids such as methanesulfonic acid, ethanesulfonic acid and butanesulfonic acid; and haloalkylsulfomic acids such as trifluoromethanesulfonic acid. Such thermal acid generator is exemplified by those described in paragraph [0055] of JP-A-2013-072935.

Among them, from the viewpoint of less residence in the cured film, and less risk of degrading physical properties of the cured film, more preferable examples of the thermal acid generator include arylsulfonic acid having 1 to 4 carbon atoms and haloalkylsulfonic acid having 1 to 4 carbon atoms; which include methanesulfonic acid (4-hydroxyphenyl)dimethylsulfonium, methanesulfonic acid (4-((methoxycarbonyl)oxy)phenyl)dimethylsulfonium, methanesulfonic acid benzyl(4-hydroxyphenyl)methylsulfonium, methanesulfonic acid benzyl(4-((methoxycarbonyl)oxy) phenyl)methylsulfonium, methanesulfonic acid (4-hydroxyphenyl)methyl((2-methylphenyl)methyl)sulfonium, trifluoromethanesulfonic acid (4-hydroxyphenyl) dimethylsulfonium, trifluoromethanesulfonic acid (4-((methoxycarbonyl)oxy)phenyl)dimethylsulfonium, trifluoromethanesulfonic acid benzyl(4-hydroxyphenyl) methylsulfonium, trifluoromethanesulfonic acid benzyl(4-((methoxycarbonyl)oxy)phenyl)methylsulfonium, trifluoromethanesulfonic acid (4-hydroxychenyl)methyl((2-methylphenyl)methyl)sulfonium, 3-(5-((propylsulfonyl) oxy)imino)thiophene-2(5H)-ylidene)-2-(o-tolyl) propanenitrile, and 2,2-bis(3-(methanesulfonylamino)-4-hydroxyphenyl)hexafluoropropane.

Also compounds described in paragraph [0059] of JP-A-2013-167742 are preferable as the thermal acid generator.

The content of the thermal acid generator is preferably 0.01 parts by mass or more per 100 parts by mass of the polyimide precursor, etc., which is more preferably 0.1 parts by mass or more. With the content of 0.01 parts by mass or more, the cyclization of the polyimide precursor, etc. is accelerated, and thereby the cured film will have an improved mechanical characteristics and chemical resistance. From the viewpoint of electric insulation performance of the cured film, the content is preferably 20 parts by mass or less, more preferably 15 parts by mass or less, and even more preferably 10 parts by mass or less.

Only one species, or two or more species of the thermal acid generators may be used. When two or more species are used, the total content preferably falls within the above-described ranges «Thermal Polymerization Initiator»

The composition of this invention may also contain a thermal polymerization initiator (preferably, thermal radical polymerization initiator). For the thermal radical polymerization initiator, any known thermal radical polymerization initiators may be used.

Thermal radical polymerization initiator can release a radical under thermal energy, and can initiate or accelerate polymerization of the polymerizable compound. With the thus added thermal radical polymerization initiator, the polymerization of the polymerizable compound may be allowed to proceed, in the process of cyclization of the polyimide precursor, etc. When the polyimide precursor, etc. has an ethylenic unsaturated bond, such polyimide precursor, etc. can allow not only cyclization but also polymerization to proceed therein, which is advantageous for The thermal radical polymerization initiator is exemplified by aromatic ketones, onium salt compound, peroxide, thio compound, hexaarylbiimidazole compound, ketoxime ester compound, borate compound, azinium compound, metallocene compound, activated ester compound, compound having carbon-halogen bond, and azo-based compound. Among them, peroxide or azo-based compound are more preferable, and peroxide is particularly preferable.

The thermal radical polymerization initiator used in this invention preferably has a ten hour half-life temperature of 90 to 130° C., which is more preferably 100 to 120° C.

Specific examples of the compound are described in paragraphs [0074] to [0118] of JP-A-2008-63554.

Perbutyl Z and Percumyl D (from NOF Corporation) are suitable products that are commercially available.

The content of the thermal radical polymerization initiator, when contained in the composition, is preferably 0.1 to 50% by mass relative to the total solid content of the composition, which is more preferably 0.1 to 30% by mass, and particularly 0.1 to 20% by mass. The content of the thermal radical polymerization initiator per 100 parts by mass of the polymerizable compound is preferably 0.1 to 50 parts by mass, and more preferably 0.5 to 30 parts by mass. According to this embodiment, it will be more easy to form the cured film with improved heat resistance.

Only one species, or two or more species of the thermal radical polymerization initiators may be used. When two or more species of the thermal radical polymerization initiators are used, the total content preferably falls within the above described ranges.

«Metal Adhesion Enhancer»

The composition of this invention preferably contains a metal adhesion enhancer, in expectation of improving adhesion to metal materials used for electrodes or interconnects. The metal adhesion enhancer is exemplified by sulfide-based compound described in paragraphs [0046] to [0049] of JP-A-2014-186186, and paragraphs [0032] to [0043] of JP-A-2013-072935. Also compounds below monoamide (N-[3-(triethxysilyl)propyl]maleate is exemplified as the metal adhesion enhancer.

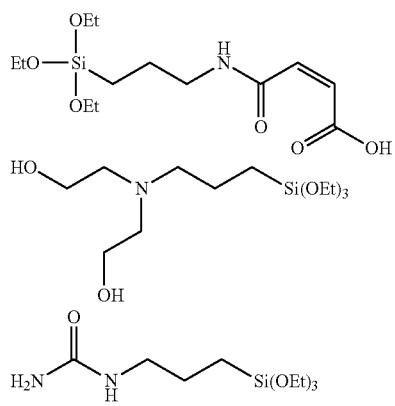

The amount of addition of the metal adhesion enhancer is preferably 0.1 to 30 parts by mass per 100 parts by mass of the polyimide precursor, etc., and more preferably 0.5 to 15 parts by mass. With the content controlled to 0.1 parts by mass or more, the heat-cured film will have an improved adhesion to metals, meanwhile with the content controlled to 30 parts by mass or less, the cured film will have improved mechanical characteristics.

Only one species, or two or more species of the metal adhesion enhancers may be used. When two or more species are used, the total content preferably falls within the above-described ranges.

«Silane Coupling Agent»

The composition of this invention preferably contains a silane coupling agent, in expectation of improving adhesion to the substrate. The silane coupling agent is exemplified by compounds described in paragraphs [0062] to [0073] of JP-A-2014-191002; compounds described in paragraphs [0063] to [0071] of WO2011/080992A1; compounds described in paragraphs [0060] to [0061] of JP-A-2014-191252; compounds described in paragraphs [0045] to [0052] of JP-A-2014-41264; and compounds described in paragraph [0055] of WO2014/097594. It is also preferable to use two or more different silane coupling agents as described in paragraphs [0050] to [0058] of JP-A-2011-128358.

The amount of blending of the silane coupling agent is preferably 0.1 to 20 parts by mass per 100 parts by mass of the polyimide precursor, etc., and more preferably 1 to 10 parts by mass. With the content controlled to 0.1 parts by mass or more, the composition will be given a sufficient level of adhesion to the substrate, meanwhile with the content controlled to 20 parts by mass or less, undesirable increase in viscosity during storage at room temperature will be suppressed more effectively.

Only one species, or two or more species of the silane coupling agents may be used. When two or more species are used, the total content preferably falls within the above-described ranges.

«Sensitizing Dye»

The composition of this invention may also contain a sensitizing dye. The sensitizing dye absorbs a specific active radiation ray to be brought up into an electronically excited state. The sensitizing dye, having been brought up into the electronically excited state, can interact with amine generator, thermal radical polymerization initiator or photo-polymerization initiator to cause electron transfer, energy transfer, heat generation and so forth. The amine generator, thermal radical polymerization initiator or photo-polymerization initiator will be chemically changed and decomposed, to thereby produce radical, acid, or base.

Preferred sensitizing dye is exemplified by those categorized as below, showing absorption within the wavelength range from 300 nm to 450 nm. Examples include polynuclear aromatic compounds (e.g. phenanthrene, anthracene, pyrene, perylene, triphenylene, 9,10-dialkoxy anthracene); xanthenes (e.g. fluorescein, eosin, erythrosin, rhodamine B, rose bengal); thioxanthones (e.g. 2,4-diethylthioxanthone); cyanines (e.g. thiacarbocyanine, oxacarbocyanine); merocyanines (e.g. merocyanine, carbomerocyanine); thiazines (e.g. thionine, methylene blue, toluidine blue); acridines (e.g. acridine orange, chloroflavin, acriflavine); anthraquinones (e.g. anthraquinone), squaryliumss (e.g. squarylium); coumarins (e.g. 7-diethylamino-4-methylcoumarin); 3-acetyl-7-dimethyl amino coumarin, 3-ethoy carbonyl amino coumarin, 3-benzyloxycarbonyl-7-dimethyl amino coumarin, 3-methoxycarbonyl-7-diethyl amino coumarin, 3-ethoxycarbonyl-7-diethyl amino coumarin; stylylbenzenes; distylylbenzenes; carbazoles; and n-phenyldiethanolamine.

Among them, combinations of polynuclear aromatic compounds (e.g. phenanthrene, anthracene, pyrene, perylene, triphenylene), thioxanthones, distylylbenzenes, stylyibenzenes are preferable in this invention, from the viewpoint of initiation efficiency, wherein use of compounds having an anthracene skeleton is more preferable. Particularly preferable compounds are specifically exemplified by 9,10-diethoxyanthracene, and 9,10-dibutoxyanthracene.

The content of the sensitizing dye, when contained in the composition, is preferably 0.01 to 20% by mass per 100 by mass of the total solid content of the composition, which is more preferably 0.1 to 15% by mass, and even more preferably 0.5 to 10% by mass. Only one species, or two or more species of the sensitizing dyes may be used.

«Chain Transfer Agent»

The composition of this invention may also contain a chain transfer agent. The chain transfer agent is defined, for example, in "Kobunshi Jiten" (in Japanese, Polymer Dictionary), 3rd Ed. (edited by the Society of Polymer Science, Japan, 2005) p. 683-684. For the chain transfer agent, employable are compounds having SH, PH, SiH, or GeH in the molecules thereof. These compounds can produce a radical through hydrogen donation to a less active radical species, or can produce a radical after oxidized and then deprotonated. In particular, thiol compound (e.g. 2-mercaptobenzimidazoles, 2-mercaptobenzthiazoles, 2-mercaptobenzoxazoles, 3-mercaptotriazoles, and 5-mercaptotetrazoles) are suitably used.

The content of the chain transfer agent, when contained in the composition, is preferably 0.01 to 20 parts by mass per 100 parts by mass of the total solid content of the composition, and is more preferably 1 to 10 parts by mass, and particularly 1 to 5 parts by mass.

Only one species, or two or more species of the chain transfer agents may be used. When there are two or more species of chain transfer agent, the total content preferably falls within the above-described ranges.

«Surfactant»

A variety of surfactants may be added to the composition of this invention, in expectation of further improving the coatability. A variety of surfactants, including fluorine-containing surfactant, nonionic surfactant, cationic surfactant, anionic surfactant, and silicone-based surfactant, may be used.

In particular, by containing the fluorine-containing surfactant, the composition prepared in the form of coating liquid will have improved liquid characteristics (in particular, fluidity), and thereby uniformity of coating and liquid saving property may further be improved.

In the process of forming a film by using the coating liquid that contains the fluorine-containing surfactant, surface tension between the surface to be coated and the coating liquid will be reduced, wettability of the surface to be coated will be improved, and thereby coatability on the surface to he coated will be improved. This is advantageous in that a thin film of several micrometers thick, even when formed by using only a small amount of liquid, will have a uniform thickness with minimum irregularity.

Fluorine content ratio of the fluorine-containing surfactant is preferably 3 to 40% by mass, more preferably 5 to 30% by mass, and particularly 7 to 25% by mass. With the fluorine content ratio controlled within these ranges, the fluorine-containing surfactant will be advantageous in terms of uniformity of the coated film and liquid saving property, and will be well soluble into solvent.

The fluorine-containing surfactant is exemplified by Megaface F171, ditto F172, ditto F173, ditto F176, ditto F177, ditto F141, ditto F142, ditto F143, ditto P144, ditto R30, ditto F437, ditto F475, ditto P479, ditto F482, ditto P554, ditto F780, ditto F781 (all from DIC Corporation); Fluorad FC430, ditto FC431, ditto FC171 (all from Sumitomo 3M Ltd.); Surflon S-382, ditto SC-101, ditto SC-103, ditto SC-104, ditto SC-105, ditto SC1068, ditto SC-381, ditto SC-383, ditto S393, ditto KH-40 (all from Asahi Glass Co., Ltd.); and PF636, PF656, PF6320, PF6520, PF7002 (all from OMNOVA Solutions Inc.).

The fluorine-containing surfactant employed here may be a block polymer, which is specifically exemplified by compounds described in JP-A-2011-89090.

Also a compounds below is exemplified as the fluorine-containing surfactant employed in this invention.

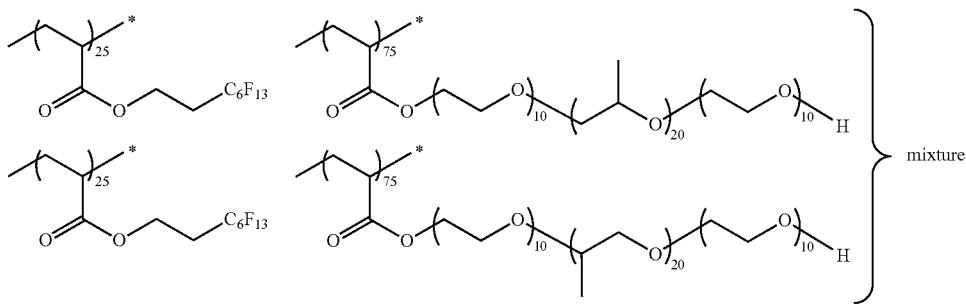

The compound shown above has a weight-average molecular weight of 14,000, for example.

The nonionic surfactant is specifically exemplified by glycerol, trimethylolpropane, trimethylolethane as well as ethoxylate and propoxylate of them (e.g. glycerol propoxylate, glycerol ethoxylate) polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid ester (Pluronic L10, L31, L61, L62, 10R5, 17R2, 25R2, Tetronic 304, 701, 704, 901, 904, 150R1, from BASF SE), and Soisperse 20000 (Lubrizol Japan Ltd.). Also, Pionin D-6112-W from Takemoto Oil & Fat Co., Ltd., and NCW-101, NCW-1001, NCW-1002 from Wako Pure Chemical Industries, Ltd. are employable.

The cationic surfactant is specifically exemplified by phthalocyanine derivative (trade name: EFKA-745, from Morishita & Co., Ltd.), organiosiloxane polymer KP341 (from Shin-Etsu Chemical Co., Ltd.), (meth)acrylate-based (co)polymer Polyflow No. 75, No. 90, No. 95 (from Kyoeisha Chemical Co., Ltd.), and W001 (from Yusho Co., Ltd.).

The anionic surfactant is specifically exemplified by W004, W005, W017 (from Yusho Co., Ltd.).

The silicone-based surfactant is exemplified by "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA" and "Toray Silicone SH8400" from Dow Corning Toray Co., Ltd.; "TSF-4440", "TSF-4300", "TSF-4445", "TSF-4460" and "TSF-4452" from Momentive Performance Materials Inc.; "KP341", "KF6001" and "KF6002" from Shiri-Etsu Silicone Co., Ltd.; and "BYK307", "BYK323", "BYK330" from BYK-Chemie GmbH.

The content of the surfactant, when contained in the composition, is preferably 0.001 to 2.0% by mass relative to the total) solid content of the composition, which is more preferably 0.005 to 1.0% by mass.

Only one species, or two or more species of the surfactant may be used. When there are two or more species of surfactants, the total content preferably falls within the above-described ranges.

«Higher Fatty Acid Derivative, etc.»

It is also preferable to add a higher fatty acid derivative such as behenic acid and behenic amide so as to segregate it to the surface of the composition during drying after being applied, in expectation of avoiding oxygen-mediated inhibition of polymerization.

The content of the higher fatty acid derivative, when contained in the composition, is preferably 0.1 to 10% by mass relative to the total solid content of the composition.

Only one species, or two or more species of the higher fatty acid derivatives may be used. When there are two or more species of higher fatty acid derivatives, the total content preferably falls within the above-described ranges.

«Solvent»

It is preferable to blend a solvent to the composition of this invention when intended to be coated to form a layer. Any of known solvents may be used without limitation, so long as it can make the composition into the layer.

Preferably exemplified are esters that include ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl alkoxyacetate (e.g. methyl alkoxyacetate, ethyl alkoxyacetate, butyl alkoxyacetate (e.g. methyl methoxyacetate, ethyl methoxyacetate, butyl methoxyacetate, methyl ethoxyacetate, ethyl ethoxyacetate, etc.)), alkyl 3-alkoxypropionates (e.g. methyl 3-alkoxypropionate, ethyl 3-alkoxypropionate, etc. (e.g. methyl 3-methoxypropionate, ethyl 3-methoxypropionate, methyl 3-ethoxypropionate, ethyl 3-ethoxyoropionate, etc.)), alkyl 2-alkoxypropionates (e.g. methyl 2-alkoxypropionate ethyl 2-alkoxypropionate, propyl 2-alkoxypropionate, etc. (e.g. methyl 2-methoxypropionate, ethyl 2-methoxypropionate, propyl 2-methoxyproisionate, methyl 2-ethoxypropionate, ethyl 2-ethoxypropionate)), methyl 2 alkoxy-2-methylpropionate and ethyl, 2-alkoxy-2-methylpropionate (e.g. methyl 2-methoxy-2-methylpropionate, ethyl 2-ethoxy-2-methylpropionate, etc.), methyl pyruvate, ethyl pyruvate, propyl pyruvate, methyl acetoacetate, ethyl acetoacetate, methyl 2-oxobutanoate, ethyl 2-oxobutanoate, etc.; and, ethers that include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, etc.; and, ketones that include methyl ethyl ketone, cyclohexanone, cyclopentanone, 2-heptanone, 3-heptanone N-methyl-2-pyrrolidone, etc.; and, aromatic hydrocarbons that include toluene, xylene, anisole, limonene, etc.; and, sulfoxides that include dimethyl sulfoxide.

In one preferred embodiment, two or more species of solvents are mixed from the viewpoint of improving profile of the coated surface. Among others, preferable is a mixed solvent containing two or more species selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethylcarbitol acetate, butylcarbitol acetate, propylene glycol methyl ether, and propylene glycol methyl ether acetate. A combined use of dimethyl sulfoxide and γ-butyrolactone is particularly preferable.

The content of the solvent, when contained in the composition, is preferably controlled so that the total solid concentration of the composition will fall within the range from 5 to 80% by mass, from the viewpoint of coatability, which is more preferably 5 to 70% by mass, and particularly 10 to 60% by mass.

The content of solvent may be controlled depending on a desired film thickness and a method of coating. When, for example, the method of coating is spin coating or slit coating, the content of solvent is preferably controlled so as to give the above-described ranges of solid concentration. For spray coating, the solvent content is preferably controlled to achieve a solid content of 0.1% by mass to 50% by mass, and more preferably 1.0% by mass to 25% by mass. By controlling the solvent content depending on the method of coating, a desired thickness of photosensitive resin film may be formed uniformly.

Only one species, or two or more species of the solvents may be used. When there are two or more species of solvents, the total content preferably falls within the above-described ranges.

The content of N-methyl-2-pyrrolidone, N-ethyl-2-pyrrolidone, N,N-dimethylacetamide or N,N-dimethylformamide is preferably less than 5% by mass of the total mass of the composition from the viewpoint of film strength, more preferably less than 1% by mass, even more preferably less than 0.5% by mass, and particularly less than 0.1% by mass.

«Other Additives»

The composition of this invention may optionally contain various additives, such as inorganic particle, curing agent, curing catalyst, filler, antioxidant, UV absorber, and aggregation inhibitor, so long as the effect of this invention will not be degraded. The total content of these additives, when contained, is preferably 3% by mass or less of the solid content of composition.

The content of water in the composition of this invention is preferably less than 5% by mass, in view of profile of the coated surface, which is more preferably less than 1% by mass, and particularly less than 0.6% by mass.

The content of metal in the composition used in this invention is preferably less than 5 ppm by mass from the viewpoint of insulating performance, and is more preferably less than 1 ppm by mass, and particularly less than 0.5 ppm by mass. The metal is exemplified by sodium, potassium, magnesium, calcium, iron, chromium and nickel. When a plurality of metals are contained, the total amount of metals preferably falls within the above described ranges.

Methods for reducing any unintentionally contained metal impurities include: selecting a raw material with a small content of metal, as a material for composing the composition; filtering the raw material for composing the composition; and distilling the material under conditions capable of avoiding contamination as possible, for example by using an apparatus with a polytetrafluoroethylene lining.

The content of halogen atom in the composition of this invention is preferably less than 500 ppm by mass from the viewpoint of corrosion of interconnects, which is more preferably less than 300 ppm by mass, and particularly less than 200 ppm by mass. In particular, halogen in the form of ions preferably accounts for less than 5 ppm by mass, more preferably less than 1 ppm by mass, and particularly less than 0.5 ppm by mass. The halogen atom is exemplified by chlorine atom and bromine atom. The total content of chlorine atom and bromine atom, or the total content of chloride ion and bromide ion preferably falls within the above described ranges.

<Method for Manufacturing Laminate>

The method for manufacturing a laminate of this invention is a method for manufacturing the above-described laminate. The method include sequentially carrying out: a photosensitive resin composition layer forming step, applying a photosensitive resin composition to a substrate to thereby form a layer; an exposure step exposing the photosensitive resin composition layer to light; and a development step developing the exposed photosensitive resin composition layer by negative development, and again sequentially carrying out the photosensitive resin composition layer forming step, the exposure step, and the development step. The photosensitive resin composition contains a resin selected from polyimide precursor, polyimide, polybenzoxazole precursor and polybenzoxazole. The method satisfies at least either that the resin contains a polymerizable group, or that the photosensitive resin composition contains a polymerizable compound.

By forming the insulating film by negative development as described above, and with specific levels of Young's modulus and elongation after fracture, it now becomes possible to improve adhesion between the layers. Hence by employing the above-described means, this invention can successfully provide high adhesion among resin layers even in a multi-layered design.

«Photosensitive Resin Composition Layer Forming Step»

The method for manufacturing the laminate of this invention includes the photosensitive resin composition layer forming step that applies the photosensitive resin composition to a substrate to thereby form a layer.

Type of the substrate may suitably be determined depending on applications, and is selectable without special limitation from semiconductor manufacturing substrates such as those made of silicon, silicon nitride, polysilicon, silicon oxide and amorphous silicon; quartz; glass; optical film; ceramic material; evaporated film; magnetic film; reflective film; metal substrates made of Ni, Cu, Cr or Fe; paper; SOG (Spin-On Glass); TFT (thin film transistor) array substrate; and electrode board of plasma display panel (PDP). In this invention, semiconductor manufacturing substrates are preferable, and silicon substrate is more preferable.

When the photosensitive resin composition layer is formed on the surface of the resin layer or on the surface of the metal layer, such resin layer and metal layer serve as the substrate.

The photosensitive resin composition is applied to the substrate preferably by coating.

Specific means for application are exemplified by dip coating, air knife coating, curtain coating, wire bar coating, gravure coating, extrusion coating, spray coating, spin coating, slit coating, and ink jet coating. From the viewpoint of uniformity of thickness of the photosensitive resin composition layer, the means is more preferably spin coating, slit coating, spray coating, or ink jet coating. A desired resin layer may be obtained by suitably controlling the solid concentration and coating conditions. The coating conditions may suitably be selected, also depending on geometry of the substrate, wherein spin coating, spray coating and ink jet coating are suitable for circular substrates such as wafer, meanwhile slit coating, spray coating and ink jet coating are suitable for rectangular substrates. According to the spin coating, the composition may be applied at a rotational speed of 500 to 2,000 rpm, for approximately 10 seconds to one minute.

The photosensitive resin composition layer (resin layer) is preferably formed by coating, so as to be 0.1 to 100 µm thick after exposure, and more preferably to be 1 to 50 µm thick. As illustrated in FIG. 1, the thickness of the resultant photosensitive resin composition layer is not always necessarily uniform. In particular, when the photosensitive resin composition layer is provided on an irregular surface, the resin will have locally different thicknesses as illustrated in FIG. 1. In particular for the multi-laminated design possibly having recesses with large depth, this invention poses a technical advantage that interlayer separation in such design may be suppressed more efficiently. When the laminate of this invention has resin layers of different thicknesses, the thickness of the thinnest port on of the resin layer preferably falls within the above-described ranges.

Details of the photosensitive resin composition are same as described above, defined by the same preferable ranges.

«Filtration Step»

The method for manufacturing the laminate of this invention may include a step of filtering the photosensitive resin composition, before applied to the substrate. The filtration is preferably carried out through a filter. Pore size of the filter is preferably 1 µm or smaller, more preferably 0.5 µm or smaller, and even more preferably 0.1 µm or smaller. The filter is preferably a polytetrafluoroethylene filter, polyethylene filter, or nylon filter. The filter may preliminarily be washed with an organic solvent. In the filtration process, two or more different types of filters may be used in a series connection or parallel connection. When a plurality of types of filters are used, those different in at least either pore size or constituent material may be combined. The individual materials may be filtered twice or more times, and such multiple filtration may take place in a recirculation filtration process. The filtration may take place under pressure, preferably at a pressure of 0.05 MPa or above and 0.3 MPa or below.

Impurities may be removed by using an adsorbent, in place of using the filter for filtration, or still alternatively, by using the filter for filtration and the adsorbent in combination. The adsorbent used here may be any of known ones including inorganic adsorbent such as silica gel and zeolite, and organic adsorbent such as activated carbon.

«Drying Step»

The method for manufacturing the laminate of this invention may include a step for drying the solvent, after the photosensitive resin composition layer was formed. The drying temperature is preferably 50 to 150° C., more preferably 70° C. to 130° C., and most preferably 90 to 110° C. The drying time is typically 30 seconds to 20 minutes, preferably 1 minute to 10 minutes, and most preferably 3 minutes to 7 minutes.

<Exposure Step>

The method for manufacturing the laminate of this invention includes the exposure step exposing the photosensitive resin composition layer to light. Although the exposure is not specifically limited so long as it can cure the photosensitive resin composition, it is preferably carried out by irradiating 365 nm light at 100 to 10,000 mJ cm$^2$ in terms of exposure energy, which is more preferably 200 to 8,000 mJ/cm$^2$.

The exposure wavelength of irradiation is selectable in the range from 190 to 1,000 nm, preferably from 240 to 550 nm.

«Development Step»

The method for manufacturing the laminate of this invention has a development step developing the exposed photosensitive resin composition layer by negative development. As a result of the negative development, the unexposed area (non-exposed portion) is removed. Methods for development are not specifically limited so long as a desired pattern may be formed by using the method, and those making use of puddle formation, spraying, dipping or ultrasonic wave are employable.

The development is carried out by using a developing solution. The developing solution is not specifically limited, so long as the unexposed area (non-exposed portion) can be removed by using it. Solvents are preferably used therefor, which are exemplified by esters that include ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl alkoxyacetate (e.g. methyl alkoxyacetate, ethyl alkoxyacetate, butyl alkoxyacetate (e.g. methyl methoxyacetate, ethyl methoxyacetate, butyl methoxyacetate, methyl ethoxyacetate, ethyl ethoxyacetate, etc.)), alkyl 3-alkoxypropionates (e.g. methyl 3-alkoxypropionate, ethyl 3-alkoxypiopionate, etc. (e.g. methyl 3-methoxypropionate, ethyl 3-methoxypropionate, methyl 3-ethoxypropionate, ethyl 3-ethoxypropionate, etc.)), alkyl 2-alkoxypropionates (e.g. methyl 2-alkoxypropionate, ethyl 2-alkoxypropionate, propyl 2-alkoxypropionate, etc. (e.g. methyl 2-methoxypropionate, ethyl 2-methoxypropionate, propyl 2-methoxypropionate, methyl 2-ethoxypropionate, ethyl 2-ethoxypropionate)), methyl 2-alkoxy-2-methylpropionate and ethyl 2-alkoxy-2-methylpropionate (e.g. methyl 2-methoxy-2-methylpropionate, ethyl 2-ethoxy-2-methylpropionate, etc.), methyl pyruvate, ethyl pyruvate, propyl pyruvate, methyl acetoacetate, ethyl acetoacetate, methyl 2-oxobutanoate, ethyl 2-oxobutanoate, etc.; and, by ethers that include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, ethylcarbitol acetate, butylcarbitol acetate, etc.; and, by ketones that include methyl ethyl ketone, cyclohexanone, cyclopentanone, 2-heptanone, 3-heptanone, N-methyl-2-pyrrolidone, etc.; and, by aromatic hydrocarbons that include toluene, xylene, anisole, limonene, etc.; and, by sulfoxides that include dimethylsulfoxide. Among them, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethylsulfoxide, ethylcarbitol acetate, butylcarbitol acetate, propylene glycol monomethyl ether, and propylene glycol monomethyl ether acetate are preferable. Cyclopentanone and γ-butyrolactone are more preferable.

The developing time is preferably 10 seconds to 5 minutes. The temperature during development is typically, but not specifically limited to, 20 to 40° C.

The treatment using the developing solution may further be followed by rinsing. The rinsing preferably employs a solvent different from the developing solution. For example, a solvent contained in the photosensitive resin composition may be used for rinsing. The rinsing time is preferably 5 seconds to 1 minute.

«Heating Step»

The method for manufacturing the laminate of this invention preferably includes a heating step. In the heating step, a cyclization reaction of the polyimide precursor and polybenzoxazole precursor can proceed. Polyimide or polybenzoxazole, when heated together with a crosslinking agent, can form a three-dimensional network structure. Also unreacted radical polymerizable compound is allowed to cure. Maximum heating temperature (highest temperature during heating) is preferably 100 to 500° C., more preferably 140 to 400° C., and even more preferably 160 to 350° C.

The heating is preferably carried out from a temperature in the range from 20 to 150° C., up to the maximum temperature at a heating rate of 1 to 12° C./min, more preferably 2 to 10° C./min, and even more preferably 3 to 10° C./min. With the heating rate controlled to 1° C./min or above, it now becomes possible to prevent excessive evaporation of amine, while suitably keeping the productivity. Meanwhile, with the heating rate controlled to 12° C./min or below, residual stress of the cured film may be relaxed.

The start temperature of heating preferably falls in the range from at 20 to 150° C., more preferably from 20° C. to 130° C., and even more preferably from 25° C. to 120° C. The start temperature of heating means a temperature at which the heating begins so as to be allowed to proceed up to the maximum temperature. For example when the photosensitive resin composition is applied to the substrate and then dried, the start temperature of heating means the temperature that is achieved at this point after drying. The heating is preferably started, for example, from the temperature 30 to 200° C. lower than the boiling point of the solvent contained in the photosensitive resin composition. The heating is preferably continued for 10 to 360 minutes after the maximum temperature has been reached, which is more preferably 20 to 300 minutes, and particularly 30 to 240 minutes.

The heating may be carried out stepwisely. For example, the heating may be preceded by a pretreatment step that involves heating from 25° C. to 180° C. at a rate of 3° C./min, keeping at 180° C. for 60 minutes, heating from 180 to 200° C. at a rate of 2° C./min, and keeping at 200° C. for 120 minutes. The heating in the pretreatment step is carried out preferably in the range from 100 to 200° C., more preferably from 110 to 190° C., and even more preferably 120 to 185° C. The pretreatment step is also preferably accompanied by UV irradiation as described in U.S. Pat. No. 9,159,547. With such pretreatment step, it is now possible to improve the film properties. The pretreatment step preferably takes a short time of 10 seconds to 2 hours, and more preferably 15 seconds to 30 minutes. The pretreatment step may have two or more stages, wherein pretreatment step 1 within the range from 100 to 150° C. may be followed by pretreatment step 2 within the range from 150 to 200° C.

The heating may further be followed by cooling, preferably at a cooling rate of 1 to 5° C./min.

The heating step is carried out in a low-oxygen atmosphere by feeding an inert gas such as nitrogen, helium or argon, from the viewpoint of inhibiting decomposition of the polyimide precursor, etc. The oxygen concentration is preferably 50 ppm (v/v) or below, and more preferably 20 ppm (v/v) or below.

«Metal Layer Forming Step»

The method for manufacturing the laminate of this invention preferably includes a metal layer-forming step providing a metal layer on the surface of the photosensitive resin composition layer having been developed.

The metal layer may employ known metal species without special limitation, which include copper, aluminum, nickel, vanadium, titanium, chromium, cobalt, gold and tungsten. Copper and aluminum are more preferable, and copper is more preferable.

Methods for forming the metal layer may be any of known methods without special limitation, such as those described in JP-A-2007-157879, JP-A-2001-521288, JP-A-2004-214501 and JP-A-2004-101850. Employable methods include photolithography, lift-off, electroplating, electroless plating, etching, printing, and any combinations of them. More specific examples include a patterning method based on combination of sputtering, photolithography and etching, and a patterning method based on combination of photolithography and electroplating.

The metal layer is preferably 0.1 to 50 μm thick at the thickest part thereof, and is more preferably 1 to 10 μm.

«Surface Activation Steps»

The method for manufacturing the laminate of this invention may include a surface activation step activating at least part of the surfaces of the metal layer and the photosensitive resin composition layer. The surface activation may be provided only to a part of the metal layer, only to at least a part of the photosensitive resin composition layer after exposure, or individually to at least part of both of the metal layer and the photosensitive resin composition layer after exposure.

Although, in most cases, the surface activation step comes after the metal layer-forming step, an alternative sequence may be such as carrying out the surface activation step for the photosensitive resin composition layer after exposure, and then forming the metal layer.

The surface activation is preferably given to at least a part of the metal layer, and more preferably given partially or entirely over the area of the metal layer on which the photosensitive resin composition layer will be formed. With such surface activation given to the surface, the metal layer will have an improved adhesion with the resin layer to be provided thereon.

The surface activation is preferably given also to a part of, or the entire portion of the photosensitive resin composition layer (resin layer) after exposure. With such surface activation given to the surface, the photosensitive resin composition layer will have an improved adhesion with the metal layer or with the resin layer provided on the thus activated surface. It is now anticipated that, when in the positive development, the unexposed area would be subjected to the surface activation, so that the photosensitive resin composition layer (resin layer) would be more likely to be damaged, resulting in degraded adhesion. In contrast in this invention that employs the negative development, the exposed area, having already been cured and given an elevated strength, will be subjected to the surface treatment, so that the photosensitive resin composition layer (resin layer) will not be damaged, and the above-described risk is avoidable.

The surface activation is specifically selected from plasma treatment using various gas sources (oxygen, hydrogen, argon, nitrogen, nitrogen/hydrogen mixed gas, argon/oxygen mixed gas, etc.); corona discharge treatment; etching using at least one of $CF_4/O_2$, $NF_3/O_2$, $SF_6$, $NF_3$ and $NF_3/O_2$; surface treatment based on ultraviolet radiation (UV)-ozone process; dipping into an aqueous hydrochloric acid solution for removal of oxide film, followed by dipping into an organic surface treatment agent that contains a compound having at least either amino group or thiol group; and mechanical roughening with a brush. Plasma treatment is preferable, and oxygen plasma treatment using an oxygen gas source is particularly preferable. In the corona discharge treatment, the energy is preferably 500 to 200,000 $J/m^2$, more preferably 1,000 to 100,000 $J/m^2$, and most preferably 10,000 to 50,000 $J/m^2$.

«Laminating Step»

The manufacturing method of this invention further includes a laminating step.

The laminating step is a series of steps that include again sequentially carrying out the photosensitive resin composition layer forming step, the exposure step, and the development step. Of course, the laminating step may additionally include the aforementioned drying step and heating step.

When the laminating step is to be followed by another laminating step, the surface activation step may succeed the exposure step or the metal layer forming step.

The laminating step is preferably repeated 3 to 7 times, and more preferably 3 to 5 times.

A preferred design has 3 to 7 resin layers, and more preferably has 3 to 5 resin layers, such as "resin layer/metal layer/resin layer/metal layer/resin layer/metal layer". If there are two or less number of resin layers, a sufficient level of adhesion would be obtained even without oxygen plasma treatment. However, the larger the number of layers would be, the more the layers would repetitively be subjected to high temperature processes such as development, etching of metal, or curing, and the more the separation would be likely to occur at the metal layer/resin layer interface, or at the resin layer/resin layer interface.

In short, it is particularly preferable in this invention to carry out, succeeding to provision of the metal layer, the photosensitive resin composition layer forming step, the exposure step, and the development step sequentially, so as to cover the metal layer. By alternately carrying out the laminating step for staking the photosensitive resin composition layer (resin layer) and the metal layer forming step, it is now possible to alternately form the photosensitive resin composition layer (resin layer) and the metal layer, which is applicable to a multilevel interconnection of semiconductor devices.

Method for Manufacturing Semiconductor Device

This invention discloses a semiconductor device that contains the above-described laminate, and, a method for manufacturing a semiconductor device which includes the method for manufacturing the laminate. The paragraphs below will describe one embodiment of the semiconductor device that uses the laminate obtained by the method for manufacturing the laminate of this invention.

Figure 2:
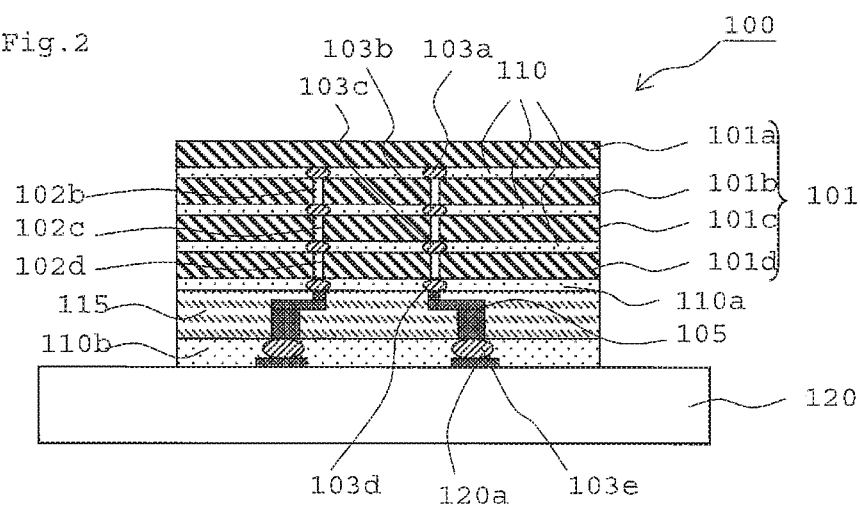
[FIG. 2] A schematic drawing illustrating an embodiment of the semiconductor device.

A semiconductor device 100 illustrated in FIG. 2 is a so-called, three-dimensionally mounted device, in which a laminate semiconductor device 101 composed of a plurality of semiconductor devices (semiconductor chips) 101a to 101d is disposed on a wiring board 120.

Although this embodiment will be explained mainly focusing on the case where four semiconductor devices (semiconductor chips) are laminated, the number of laminating of the semiconductor devices (semiconductor chips) may be two, eight, sixteen, thirty-two and so on, without special limitation. The number may alternatively be one.

Each of the plurality of semiconductor devices 101a to 101d is composed of a semiconductor wafer such as silicon substrate.

The topmost semiconductor device 101a has no through-electrode, and instead has electrode pads (not illustrated) on one surface thereof.

The semiconductor devices 101b to 101d have through-electrodes 102b to 102d, respectively. Each semiconductor device has on both surfaces thereof interconnect pads (not illustrated) that are integrally provided with the through-electrodes.

The laminate semiconductor device 101 has the semiconductor device 101a having no through-electrode, and semiconductor devices 101b to 101d respectively having the through-electrodes 102b to 102d, which are bonded by flip-chip bonding.

More specifically, the electrode pads of the semiconductor device 101a having no through-electrode are bonded, through metal bumps 103a such as solder bumps, to the interconnect pads, on the side faced to the semiconductor device 101a, of the juxtaposed semiconductor device 101b having the through-electrodes 102b; and, the interconnect pads on the other side of the semiconductor device 101b having the through-electrode 102b are bonded, through metal bumps 103b such as solder humps, to the interconnect pads, on the side faced to the semiconductor device 101b, of the juxtaposed semiconductor device 101c having the through-electrodes 102c. In the same way, the inter connect pads on the other side of the semiconductor device 101c having the through-electrodes 102c are bonded, through metal bumps 103c such as solder bumps, to the interconnect pads, on the side faced to the semiconductor device 101c, of the juxtaposed semiconductor device 101d having the through-electrodes 102d.

Gaps between the every two adjacent semiconductor devices 101a to 101d have an underfill layer 110 formed therein, so that the individual semiconductor devices 101a to 101d are laminated while placing the underfill layer 110 in between.

The semiconductor device 101 is mounted on a circuit board 120. The circuit board 120 employable here is a multilayer circuit board whose base is composed of an insulating substrate such as resin substrate, ceramic substrate and glass substrate. The circuit board 120 using the resin substrate is exemplified by multilayer copper clad laminate (multilayer printed circuit board).

The wiring board 120 has a surface electrode 120a formed on one surface thereof.

Between the wiring board 120 and the semiconductor device 101, there is disposed an insulating layer 115 having a redistribution layer 105 formed therein. The wiring board 120 and the semiconductor device 101 are electrically connected through the redistribution layer 105. The insulating layer 115 is exposed photosensitive resin layer (resin layer) of this invention. Details of the insulating layer 115 will described below.

More specifically, one end of the redistribution layer 105 is connected, through metal bumps 103d such as solder bumps, to the electrode pads, on the side faced to the redistribution layer 105, of the semiconductor device 101d. Meanwhile, the other end of the redistribution layer 105 is connected, through metal bumps 103e such as solder bumps, to the surface electrodes 120a of the wiring board.

Between the insulating layer 115 and the semiconductor device 101, there is formed an underfill layer 110a. Meanwhile, between the insulating layer 115 and the wiring board 120, there is formed an underfill layer 110b.

EXAMPLES

This invention will further be detailed below, referring to Examples. All materials, amounts of consumption, ratios, process details and procedures explained in Examples below may suitably be modified, without departing from the spirit of this invention. Hence, the scope of this invention is not limited to the specific examples explained below. "Parts" and "%" are mass-based, unless otherwise specifically noted.

Exemplary Synthesis 1

[Synthesis of Polyimide Precursor (Aa-1: Radical Polymerizable Group-Containing Polyimide Precursor) from 4,4'-Oxydiphthalic Dianhydride, 4,4'-Oxydianiline and 2-Hydroxyethyl Methacrylate]

Mixed were 20.0 g (64.5 mmol) of 4,4'-oxydiphthalic dianhydride (obtained by drying 4,4'-oxydiphthalic acid at 140° C. for 12 hours), 18.6 g (129 mmol) of 2-hydroxyethyl methacrylate, 0.05 g of hydroquinone, 10.7 g of py-ridine, and 140 g of diglyme (diethylene glycol dimethyl ether), and the mixture was stirred at 60° C. for 18 hours, to produce a diester between 4,4'-oxydiphthalic acid and 2-hydroxyethyl methacrylate. Next, the reaction mixture was cooled to −10° C., and 16.12 g (135.5 mmol) of $SOCl_2$ was added thereto over 10 minutes, while keeping the temperature at −10±4° C. The mixture was then diluted with 50 mL of N-methylpyrrolidone, and the reaction mixture was stirred at room temperature for 2 hours. Next, a solution prepared by dissolving 11.08 g (58.7 mmol) of 4,4'-oxydianiline in 100 mL of N-methylpyrrolidone was added dropwise to the reaction mixture at 20 to 23° C. over 20 minutes. The reaction mixture was then stirred overnight at room temperature. The reaction mixture was then poured into 5 liters of water to precipitate a polyimide precursor, and the water-polyimide precursor mixture was stirred at 5000 rpm for 15 minutes. The polyimide precursor was collected by filtration, then placed in 4 liters of water, the mixture was stirred again for 30 minutes, and again collected. The thus obtained polyimide precursor was dried under reduced pressure at 45° C. for 3 days, to thereby obtain polyimide precursor (Aa-1).

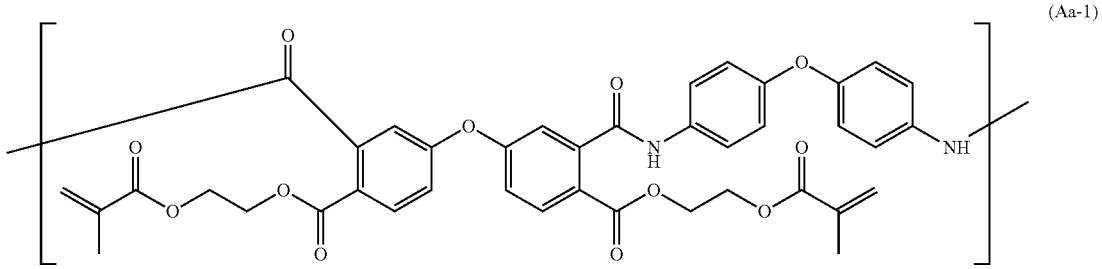

(Aa-1)

Exemplary Synthesis 2

[Synthesis of Polyimide Precursor (Ab-1: Radical Polymerizable Group-Containing Polyimide Precursor) from Pyromellitic Dianhydride, 4,4'-Oxydianiline and 2-Hydroxyethyl Methacrylate]

Mixed were 14.06 g (64.5 mmol) of pyromellitic dianhydride (obtained by drying pyromellitic acid at 140° C. for 12 hours), 18.6 g (129 mmol) of 2-hydroxyethyl methacrylate, 0.05 g of hydroquinone, 10.7 g of pyridine, and 140 g of NMP (N-methyl-2-pyrrolidone), and the mixture was stirred at 60° C. for 18 hours to produce a diester between pyromellitic acid and 2-hydroxyethyl methacrylate. Next, the reaction mixture was cooled to −10° C., and 16.12 g (135.5 mmol) of SOCl$_2$ was added over 10 minutes, while keeping the temperature at −10±4° C. The mixture was diluted with 50 mL of N-methylpyrrolidone, and the reaction mixture was stirred at room temperature for 2 hours. Next, a solution prepared by dissolving 11.08 g (58.7 mmol) of 4,4'-oxydianiline in 100 mL of N-methylpyrrolidone was added dropwise to the reaction mixture at 20 to 23° C. over 20 minutes. Next, the reaction mixture was stirred overnight at room temperature. The mixture was then poured into 5 liters of water to precipitate a polyimide precursor, and the water-polyimide precursor mixture was stirred at 5000 rpm for 15 minutes. The polyimide precursor was collected by filtration, placed in 4 liters of water, again stirred for 30 minutes, and again collected by filtration. The thus obtained polyimide precursor was dried under reduced pressure at 45° C. for 3 days, to thereby obtain polyimide precursor (Ab-1).

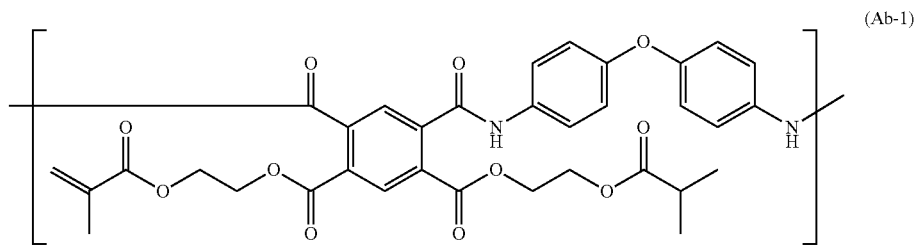

(Ab-1)

Exemplary Synthesis 3

[Synthesis of Polyimide Precursor (Ac-1: Radical Polymerizable Group-Containing Polyimide Precursor) from 4,4'-Oxydiphthalic Anhydride, p-Phenylenediamine and 2-Hydroxyethyl Methacrylate]

Mixed were 20.0 g (64.5 mmol) of 4,4'-oxydiphthalic anhydride (obtained by drying oxydiphthalic acid at 140° C. for 12 hours), 18.6 g (129 mmol) of 2-hydroxyethyl methacrylate, 0.05 g of hydroquinone, 10.7 q of pyridine, and 140 g of diglyme, and the mixture was stirred at 60° C. for 18 hours, to produce a diester between 4,4'-oxydiphthalic acid and 2-hydroxyethyl methacrylate. Next, the reaction mixture was cooled to −10° C., and 16.12 g (135.5 mmol) of SOCl$_2$ was added thereto over 10 minutes, while keeping the temperature at −10±4° C. The mixture was then diluted with 50 mL of N-methylpyrrolidone, and the reaction mixture was stirred at room temperature for 2 hours. Next, a solution prepared by dissolving 6.34 g (58.7 mmol) of p-phenylenediamine in 100 mL of N-methylpyrrolidone was added dropwise to the reaction mixture at 20 to 23° C. over 20 minutes. Next, the reaction mixture was stirred overnight at room temperature. The mixture was then poured into 5 liters of water to precipitate a polyimide precursor, and the water-polyimide precursor mixture was stirred at 5000 rpm for 15 minutes. The polyimide precursor was collected by filtration, placed in 4 liters of water, again stirred for 30 minutes, and again collected by filtration. The thus obtained polyimide precursor was dried under reduced pressure at 45° C. for 3 days, to thereby obtain polyimide precursor (Ac-1).

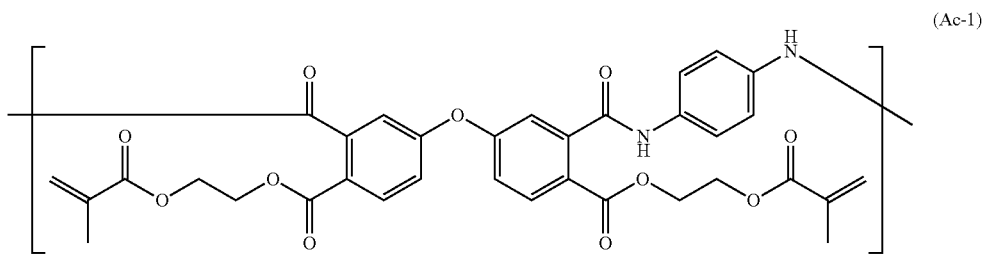

(Ac-1)

Exemplary Synthesis 4

[Synthesis of Polyimide Precursor (Ad-1: Radical Polymerizable Group-Containing Polyimide Precursor) from Pyromellitic Dianhydride, m-Tolidine and 2-Hydroxyethyl Methacrylate]

Mixed were 14.06 g (64.5 mmol) of pyromellitic dianhydride (obtained by drying pyromellitic acid at 140° C. for 12 hours), 18.6 g (129 mmol) of 2-hydroxyethyl methacrylate, 0.05 g of hydroquinone, 10.7 g of pyridine, and 140 g of NMP (N-methyl-2-pyrrolidone), and the mixture was stirred at 60° C. for 18 hours, to obtain a diester between pyromellitic acid and 2-hydroxyethyl methacrylate. Next, the reaction mixture was cooled to −10° C., and 16.12 g (135.5 mmol) of $SOCl_2$ was added thereto over 10 minutes, while keeping the temperature at −10±4° C. The mixture was then diluted with 50 mL of N-methylpyrrolidone, and the reaction mixture was stirred at room temperature for 2 hours. Next, a solution obtained by dissolving 12.46 g (58.7 mmol) of m-tolidine in 100 mL of N-methylpyrrolidone was added dropwise thereto at 20 to 23° C. over 20 minutes. Next the reaction mixture was stirred overnight at room temperature. The mixture was then poured into 5 liters of water to precipitate a polyimide precursor, and the water-polyimide precursor mixture was stirred at 5000 rpm for 15 minutes. The polyimide precursor was collected by filtration, placed in 4 liters of water, again stirred for 30 minutes, and again collected by filtration. The thus obtained polyimide precursor was dried under reduced pressure at 45° C. for 3 days, to thereby obtain polyimide precursor (Ad-1).

Examples and Comparative Examples

The ingredients listed below were mixed, to prepare a coating liquid of photosensitive resin composition, in the form of uniform solution.

«Ingredients of Photosensitive Resin Composition»
(A) Resin: consumption (part by mass) listed in Table 1
(B) polymerizable compound: consumption (part by mass) listed in Table 1
(C) photo-polymerization initiator: consumption (part by mass) listed in Table 1
(D) thermal base generator: consumption (part by mass) listed in Table 1
(Ingredients added to all photosensitive resin compositions)
p-benzoquinone (from Tokyo Chemical Industry Co., Ltd.): 0.08 parts by mass
1H-tetrazole (from Tokyo Chemical Industry Co., Ltd.): 0.12 parts by mass
N-[3-(triethoxysilyl)propyl]maleic monoamide: 0.70 parts by mass γ-butyrolactone: 48.00 parts by mass
dimethylsulfoxide: 12.00 parts by mass
Abbreviations listed in Table 1 are as follows.
(A) Resin
Resins synthesized in Exemplary Syntheses 1 to 3; Aa-1, Ab-1, Ac-1

Aa-2 and Aa-3 were synthesized while controlling the amount of addition of 4,4'-oxydianiline in Exemplary Synthesis 1, so as to give target molecular weights.

Ab-2 and Ab-3 were synthesized while controlling the amount of addition of 4,4'-oxydianiline in Exemplary Synthesis 2, so as to give target molecular weights.

Ac-2 and Ac-3 were synthesized while controlling the amount of addition of p-phenylenediamine in Exemplary Synthesis 3, so as to give target molecular weights.

Ad-2 was synthesized while controlling the amount of addition of m-tolidine in Exemplary Synthesis 3, so as to give a target molecular weight.

Ae-1: Matrimide 5218 (from HUNTSMAN Corporation, polyimide)
(B) Polymerizable Compound

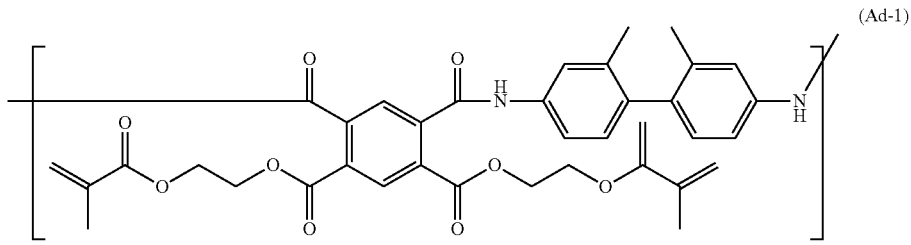

(Ad-1)

B-1: SR209 (from Sartomer Japan Inc., bifunctional methacrylate, structure shown below)

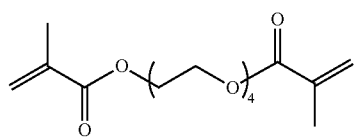

B-2: NK Ester A-9300 (from Shin-Nakamura Chemical Co., Ltd., trifunctional acrylate, structure shown below)

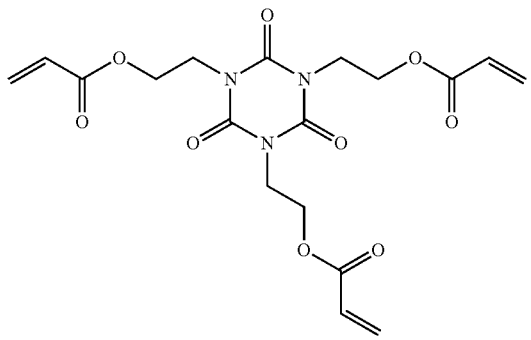 [SMILES: C=CC(=O)OCCn1c(=O)n(CCOC(=O)C=C)c(=O)n(CCOC(=O)C=C)c1=O]

(C) Photo-Polymerization Initiator
C-1: Irgacure OXE-01 (from BASF SE) oxime compound
C-2: Irgacure-784 (from BASF SE) metallocene compound
C-3: NCI-831 (from ADEKA Corporation) oxime compound
C-4: Irgacure-727 (from BASF SE) metallocene compound
(D) Base Generator
D-1 (photo base generator): WPBG-018 (from Wako Pure Chemical industries, Ltd.)
D-2 to D4 (thermal base generator): compounds with structures below (D-2)

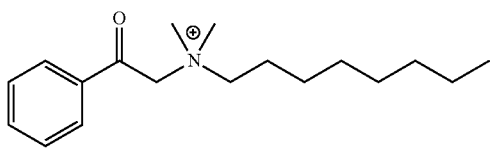

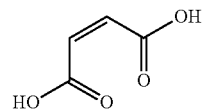

(D-3)

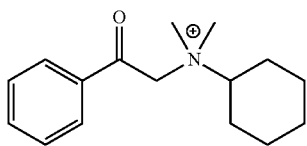

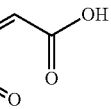

(D-4)

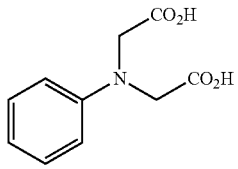

Each photosensitive resin composition was filtered under pressure through a filter with a pore size of 0.8 µm, and coated on a silicon wafer by spin coating, to form a photosensitive resin composition layer. The resultant silicon wafer with the photosensitive resin composition layer formed thereon was dried on a hot plate at 100° C. for 5 minutes, so as to make the photosensitive resin composition layer have a uniform thickness of 15 µm on the silicon wafer. The photosensitive resin composition layer on the silicon wafer was exposed to photo-exposure using a stepper (Nikon NSR 2005 i9C) at a dose of 500 mJ/cm$^2$, the exposed photosensitive resin composition layer (resin layer) was heated in a nitrogen atmosphere at a heating rate of 10° C./min, followed by heating for 3 hours after reached 250° C. Note that, in Examples that employed photosensitive resin compositions (14) and (16), the heating temperature was set to 350° C. Also note that, photosensitive resin compositions (17) to (25) that contain base generators were heated in a nitrogen atmosphere at a heating rate of 10° C./min, followed by heating for 3 hours after reached 200° C., in place of heating for 3 hours after reached 250° C. The cured resin layer was dipped in a 4.9% aqueous hydrogen fluoride solution, and the resin layer was stripped from the silicon wafer, to obtain resin film 1.

«Measurement of Physical Properties»

<«Tensile Strength»>

Tensile strength of resin film 1 was measured using a tensile tester (Tensilon), at a cross head speed of 300 mm/min, with a width of 10 mm and a sample length of 50 mm, in the longitudinal and transverse directions of the film, in an atmosphere of 25° C. and 65% RH (relative humidity), in accordance with JIS (Japanese Industrial Standards) K6251. The elongation at break was measured 5 times for each of the longitudinal direction and the transverse direction, and was represented for evaluation by a value averaged from the values obtained in the longitudinal and transverse directions. Results are summarized in Table 1.

<«Elongation after Fracture»>

Elongation after fracture of resin film 1 was measured using a tensile tester (Tensilon) at a cross head speed of 300 mm/min, with a width of 10 mm and a sample length of 50 mm, in the longitudinal and transverse directions of the film, in an atmosphere of 25° C. and 65% RH, in accordance with JIS K6251. The elongation after fracture was measured 5 times for each of the longitudinal direction and the transverse direction, and was represented for evaluation by a value averaged from the values obtained in the longitudinal and transverse directions. Results are summarized in Table 1.

<«Measurement of Young's Modulus»>

Young's modulus of resin film 1 was measured using a tensile tester (Tensilon) at a cross head speed of 300 mm/min, with a width of 10 mm and a sample length of 50 mm, in the longitudinal and transverse directions of the film, in an atmosphere of 25° C. and 65% RH, in accordance with JIS K7127. The Young's modulus was measured 5 times for each of the longitudinal direction and the transverse direction, and was represented for evaluation by a value averaged from the values obtained in the longitudinal and transverse directions. Results are summarized in Table 1.

TABLE 1

| Photosensitive Resin Composition | Resin Type | Resin Mw | Resin Amount of Addition | Polymerizable Compound Type | Polymerizable Compound Amount of Addition | Photopolymerizable Initiator Type | Photopolymerizable Initiator Amount of Addition | Base Generator Type | Base Generator Amount of Addition | Tensile Strength MPa | Elongation % | Young's Modulus GPa |
|---|---|---|---|---|---|---|---|---|---|---|---|---|
| Photosensitive Resin Composition(1) | Aa-1 | 25000 | 32 | B-1 | 6.88 | C-1 | 1.04 | — | | 200 | 65 | 3.9 |
| Photosensitive Resin Composition(2) | Aa-1 | 25000 | 36 | B-1 | 2.88 | C-1 | 1.04 | — | | 180 | 100 | 2.9 |
| Photosensitive Resin Composition(3) | Aa-2 | 17000 | 32 | B-1 | 6.88 | C-1 | 1.04 | — | | 170 | 60 | 3.5 |
| Photosensitive Resin Composition(4) | Aa-2 | 17000 | 25 | B-1 | 13.88 | C-1 | 1.04 | — | | 170 | 52 | 4.0 |
| Photosensitive Resin Composition(5) | Aa-3 | 10000 | 32 | B-1 | 6.88 | C-1 | 1.04 | — | | 150 | 55 | 2.9 |
| Photosensitive Resin Composition(6) | Ab-1 | 25000 | 36 | B-1 | 2.88 | C-1 | 1.04 | — | | 180 | 80 | 3.5 |
| Photosensitive Resin Composition(7) | Ab-2 | 17000 | 32 | B-1 | 8.88 | C-1 | 1.04 | — | | 200 | 52 | 3.8 |
| Photosensitive Resin Composition(8) | Ac-1 | 25000 | 32 | B-1 | 6.88 | C-1 | 1.04 | — | | 190 | 70 | 4.0 |
| Photosensitive Resin Composition(9) | Ac-2 | 17000 | 32 | B-1 | 6.88 | C-1 | 1.04 | — | | 165 | 60 | 3.0 |
| Photosensitive Resin Composition(10) | Aa-3 | 10000 | 36 | B-2 | 2.88 | C-1 | 1.04 | — | | 180 | 60 | 2.9 |
| Photosensitive Resin Composition(11) | Ad-1 | 25000 | 36 | B-1 | 2.88 | C-1 | 1.04 | — | | 180 | 60 | 3.0 |
| Photosensitive Resin Composition(12) | Ad-2 | 17000 | 32 | B-1 | 6.88 | C-1 | 1.04 | — | | 200 | 51 | 3.5 |
| Photosensitive Resin Composition(13) | Ae-1 | — | 32 | B-1 | 6.88 | C-1 | 1.04 | — | | 150 | 55 | 2.9 |
| Photosensitive Resin Composition(14) | Aa-1 | 25000 | 32 | B-1 | 6.88 | C-2 | 1.04 | — | | 200 | 65 | 3.9 |
| Photosensitive Resin Composition(15) | Aa-1 | 25000 | 32 | B-1 | 6.88 | C-3 | 1.04 | — | | 190 | 60 | 3.8 |
| Photosensitive Resin Composition(16) | Aa-1 | 25000 | 32 | B-1 | 6.88 | C-4 | 1.04 | — | | 200 | 65 | 3.8 |
| Photosensitive Resin Composition(17) | Aa-1 | 25000 | 32 | B-1 | 6.88 | C-1 | 1.04 | D-1 | 0.5 | 200 | 65 | 3.9 |
| Photosensitive Resin Composition(18) | Aa-1 | 25000 | 32 | B-1 | 6.88 | C-1 | 1.04 | D-2 | 0.5 | 200 | 65 | 3.9 |
| Photosensitive Resin Composition(19) | Aa-1 | 25000 | 32 | B-1 | 6.88 | C-1 | 1.04 | D-3 | 0.5 | 200 | 65 | 3.9 |
| Photosensitive Resin Composition(20) | Aa-1 | 25000 | 32 | B-1 | 6.88 | C-1 | 1.04 | D-4 | 0.5 | 180 | 60 | 3.5 |
| Photosensitive Resin Composition(21) | Aa-1 | 25000 | 32 | B-1 | 6.88 | C-2 | 1.04 | D-3 | 1.0 | 210 | 70 | 3.9 |
| Photosensitive Resin Composition(22) | Aa-1 | 25000 | 32 | B-1 | 6.88 | C-3 | 1.04 | D-3 | 0.5 | 200 | 65 | 3.9 |
| Photosensitive Resin Composition(23) | Aa-1 | 25000 | 32 | B-1 | 6.88 | C-2 | 1.04 | D-1 | 1.0 | 200 | 65 | 3.9 |
| Photosensitive Resin Composition(24) | Aa-1 | 25000 | 32 | B-1 | 6.88 | C-3 | 1.04 | D-1 | 0.5 | 200 | 65 | 3.9 |
| Photosensitive Resin Composition(25) | Aa-1 | 25000 | 32 | B-1 | 6.88 | C-4 | 1.04 | D-1 | 1.0 | 200 | 65 | 3.9 |
| Photosensitive Resin Composition for Comparative Example(1) | Aa-1 | 25000 | 38 | B-1 | 0.88 | C-1 | 1.04 | — | | 110 | 127 | 2.4 |
| Photosensitive Resin Composition for Comparative Example(2) | Aa-2 | 17000 | 36 | B-1 | 2.88 | C-1 | 1.04 | — | | 210 | 88 | 2.3 |
| Photosensitive Resin Composition for Comparative Example(3) | Aa-2 | 17000 | 25 | B-2 | 13.88 | C-1 | 1.04 | — | | 170 | 40 | 4.2 |
| Photosensitive Resin Composition for Comparative Example(4) | Aa-3 | 10000 | 25 | B-1 | 13.88 | C-1 | 1.04 | — | | 200 | 45 | 3.3 |
| Photosensitive Resin Composition for Comparative Example(5) | Aa-3 | 10000 | 36 | B-1 | 2.88 | C-1 | 1.04 | — | | 170 | 70 | 2.4 |
| Photosensitive Resin Composition for Comparative Example(6) | Ab-3 | 10000 | 32 | B-1 | 6.88 | C-1 | 1.04 | — | | 160 | 30 | 2.7 |
| Photosensitive Resin Composition for Comparative Example(7) | Ac-3 | 10000 | 25 | B-1 | 13.88 | C-1 | 1.04 | — | | 130 | 50 | 3.4 |
| Photosensitive Resin Composition for Comparative Example(8) | Ac-3 | 10000 | 32 | B-1 | 6.88 | C-1 | 1.04 | — | | 120 | 55 | 2.8 |

«Manufacture of Laminate 1»

Each photosensitive resin composition was filtered under pressure through a filter with a pore size of 0.8 μm, and coated on a silicon wafer by spin coating, to form a photosensitive resin composition layer. The resultant silicon wafer with the photosensitive resin composition layer formed thereon was dried on a hot plate at 100° C. for 5 minutes, so as to make the photosensitive resin composition layer have a uniform thickness of 15 μm on the silicon wafer. The photosensitive resin composition layer on the silicon wafer was exposed to light using a stepper (Nikon NSR 2005 i9C) at a dose of 500 mJ/cm$^2$, the exposed photosensitive resin composition layer (resin layer) was developed with cyclopentanone for 60 seconds, to form 10 μm diameter holes. The resin layer was then heated in a nitrogen atmosphere at a heating rate of 10° C./min, followed by heating for 3 hours after reached 250° C. After cooled down to room temperature, the procedures ranged from the filtration of the photosensitive resin composition, up to the 3-hour heating of the patterned film, were repeated again using the same photosensitive resin composition, to form laminate 1 having two resin layers, on the surface of the resin layer. Note that in Examples that employed photosensitive resin compositions (14) and (16), the heating temperature was set to 350° C. Also note that, photosensitive resin compositions (17) to (25) that contain base generators were heated in a nitrogen atmosphere at a heating rate of 10 ° C./min, followed by 3-hour heating after reached 200° C., in place of 3-hour heating after reached 250° C.

«Manufacture of Laminate 2»

On the surface of laminate 1 obtained above, laminate 2 having four resin layers was formed, by using a photosensitive resin composition same as the photosensitive resin composition used in the manufacture of laminate 1, and again by carrying out the procedures same as those in the manufacture of laminate 1.

«Manufacture of Laminate 3»

Each photosensitive resin composition was filtered under pressure through a filter with a pore size of 0.8 μm, and coated on a silicon wafer by spin coating, to form a photosensitive resin composition layer. The resultant silicon wafer with the photosensitive resin composition layer formed thereon was dried on a hot plate at 100° C. for 5 minutes, so as to make the photosensitive resin composition layer have a uniform thickness of 15 μm on the silicon wafer. The photosensitive resin composition layer on the silicon wafer was exposed to photo-exposure using a stepper (Nikon NSF, 2005 i9C) at a dose of 500 mJ/cm$^2$, the exposed photosensitive resin composition layer (resin layer) was developed with cyclopentanone for 60 seconds, to form 10 μm diameter holes. The resin layer was then heated in a nitrogen atmosphere at a heating rate of 10° C./min, followed by heating for 3 hours after reached 250° C. After cooled down to room temperature, a copper film (metal layer) of 2 μm thick was deposited by evaporation on a part of the surface of the photosensitive resin composition layer, so as to cover the hole portions. Further on the surface of the metal layer and the photosensitive resin composition layer, the procedures ranged from the filtration of the photosensitive resin composition, up to the 3-hour heating of the patterned film, were repeated again in the same way as described above by using the same photosensitive resin composition, to form laminate 3 with a structure of resin layer/metal layer/resin layer.

«Manufacture of Laminate 4»

On the surface of laminate 3, the copper layers (metal layers) and the resin layers were alternatively formed in the same way as in laminate 3, to form laminate 4 with a structure of resin layer/metal layer/resin layer/metal layer/resin layer/metal layer/resin layer.

«Evaluation»

[Evaluation of Separation Defect]

(Unheated)

Each laminate was cut vertically with respect to the surface of the resin layers into a 5-mm wide specimen so as to individually contain an interface between the resin layer and the resin layer, and an interface between the metal layer and the resin layer, and a cross section of each specimen was observed under an optical microscope to find whether there were separation between the resin layer and the resin layer, and between the metal layer and the resin layer, or not. The magnification was optimized depending on the size of separation. Absence of separation means good adhesion, and gives good results.

A: No separation
B: 1 to 2 separated portions
C: 3 to 5 separated portions
D: 6 or more separated portions (Heated)

Each laminate was heated in a nitrogen atmosphere at 300° C. for 3 hours. Each laminate was cut vertically with respect to the surface of the resin layers into a 5-mm wide specimen so as to respectively contain an interface between the resin layer and the resin layer, and an interface between the metal layer and the resin layer, and a cross section of each specimen was observed under an optical microscope to find whether there were separation between the resin layer and the resin layer, and between the metal layer and the resin layer, or not. The magnification was optimized depending on the size of separation. Absence of separation means good adhesion, and gives good results.

A: No separation
B: 1 to 2 separated portions
C: 3 to 5 separated portions
D: 6 or more separated portions

TABLE 2

| Examples | Photosensitive Resin Composition | Laminate | Separation Defect Between Resin Layer/Resin Layer | |
| --- | --- | --- | --- | --- |
| | | | Non-Heated | After Heated |
| Example (1) | Photosensitive Resin Composition (1) | 1 | A | A |
| Example (2) | Photosensitive Resin Composition (2) | 1 | A | B |
| Example (3) | Photosensitive Resin Composition (3) | 1 | A | B |
| Example (4) | Photosensitive Resin Composition (4) | 1 | A | A |
| Example (5) | Photosensitive Resin Composition (5) | 1 | B | B |
| Example (6) | Photosensitive Resin Composition (6) | 1 | A | B |
| Example (7) | Photosensitive Resin Composition (7) | 1 | A | B |
| Example (8) | Photosensitive Resin Composition (8) | 1 | A | A |
| Example (9) | Photosensitive Resin Composition (9) | 1 | A | B |
| Example (10) | Photosensitive Resin Composition (10) | 1 | B | B |
| Example (11) | Photosensitive Resin Composition (11) | 1 | B | B |
| Example (12) | Photosensitive Resin Composition (12) | 1 | B | B |
| Example (13) | Photosensitive Resin Composition (13) | 1 | B | B |

TABLE 2-continued

| Examples | Photosensitive Resin Composition | Laminate | Separation Defect Between Resin Layer/Resin Layer | |
|---|---|---|---|---|
| | | | Non-Heated | After Heated |
| Example (14) | Photosensitive Resin Composition (14) | 1 | A | B |
| Example (15) | Photosensitive Resin Composition (15) | 1 | A | B |
| Example (16) | Photosensitive Resin Composition (16) | 1 | A | B |
| Example (17) | Photosensitive Resin Composition (17) | 1 | A | A |
| Example (18) | Photosensitive Resin Composition (18) | 1 | A | A |
| Example (19) | Photosensitive Resin Composition (19) | 1 | A | A |
| Example (20) | Photosensitive Resin Composition (20) | 1 | A | A |
| Example (21) | Photosensitive Resin Composition (21) | 1 | A | A |
| Example (22) | Photosensitive Resin Composition (22) | 1 | A | A |
| Example (23) | Photosensitive Resin Composition (23) | 1 | A | A |
| Example (24) | Photosensitive Resin Composition (24) | 1 | A | A |
| Example (25) | Photosensitive Resin Composition (25) | 1 | A | A |
| Comparative Example (1) | Photosensitive Resin Composition for Comparative Example (1) | 1 | C | D |
| Comparative Example (2) | Photosensitive Resin Composition for Comparative Example (2) | 1 | D | D |
| Comparative Example (3) | Photosensitive Resin Composition for Comparative Example (3) | 1 | C | D |
| Comparative Example (4) | Photosensitive Resin Composition for Comparative Example (4) | 1 | D | D |
| Comparative Example (5) | Photosensitive Resin Composition for Comparative Example (5) | 1 | D | D |
| Comparative Example (6) | Photosensitive Resin Composition for Comparative Example (6) | 1 | D | D |
| Comparative Example (7) | Photosensitive Resin Composition for Comparative Example (7) | 1 | C | D |
| Comparative Example (8) | Photosensitive Resin Composition for Comparative Example (8) | 1 | D | D |

TABLE 3

| Examples | Photosensitive Resin Composition | Laminate | Separation Defect Between Resin Layer/Resin Layer | |
|---|---|---|---|---|
| | | | Non-Heated | After Heated |
| Example (26) | Photosensitive Resin Composition (1) | 2 | A | A |
| Example (27) | Photosensitive Resin Composition (2) | 2 | B | B |
| Example (28) | Photosensitive Resin Composition (3) | 2 | B | B |
| Example (29) | Photosensitive Resin Composition (4) | 2 | A | A |
| Example (30) | Photosensitive Resin Composition (5) | 2 | B | C |
| Comparative Example (9) | Photosensitive Resin Composition for Comparative Example (1) | 2 | D | D |
| Comparative Example (10) | Photosensitive Resin Composition for Comparative Example (2) | 2 | D | D |
| Comparative Example (11) | Photosensitive Resin Composition for Comparative Example (3) | 2 | D | D |
| Comparative Example (12) | Photosensitive Resin Composition for Comparative Example (4) | 2 | D | D |
| Comparative Example (13) | Photosensitive Resin Composition for Comparative Example (5) | 2 | D | D |

TABLE 4

| Examples | Photosensitive Resin Composition | Laminate | Separation Defect Between Resin Layer/Resin Layer | | Separation Defect Between metal Layer/Resin Layer | |
|---|---|---|---|---|---|---|
| | | | Non-Heated | After Heated | Non-Heated | After Heated |
| Example (31) | Photosensitive Resin Composition(1) | 3 | A | A | A | A |
| Example (32) | Photosensitive Resin Composition(2) | 3 | A | B | A | A |
| Example (33) | Photosensitive Resin Composition(3) | 3 | A | B | A | B |
| Example (34) | Photosensitive Resin Composition(4) | 3 | A | A | A | B |
| Example (35) | Photosensitive Resin Composition(5) | 3 | B | C | B | B |
| Comparative Example (14) | Photosensitive Resin Composition for Comparative Example(1) | 3 | D | D | D | D |
| Comparative Example (15) | Photosensitive Resin Composition for Comparative Example(2) | 3 | D | D | D | D |
| Comparative Example (16) | Photosensitive Resin Composition for Comparative Example(3) | 3 | C | D | D | D |
| Comparative Example (17) | Photosensitive Resin Composition for Comparative Example(4) | 3 | D | D | D | D |
| Comparative Example (18) | Photosensitive Resin Composition for Comparative Example(5) | 3 | D | D | D | D |

TABLE 5

| Examples | Photosensitive Resin Composition | Laminate | Separation Defect Between Resin Layer/Resin Layer | | Separation Defect Between metal Layer/Resin Layer | |
|---|---|---|---|---|---|---|
| | | | Non-Heated | After Heated | Non-Heated | After Heated |
| Example (36) | Photosensitive Resin Composition(1) | 4 | A | A | A | A |
| Example (37) | Photosensitive Resin Composition(2) | 4 | B | B | A | A |
| Example (38) | Photosensitive Resin Composition(3) | 4 | B | B | A | B |
| Example (39) | Photosensitive Resin Composition(4) | 4 | A | A | A | B |
| Example (40) | Photosensitive Resin Composition(5) | 4 | C | C | B | B |
| Comparative Example (19) | Photosensitive Resin Composition for Comparative Example(1) | 4 | D | D | D | D |
| Comparative Example (20) | Photosensitive Resin Composition for Comparative Example(2) | 4 | D | D | D | D |
| Comparative Example (21) | Photosensitive Resin Composition for Comparative Example(3) | 4 | D | D | D | D |
| Comparative Example (22) | Photosensitive Resin Composition for Comparative Example(4) | 4 | D | D | D | D |
| Comparative Example (23) | Photosensitive Resin Composition for Comparative Example(5) | 4 | D | D | D | D |

As is clear from the results above, by employing the resin layers that satisfy specific levels of elongation after fracture and Young's modulus (Example 1 to 40), the laminates that excel in adhesion :between the resin layer and the resin layer, and, between the metal layer and the resin layer were obtained.

In contrast, when at least either elongation after fracture or Young's modulus fell outside the scope of this invention (Comparative Examples 1 to 23), the laminates were found to have poor adhesion between the resin layer and the resin layer, and, between the metal layer and the resin layer.

When procedures were implemented in the same way as in Example 26, except that the second resin layer was formed using the photosensitive resin composition (4), good results comparable to those in Example 29 were obtained.

When procedures were implemented in the same way as in Example 31, except that the metal layer (copper film) was altered to an aluminum film, good results comparable to those in Example 31 were obtained.

When procedures were implemented in the same way as in Example 1, except that the concentration of the photosensitive resin composition (1) was reduced to 1/10 with the compositional ratio remained unchanged, and that the composition was coated using a spray gun ("NanoSpray", from EV Group, Austria), good results comparative to those in Example 1 were obtained.

A laminate was manufactured in the same way as in Example 1, except that the 3-hour heating at 250° C. was preceded by 10-minute heating at 100° C. (pretreatment), and the properties were evaluated. Good results comparative to those in Example 1 were obtained.

A laminate was manufactured in the same way as in Example 1, except that the 3-hour heating at 250° C. was preceded by 10-minute heating at 150° C. (pretreatment), and the properties were evaluated. Good results comparative to those in Example 1 were obtained.

A laminate was manufactured in the same way as in Example 1, except that the 3-hour heating at 250° C. was preceded by 10-minute heating at 180° C. (pretreatment) under UV irradiation, and the properties were evaluated. Good results comparative to those in Example 1 were obtained.

REFERENCE SIGNS LIST

200: laminate
201: photosensitive resin composition layer (resin layer)
203: metal layer
100: semiconductor device
101$a$ to 101$d$: semiconductor device
101: laminate
102$b$ to 102$d$: through-electrode
103$a$ to 103$e$: metal bump
105: redistribution layer
110, 110$a$, 110$b$: underfill layer
115: insulating layer
120: circuit board
120$a$: surface electrode

What is claimed is:

1. A laminate comprising a substrate, and at least two resin layers,
    each of the resin layers being independently brought into contact, in at least a part of the surface thereof, with the other resin layer;
    each of the resin layers independently having a Young's modulus exceeding 2.8 GPa and not exceeding 5.0 GPa, and, an elongation after fracture exceeding 50% and not exceeding 200%; and
    each of the resin layers further having a three-dimensional radical crosslinked structure therein,
    wherein each of said at least two resin layers is obtained by curing a resin composition,
    each resin composition for each of said resin layers independently comprises a resin selected from a polyimide precursor and a polyimide, and a bifunctional polymerizable compound having two ethylenic unsaturated bond-containing groups,
    the polyimide precursor is represented by Formula (2):

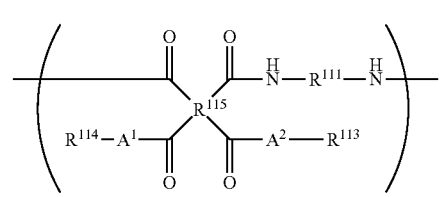

in Formula (2), each of $A^1$ and $A^2$ independently represents an oxygen atom or NH, $R^{111}$ represents a divalent organic group given by —Ar-L-Ar—, where each Ar independently represents an aromatic group, and L represents an aliphatic hydrocarbon group having 1 to 10 carbon atoms and is optionally substituted by fluorine atom(s), —O—, —CO—, —S—, —SO$_2$—, —NHCO—, or a group composed of two or more of them, $R^{115}$ represents a tetravalent organic group, each of $R^{113}$ and $R^{114}$ independently represents a hydrogen atom or monovalent organic group, provided that at least one of $R^{113}$ and $R^{114}$ represents a polymerizable group-containing group, the polyimide is represented by Formula (4):

Formula (4)

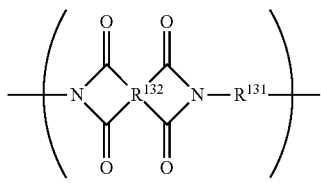

(4)

in Formula (4), $R^{131}$ represents a divalent organic group given by —Ar-L-Ar—, where each Ar independently represents an aromatic group, and L represents an aliphatic hydrocarbon group having 1 to 10 carbon atoms and is optionally substituted by fluorine atom(s), —O—, —CO—, —S—, —SO$_2$— or —NHCO—, as well as a group composed of two or more of them, and $R^{132}$ represents a tetravalent organic group, provided that at least one of $R^{131}$ or $R^{132}$ represents a polymerizable group-containing group, the bifunctional polymerizable compound having two ethylenic unsaturated bond-containing groups comprises esters formed between a polyhydric alcohol compound and an unsaturated carboxylic acid, the polyimide precursor and the polyimide have a weight average molecular weight of 18,000 to 30,000, and the ratio by mass of the polyimide precursor or the polyimide and the bifunctional polymerizable compound is 95/5 to 30/70.

2. The laminate of claim 1, wherein each of the resin layers independently has a tensile strength exceeding 160 MPa and not exceeding 300 MPa.

3. The laminate of claim 1, having 3 to 7 resin layers in total.

4. The laminate of claim 1, having a metal layer disposed between two adjoining layers of the at least two resin layers.

5. The laminate of claim 4, wherein the metal layer contains copper.

6. The laminate according to claim 1, wherein the ratio by mass of the polyimide precursor or the polyimide and the bifunctional polymerizable compound in each resin composition is 90/10 to 50/50.

7. The laminate according to claim 1, wherein the polyimide precursor and the polyimide have a weight-average molecular weight of 18,000 to 25,000.

8. The laminate according to claim 1, wherein the ratio by mass of the polyimide precursor or the polyimide and the bifunctional polymerizable compound is 82/18 to 30/70.

9. A semiconductor device comprising the laminate described in claim 1.

* * * * *